United States Patent [19]
Taylor et al.

[11] Patent Number: 5,603,043
[45] Date of Patent: Feb. 11, 1997

[54] SYSTEM FOR COMPILING ALGORITHMIC LANGUAGE SOURCE CODE FOR IMPLEMENTATION IN PROGRAMMABLE HARDWARE

[75] Inventors: Brad Taylor, Oakland; Robert Dowling, Albany, both of Calif.

[73] Assignee: Giga Operations Corporation, Berkeley, Calif.

[21] Appl. No.: 415,750

[22] Filed: Apr. 3, 1995

Related U.S. Application Data

[63] Continuation of Ser. No. 972,933, Nov. 5, 1992, abandoned.
[51] Int. Cl.$^6$ .................................................. G06F 13/00
[52] U.S. Cl. ........................ 395/800; 364/490; 364/491
[58] Field of Search .................................................. 395/800

[56] References Cited

U.S. PATENT DOCUMENTS

| | | | |
|---|---|---|---|
| 4,201,435 | 5/1980 | Nakamura et al. | 339/59 M |
| 5,036,473 | 7/1991 | Butts et al. | 364/489 |
| 5,046,035 | 9/1991 | Jigour et al. | 364/716 |
| 5,077,451 | 12/1991 | Mohsen | 174/261 |
| 5,084,636 | 1/1992 | Yoneda | 307/465 |
| 5,109,353 | 4/1992 | Sample et al. | 364/578 |
| 5,140,526 | 8/1992 | McDermith et al. | 364/488 |
| 5,225,719 | 7/1993 | Agrawal et al. | 307/465 |
| 5,255,203 | 10/1993 | Agrawal et al. | 364/489 |
| 5,256,918 | 10/1993 | Suzuki | 307/465 |
| 5,260,881 | 11/1993 | Agrawal et al. | 364/489 |
| 5,309,046 | 5/1994 | Steele | 307/465 |
| 5,428,750 | 6/1995 | Hsieh et al. | 395/309 |

*Primary Examiner*—Krisna Lim
*Attorney, Agent, or Firm*—Adam H. Tachner; Crosby, Heafey, Roach & May

[57] ABSTRACT

A configurable hardware system for implementing an algorithmic language program, including at least two programmable logic devices (PLD), a private hardware resource connectible to one PLD, and a programmable connection between PLDs, all of which may be configured as a module or distributed processing units (DPU). The private hardware resource may include a serial processing device such as a DSP, a PLD, a memory device, or a CPU. An extensible processing unit (EPU) can be built out of multiple DPUs, each connected to other modules by one or more of several buses. An N-bus (neighbor bus) connects a module to its nearest neighbor, an M-bus (module bus) connects a group of modules, and an H-bus (host bus) connects a module to a host CPU. The invention also includes a method of translating source code in an algorithmic language into a configuration file for implementation on one or more DPUs. The method includes four sequential phases of translation, a tokenizing phase, a logical mapping phase, a logic optimization phase, and a device specific mapping phase.

19 Claims, 46 Drawing Sheets

FIG. 1C
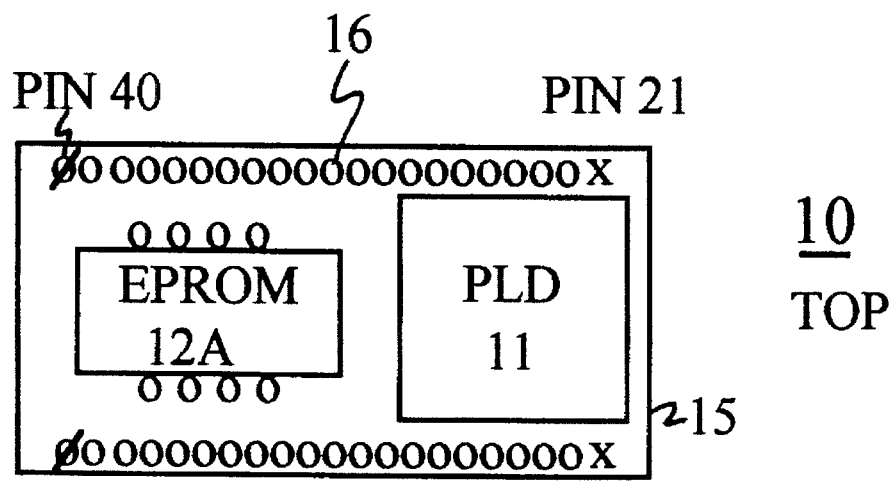
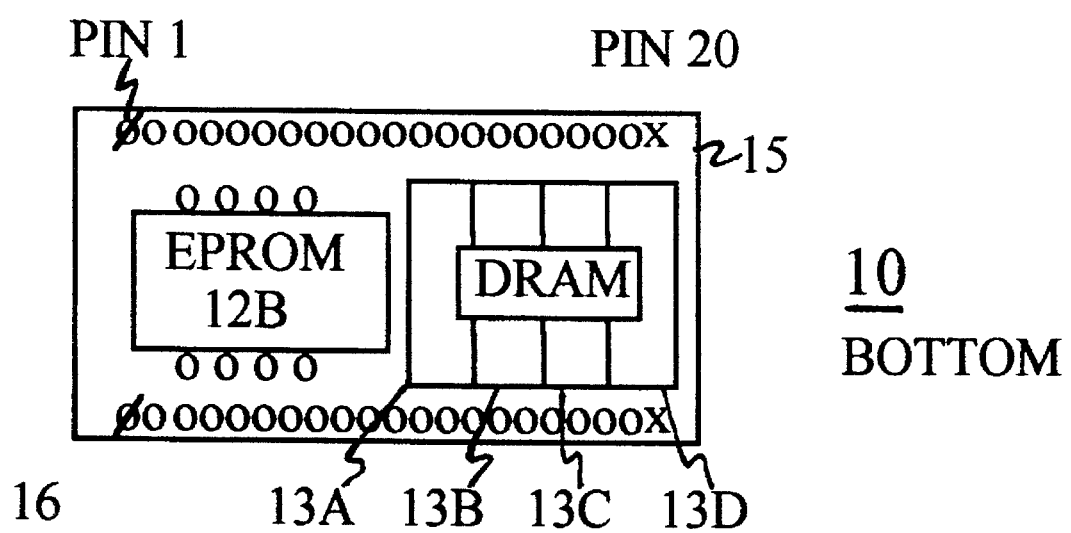
FIG. 1D

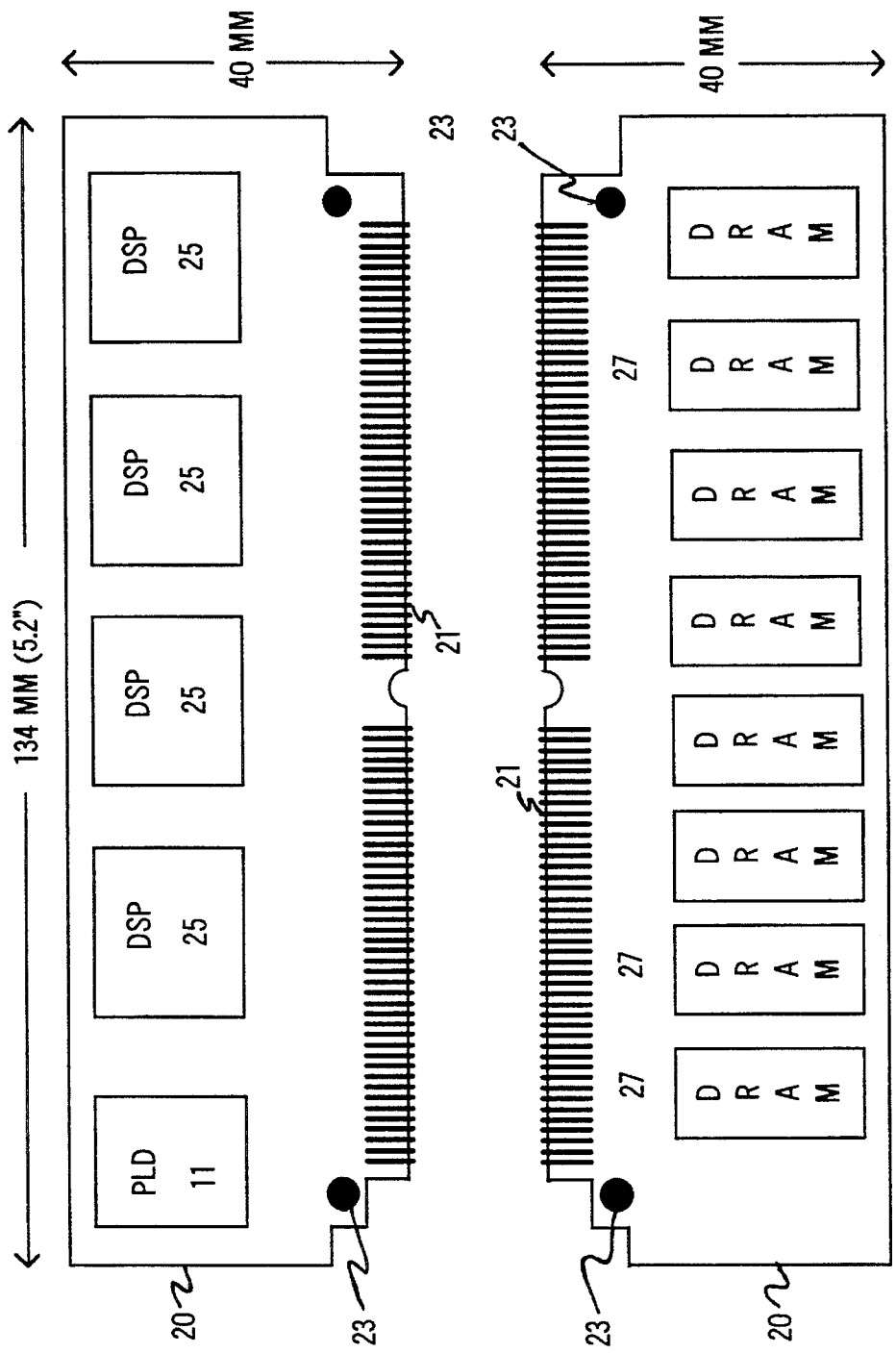

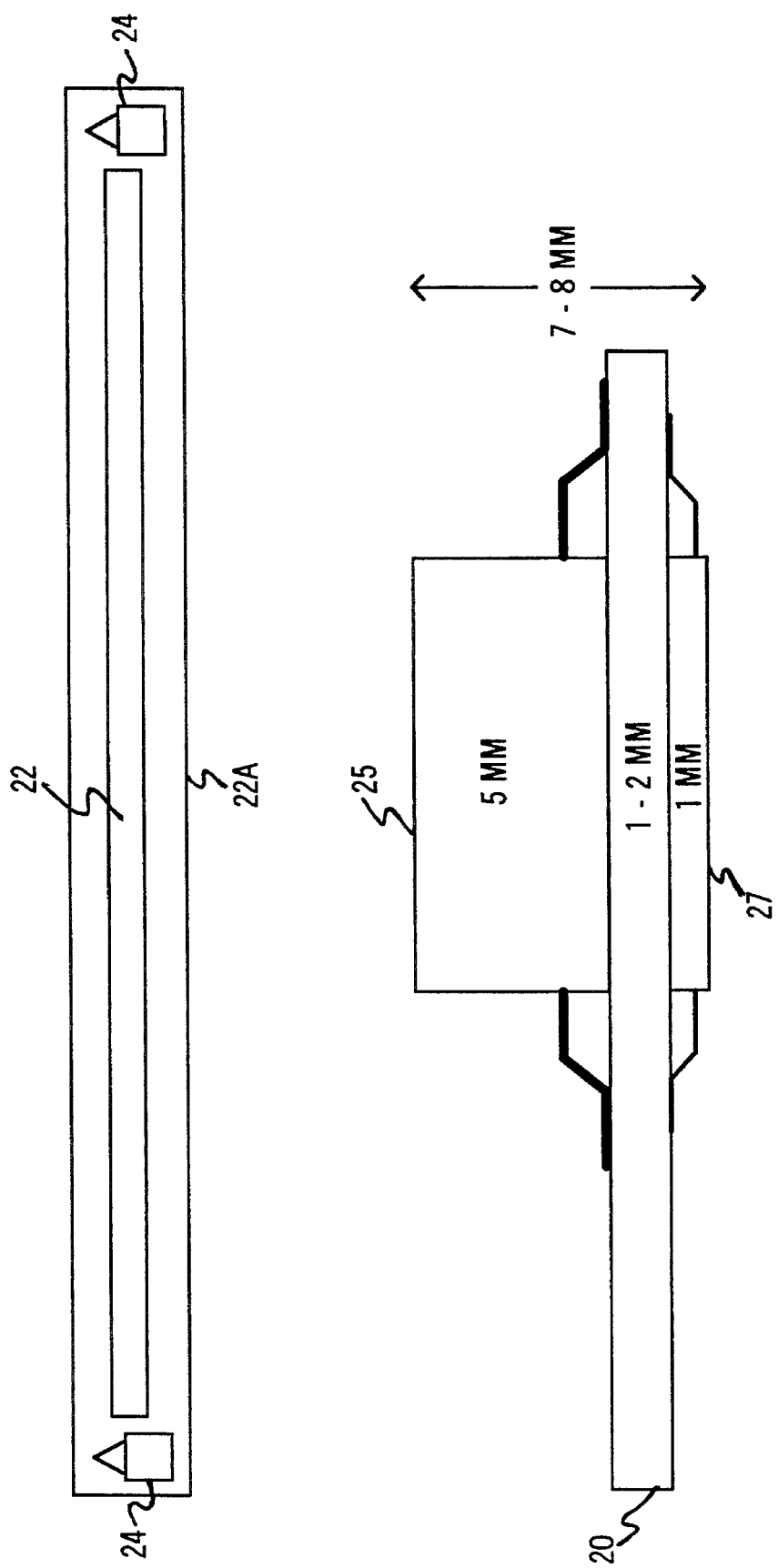

DPU LOGIC SYMBOL

EPU LOGIC SYMBOL

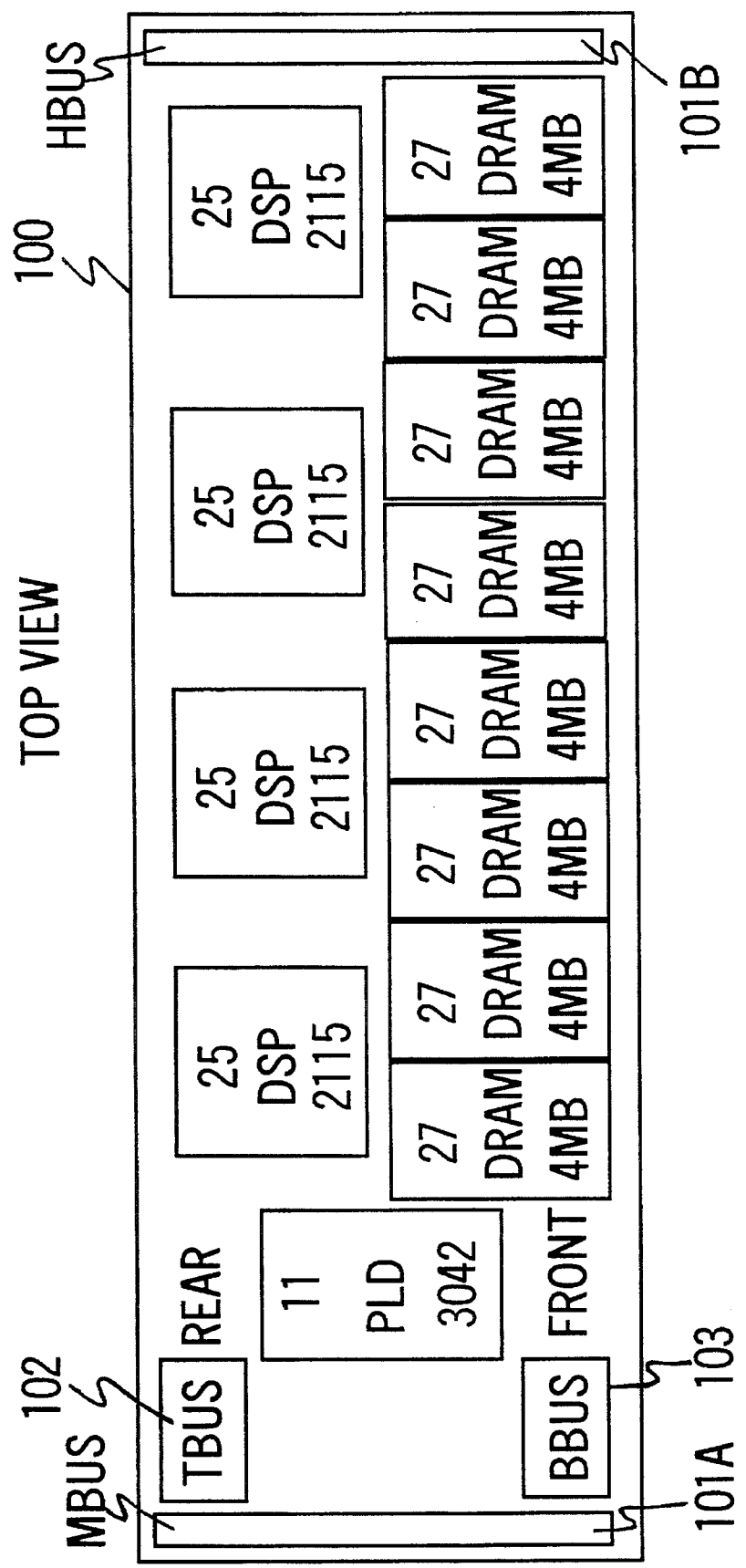
FIG. 15C TOP VIEW

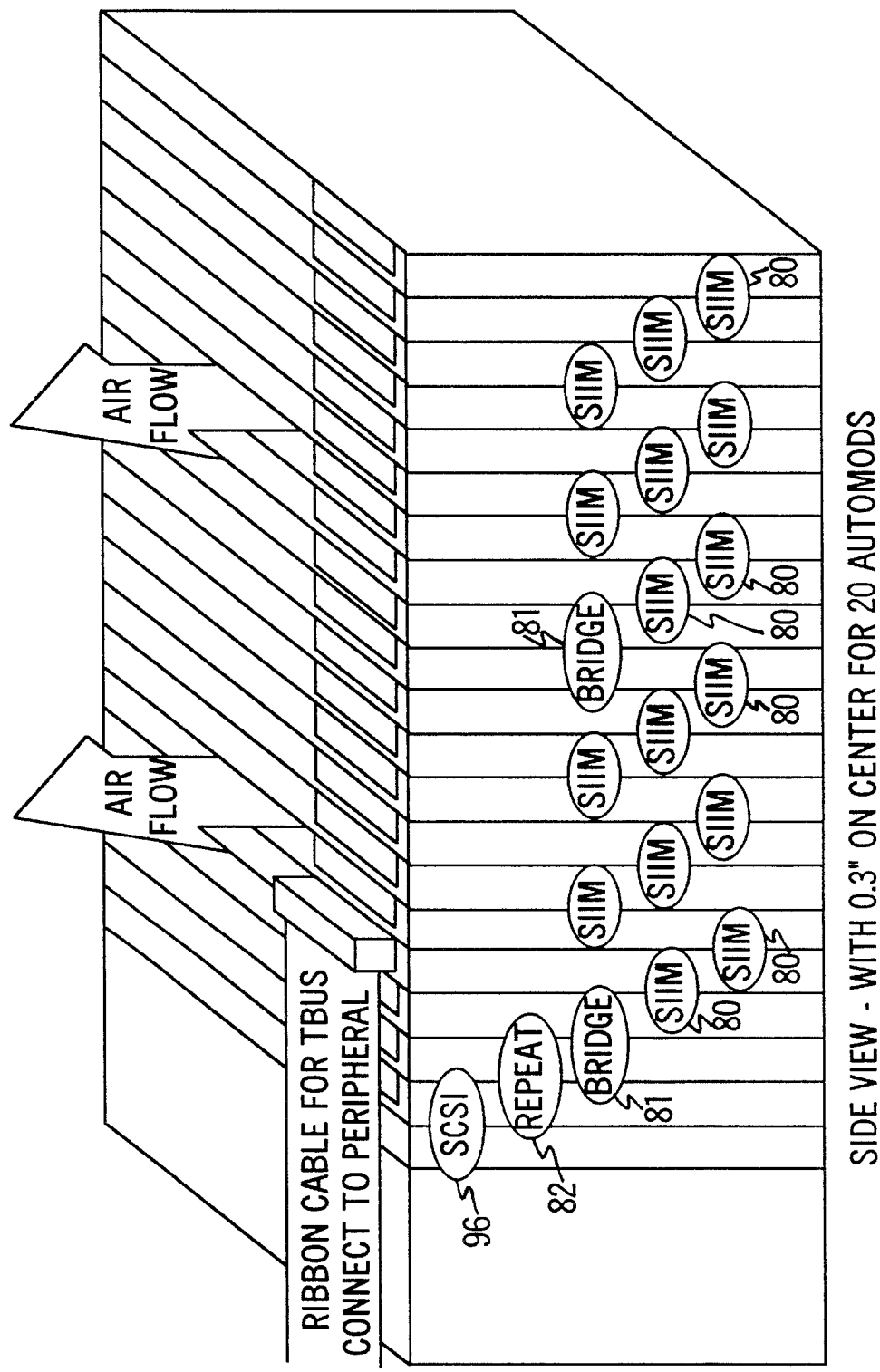

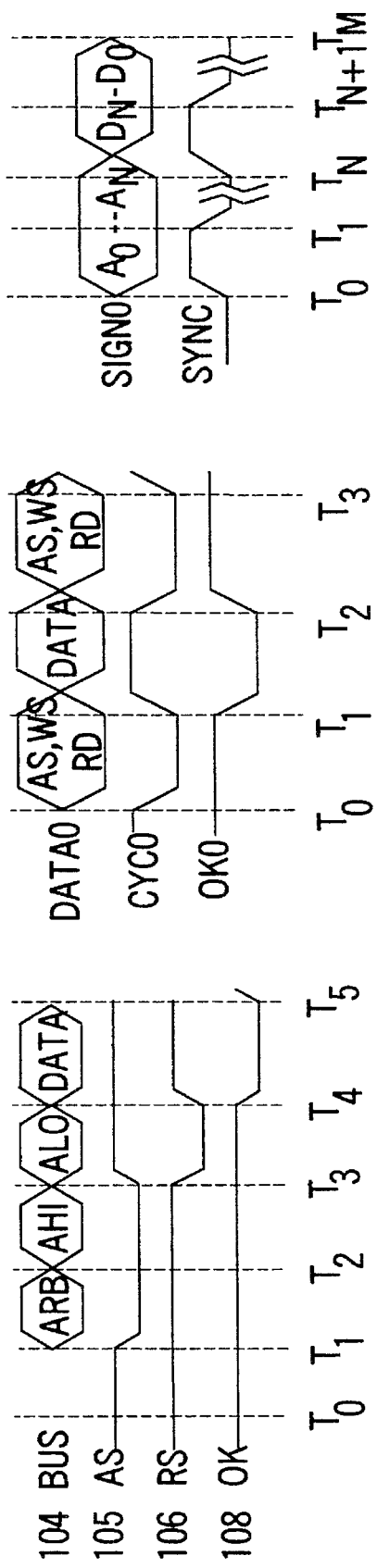

CONFIGURATION GENERATION SYSTEM: STREAM SPLITTING

FIG. 24B

| "C" OPERATORS AND KEY WORDS | STRATEGY |
|---|---|
| 1. VAR, STRUC, ARRAY | ASSIGN TO PLD REGISTER OR TO LOCAL RAM. |
| 2. BIT WISE OPS <br> ^ : & ! == | REDUCE TO BOOLEAN EQUIVALENT AND MAP TO PLDS LOGICAL RESOURCES. |
| 3. = += -- | CONFIGURATION LOGIC EQUATED VAR OR CREATE LOGIC CLBS AND ROUTE RESULT TO VAR. |
| 4. IF, FOR, WHILE | CREATE ENABLE BITS AND REPLACE KEYWORD WITH ASSIGNMENT STATEMENT. |
| 5. { } | BLOCK DEFINITIONS INDICATE CODE TO BE ENABLED BY AN ENA BIT. ALL EQUATES IN BLOCK ARE ENABLED BY THE CURRENT ENA BIT. |
| 6. INT, CHAR, INIT | MODIFIERS ALLOCATE DIFFERENT NUMBERS OF BITS. |
| 7. + - += -- | MAP TO EFFICIENT ADDERS AND COUNTERS. |
| 8. RETURN(X) | DELAY THE EXECUTION_ENABLE_TOKEN UNTIL X HAS BEEN ASSIGNED. |
| 9. GOTO N | FORCE TRUE THE EXECUTION_ENABLE ASSOCIATED WITH LABEL X. |
| 10. * / >X | CREATE SERIAL EQUIVALENT IN BOOLEAN LOGIC. |

FIG. 25A
| TEXT | LOGIC | C CODE | CLB FUNCTION |
|---|---|---|---|
| INVERTER<br><br>FOR EACH BIT OF A IF $A_N$ IS 1, THEN $B_N$=0, ELSE 1. |  | B = ~A; | $A_N$ = B(1,$A_N$) |
| AND FUNCTION<br><br>FOR EACH BIT OF A,B IF A AND B ARE 1, THEN BIT$_N$ OF C IS 1, ELSE 0. | 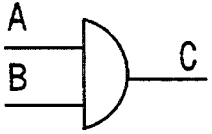 | C = A\|B; | $C_N$ = B(0X8,$A_N$,$B_N$); |

FIG. 25B

| TEXT | LOGIC | C CODE | CLB FUNCTION |
|---|---|---|---|
| ADD FUNCTION<br>C IS THE SUM OF A AND B. | ADDER | $C = A+B;$ | $C_N = B(0X96, A_N, B_N, CARRY_{N-1})$<br>$CARRY_N = B(0X8E, A_N, B_N, CARRY_{N-1})$ |
| IS EQUAL FUNCTION<br>IF A IS THE EQUAL OF B, THEN C IS 1, ELSE 0. | XOR   OR | $A == B;$ | $C = W(-2, B(6, A_N, B_N))$ |

FIG. 26

| TEXT | LOGIC | C CODE | CPU OPCODE | CLB FUNCTION |
|---|---|---|---|---|
| LATCH WRITE THE VALUE OF B TO A WHEN E IS TRUE ON THE CLOCK EDGE. | B→D L Q→A  E  CLK | A = B; | MOV (B,AX) MOV (AX,A) | $A_N = B(2, B_N)$ |
| COUNTER INCREMENT THE VALUE OF A WHEN E IS TRUE ON THE CLOCK EDGE | ++ →A  E  CLK | A++; | MOV (A,AX) INC (AX) MOV (AX,A) | $A_N = B(QX96, A, 1, CARRY_{N-1})$ $A_{CARRY} = B(0X69, A, 1, CARRY_{N-1})$ |
| SHIFT REGISTER MULTIPLY BY 2 WHEN E IS TRUE ON THE CLOCK EDGE. | >> →A  E  CLK | A=A<<1; | MOV (A,AX) ROL (AX) MOV (AX,A) | $A_N = B(2, A_{N-1})$ |

FIG. 27A

SIMPLE COMPOUND
STATEMENT
{
 A0 = B & C;
 A1 = B | C;
 A2 = E ^ D;
}

1. ALL 3 STATEMENTS MAY EXECUTE ON THE SAME CLOCK TICK.

2. FROM THE COMPILER'S POINT OF VIEW, THESE 3 STATEMENTS CONSTITUTE A SINGLE COMPOUND STATEMENT.

3. SINCE THE STATEMENTS INVOLVE BITWISE OPS, THE DELAY LEVEL IS ONE, THE NUMBER OF CLOCKS IS ONE.

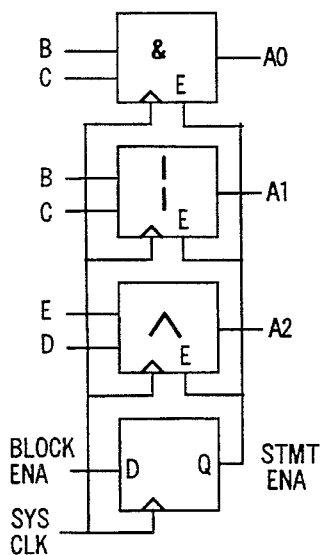

FIG. 27B

INTERMEDIATE COMPOUND
STATEMENT
{
 A0 = B & C;
 A1 = B | C;
 A2 = A0 ^ A1
}

1. VARS A0 AND A1 ARE USED ONLY IN STATEMENT #3.

2. A0 AND A1 MAY BE REMOVED FROM LOGIC.

3. STATEMENT #3 IS REPLACED WITH A2 = (B&C) ^ (B | C);

4. DELAY IS ONE, CLOCK IS ONE.

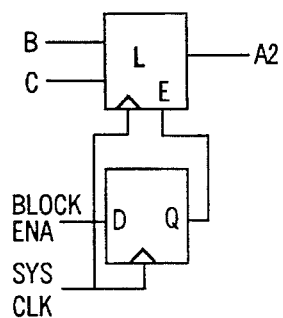

FIG. 27C

SIMPLE REASSIGNMENT
{
 A0 = B;
 A0 = C;
 A0 = 3;
}

1. VAR A0 HAS TO TRANSIT THROUGH 3 STATES AND REQUIRES 3 CLOCKS.

2. EACH CLOCK STATE MUXES IN ONE VAR OR CST

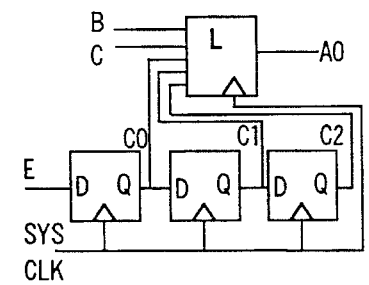

CONDITIONAL EXECUTION

```
{
  IF (A = = B) { A0 = X + Y; }
  IF (D = = C) { A1 = X - Y;}
}
```

1. STATEMENT 1 AND STATEMENT 2 ARE ENABLED BY THE CONDITIONAL.

CONDITIONAL NON-EXCLUSIVE RE-ASSIGNMENT

```
{
  IF (A = = B) { A0 = 2; }
  IF (D = = C) { A0 = 3; }
}
```

1. STATEMENT 1 AND STATEMENT 2 MAY BOTH BE TRUE AT THE SAME CLOCK TICK.
2. STATEMENT 1 EXECUTES ON FIRST TICK IF TRUE.
   STATEMENT 2 EXECUTES ON SECOND TICK IF S1 = = T AND S2 = = T

EXCLUSIVE CONDITIONAL RE-ASSIGNMENT
{
 IF (A = = B) { A0 = 2;}
 IF (A ! = B) { A0 = 3;}
}
1. BOTH CONDITIONS CANNOT BE TRUE AT THE SAME TIME.

EXCLUSIVE CONDITIONAL RE-ASSIGNMENT

CONDITIONAL LOOP

```
{
WHILE (A = = B)
{
A0= A0+ X;
}
}
```

1. LOOP IMPLIES REASSIGNMENT

2. BLOCK ENABLE IS RESET BY CONDITIONS

FOR LOOP

```
{
FOR ( I = 0; I < 100; I + + )
{
A0= A0+ X;
}
}
```

1. FOR LOOP IS REARRANGED INTO WHILE LOOP

```
{
I = 0;
WHILE (I < 100)
{
A0 = A0 + X;
I + + ;
}
}
```

1. FUNCTION ENABLE IS CREATED FROM THE FUNCTION CALL

SYSTEM FOR COMPILING ALGORITHMIC LANGUAGE SOURCE CODE FOR IMPLEMENTATION IN PROGRAMMABLE HARDWARE

This is a continuation of application Ser. No. 07/972,933, filed on Nov. 5, 1992, abandoned, entitled SYSTEM FOR COMPILING ALGORITHMIC LANGUAGE SOURCE CODE FOR IMPLEMENTATION IN PROGRAMMABLE HARDWARE.

FIELD OF THE INVENTION

This invention relates to a system of programmable logic devices (PLDs) for implementing a program which traditionally has been software implemented on a general purpose computer but now can be implemented in hardware. This invention also relates to a method of translating a source code program in an algorithmic language into a hardware description suitable for running on one or more programmable logic devices.

BACKGROUND

The general purpose computer was developed by at least the 1940s as the ENIAC machine at the University of Illinois. Numerous developments lead to semiconductor-based computers, then central-processing units (CPUs) on a chip such as the early Intel 4040 or the more recent Intel 486, Motorola 68040, AMD 29000, and many other CPUs. A general purpose computer is designed to implement instructions one at a time according to a program loaded into the CPU or, more often, available in connected memory, usually some form of random access memory (RAM).

A circuit specifically designed to process selected inputs and outputs can be designed to be much faster than a general purpose computer when processing the same inputs and outputs. Many products made today include an application specific integrated circuit (ASIC) which is optimized for a particular application. Such a circuit cannot be used for other applications, however, and it requires considerable expense and effort to design and build an ASIC.

To design a typical ASIC, an engineer begins with a specification which includes what the circuit should do, what I/O is available and what processing is required. An engineer must develop a design, program, flow chart, or logic flow and then design a circuit to implement the specification. This typically involves (1) analyzing the internal logic of the design, (2) converting the logic to Boolean functions which can be implemented in hardware logic blocks, (3) developing a schematic diagram and net list to configure and connect the logic blocks, then (4) implementing the circuit. There are a number of computerized tools available to assist an engineer with this process, including simulation of portions or all of a design, designing and checking schematics and netlists, and laying out the final ASIC, typically a VLSI device. Finally, a semiconductor device is created and the part can be tested. If the part does not perform as expected or if the specification changes, some or all of this process must be repeated and a new, revised ASIC must be designed and created until an acceptable part can be made which meets or approximates the specification. The entire design process is very time consuming and requires the efforts of several engineers and assistants. It is difficult to predict exactly what the final part will do once it is finally manufactured and if the part does not perform as expected, a new part must be designed and manufactured, requiring more time, resources and money.

There are several alternatives to ASICs which may provide a solution when balancing cost, number of units to be made, performance, and other considerations. Field Programmable Gate Arrays (FPGAs) are high density ASICs that provide a number of logic resources but are designed to be configurable by a user. FPGAs can be configured in a short amount of time and provide faster performance than a general purpose computer, although generally not as fast as a fully customized circuit, and are available at moderate cost. FPGAs can be manufactured in high volume, reducing cost, since each user can select a unique configuration to run on the standard FPGA. The configuration of a part can be changed repeatedly, allowing for minor or even total revisions and specification changes. Other advantages of a configurable, standard part are: faster time implement a specification and deliver a functional unit to market, lower inventory risks, easy design changes, faster delivery, and availability of second sources. The programmable nature of the FPGA allows a finished, commercial product to be revised in the field to incorporate improvements or enhancements to the specification or finished product.

A gate array allows higher gate densities than an FPGA plus custom circuit design options but requires that the user design a custom interconnection for the gate array and requires manufacturing a unique part and may require one or more revisions if the specification was not right or if it changes. The user must design or obtain masks for a small number of layers which are fabricated on top of a standard gate array. The cost is less than for fully custom ICs or standard cell devices.

One significant development in circuit design is a series of programmable logic devices (PLDs) such as the Xilinx XC3000 Logic Cell Array Family. Other manufacturers are beginning to make other programmable logic devices which offer similar resources and functionality. A typical device includes many configurable logic bloch (CLBs) each of which can be configured to apply selected Boolean functions to the available inputs and outputs. One type of CLB includes five logic inputs, a direct data-in line, clock lines, reset, and two outputs. The device also includes input/output bloch, each of which can be configured independently to be an input, an output, or a bidirectional channel with three-state control. Typically, each or even every pin on the device is connected to such an I/O block, allowing considerable flexibility. Finally, the device is rich in interconnect lines, allowing almost any two pins on the chip to be connected. Any of these lines can be connected elsewhere on the device, allowing significant flexibility. Modem devices such as the Xilinx XC 3000 series include the XC 3020 with 2000 gates through the XC 3090 9,000 gates. The XC 4000 series includes the XC 4020 with 20,000 gates.

To aid the designer, Xilinx can provide software to convert the output of a circuit simulator or schematic editor into Xilinx netlist file (XNF) commands which in turn can be loaded onto the FPGA to configure it. The typical input for the design is a schematic editor, including standard CAE software such as futureNet, Schema, OrCAD, VIEWlogic, Mentor or Valid. Xilinx provides programmable gate array libraries to permit design entry using Boolean equations or standard TTL functions. Xilinx design implementation software converts schematic netlists and Boolean equations into efficient designs for programmable gate arrays. Xilinx also provides verification tools to allow simulation, in-circuit design verification and testing on an actual, operating part.

There are several hardware description languages which can be used to design or configure PALs, PLAs or FPGAs.

Two such languages are HDL and ABLE. Cross-compilers are available to convert PALASM, HDL or ABLE code into XNF or into code suitable for configuring other manufacturer's devices.

An enormous quantity of software is available today to run on general purpose computers. Essentially all of that software was originally created in a high level language such as C, PASCAL, COBOL or FORTRAN. A compiler can translate instructions in a high level language into machine code that will run on a specified general purpose computer or class of computers. To date, no one has developed a method of translating software-oriented languages to run as a hardware configuration on an FPGA or in fact on any other hardware-based device.

Other recent products have been introduced by Aptix, Mentor Graphics and Quickturn. See Mohsen, U.S. Pat. No. 5,077,451 (assigned to Aptix Corporation), Butts, et al., U.S. Pat. No. 5,036,473 (assigned to Mentor Graphics Corporation), and Sample et at, U.S. Pat. No. 5,109,353 (assigned to Quickturn Systems, Incorporated). These references provide background for the present invention and related technologies.

Others have attempted to partition logical functions over multiple PLDs but these efforts have not provided a true, full function implementation of algorithmic source code. McDermith et al, U.S. Pat. No. 5,140,526 (assigned to Minc Incorporated), describe an automated system for partitioning a set of Boolean logic equations onto PLDs by comparing what resources are required to implement the logic equations with information on what PLD devices are commercially available that have the capability to implement the logic equations, then evaluating the cost of any optional solutions. The disclosure focuses on part-selection and does not disclose how logic is actually to be partitioned across multiple devices.

A computer program typically includes data gathering, data comparison and data output steps, often with many branch points. The principles of programming are well known in the art. A programmer usually begins with a high level perspective on what a program should do and how it should execute the program. The programmer must consider what machine will run the program and how to convert the desired program from an idea in the programmer's head to a functional program running on the target machine. Ultimately, a typical program on a general purpose computer is written in or converted by a compiler to machine code.

A programmer will usually write in a high level language to facilitate organizing and coding the program. Using a high level language like the C language, a programmer can control almost any function of the computer. This control is limited, however, to operations accessible by the computer. In addition, the programmer must work within the constraints of the physical system and generally cannot add to, remove or alter the configuration of computer components, the resources available, how the resources are connected, or other physical attributes of the computer.

In contrast, a special purpose computer can be designed to provide specific results for a range of expected inputs. Examples include controllers for household appliances, automobile systems control, and sophisticated industrial applications. Many such special purpose computers are designed into a wide range of commercial products, generally based on an ASIC. Programming an ASIC begins with a high level description of the program, but the program must be implemented by selecting a series of gates and circuits to achieve the programmer's goals. This usually involves converting the high level description into a logical description which can be implemented in hardware. Many values are handled as specific signals which typically originate in one circuit then are carried by a "wire" to another circuit where the information will be used, A typical signal is created to provide for a single logical event or combination which may never or rarely occur in real life, but must be considered and provided for. Each such signal must be designed into the ASIC as one or several gates and connections. A complex program may require many such signals, and can consume a large portion of valuable, available circuit area and resources. A reconfigurable device could allocate resources for signals only as needed or when there is a high probability that the signal will be needed, dramatically reducing the resources that must be committed to a device.

Programming a typical ASIC circuit is not easy but there are many tools available to help a programmer design and implement a circuit. Most programmers use silicon compilers, computer assisted engineering tools to design schematics which will perform the desired functions. An ASIC must be built to be tested, although many parts can be simulated with some accuracy. Almost any ASIC design requires revisions, which means making more parts, which is time consuming and expensive. A reconfigurable equivalent part can be incorporated in a design, tested, and modified with no or minimal modifications to physical hardware, essentially eliminating manufacturing revision costs in designing special purpose computers. Current configurable devices, however, are severely limited in capacity and cannot be used for complex applications.

A part can be simulated in hardware using PLDs, described above in the background section. These, however, can only be effectively programmed using hardware description languages, which have many shortcomings. Until now, there has been no way to convert a program of any significant complexity from a high level software language like C to a direct hardware implementation.

SUMMARY OF THE INVENTION

The present invention provides a configurable hardware system for implementing an algorithmic language program, including a programmable logic device (PLD), a hardware resource connectible to the PLD, a mechanism and method for configuring the PLD, and a programmable connection to the PLD. The programmable connection is typically an I/O bus connectible to the PLD. The PLD may include an and/or matrix device or a gate array, that is, a programmable array logic (PAL) device and a gate array logic (GAL) device including for example but without limitation, a non-programmable gate array (GA), a programmable gate array (PGA), a field programmable gate array (FPGA) and a logical cell array (LCA) device. The hardware resource may be a DSP, a memory device, or a CPU including for example but without limitation, an SRAM, a DRAM, a ROM, a register, a latch, non-volatile RAM or ferroelectric memory ROM. The hardware system is designed to provide resources which can be configured to implement some or all of an algorithmic language program. These resources can be placed on a module, referred to herein as a distributed processing unit (DPU).

One example of an algorithmic program is the classic hello, world\n C program. This program could easily be modified to output that famous message to an LED readout only when prompted by user input or perhaps to repeat that message at selected times without input or prompting. Another example of an algorithmic program is a digital filter which modifies an input data stream such as a sound or video signal.

A larger system can be built to make an extensible processing unit (EPU) from multiple DPUs plus support modules. A typical DPU includes a PLD, a hardware resource connected to the PLD, a mechanism and method for configuring the PLD, and programmable connections to the PLD. The programmable connections are typically an I/O bus. In addition, a typical EPU will include one or more dedicated bus lines as a configuration bus, used to carry configuration information over the configuration bus.

Each module in an EPU can be connected to other modules by one or more of several buses. A neighbor bus (N-bus) connects a module to its nearest neighbor, typically to the side or top or bottom in a two dimensional wiring array. A module bus (M-bus) connects a group of modules, typically two to eight modules, in a single bus. A host bus (H-bus) connects a module to a host CPU, if present. A local bus (L-bus) connects components within a single module.

The invention also includes a method of translating source code in an algorithmic language into a configuration file for implementation on a processing device which supports execution in place. This is particularly useful for use with the modules described above, including PLDs connected to a hardware device such as a DSP, CPU or memory. The PLD can be connected to a device capable of processing digital instructions. The algorithmic language can be essentially any such language; but C is a preferred algorithmic language: for use with this invention.

The method includes four sequential phases of translation, a tokenizing phase, a logical mapping phase, a logic optimization phase, and a device specific mapping phase. One embodiment of the method includes translating source code instructions selected from the group consisting of a C operator such as a mathematical or logical operator, a C expression, a thread control instruction, an I/O control instruction, and a hardware implementation instruction. The translator includes a stream splitter which selects source code which can be implemented on an available processing device and source code which should be implemented on a host computer connected to the processing unit. The hardware implementation instructions can include pin assignments, handling configurable I/O buses, communication protocols between devices, clock generation, and host/module I/O.

One object of this invention is to provide hardware resources to implement an algorithmic software program in hardware.

Another object of this invention is to provide a stream splitter to analyze an algorithmic source program and implement as much of the program as possible on the available hardware resources.

Yet another object of this invention is to provide hardware resources which can be reconfigured in whole or in part in a relatively short time to allow swapping of computer instructions. This allows a single set of hardware resources to implement many different computer programs or a large program on limited resources.

BRIEF DESCRIPTION OF THE DRAWINGS

FIGS. 1A, 1B, 1C and 1D illustrate different views of one embodiment of a module of this invention, in DIP package format.

FIGS. 2A, 2B, 2C and 2D illustrate different views of a second embodiment of a module of this invention, in SIMM module format.

FIGS. 15A, 15B, 15C, 15D, 15E, 15F and 15G illustrate various views of an embodiment of an EPU with two bridgemods, each connected to a common SCSI interface. FIG. 15A provides a schematic representation of this embodiment. FIG. 15B illustrates a top view of the same mods positioned parallel to and connected to each other, on 0.3 inch (0.76 cm) centers. FIGS. 15C and 15D illustrate a top and a bottom view, respectively, of an EPU mod with multiple bus connectors. FIG. 15E shows that the PC board is about 0.50" (1.27 mm), the PLD is about 3 mm thick (maximum vertical distance from PCB), the DSP is 2.5 mm, the DRAM is about 1.2 mm, the SSM connector is 5.72 mm and the dimension between PC boards (closest edge to closest edge) is about 0.250" (6.35 mm). FIG. 15F is another view showing a perspective drawing of four stacked EPUs with included components. FIG. 15G is a side and top perspective view comparable to FIG. 15B.

FIGS. 16B, 16D and 16F illustrate corresponding timing diagrams.

FIGS. 24A and 24B illustrate emulation of the "C" programming language in PLDs.

FIGS. 25A and 25B illustrate several representations of flow-through operations as implemented in DPUs.

FIG. 26 illustrates several representations of state operations implemented in DPUs.

FIGS. 27A, 27B and 27C illustrate implementation in a DPU of execution domains.

DETAILED DESCRIPTION OF THE INVENTION

The present invention is designed to provide hardware resources to implement algorithmic language computer programs in a specially configured hardware environment. The invention has been developed around the Xilinx XC3030 field programmable gate array (FPGA) but other Xilinx parts would work equally well, as would similar parts from other manufacturers. A PLD typically contains configurable logic elements plus input and output blocks and usually includes some simple connect paths, allowing implementation of a variety of state machines or a simple reroutable bus.

Figure 1A:
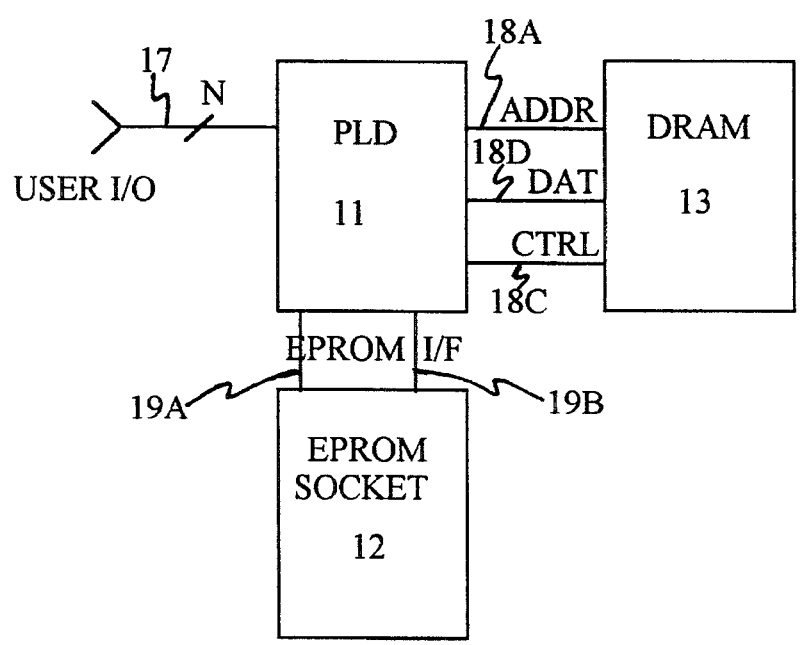
Figure 1B:
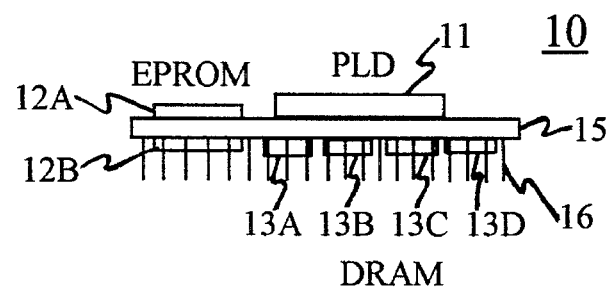

The simplest implementation of the device of this invention is a combination of a programmable logic device (PLD), a hardware resource, a mechanism and method for configuring the PLD and a programmable connection to the PLD. Referring to FIG. 1A, PLD 11 is connected to a hardware resource, DRAM 13, through one or more address lines 18A, one or more control lines 18C, and one or more data lines 18D. One method for configuring PLD 11 is from configuration data stored in EPROM 12 through EPROM interface lines 19A and 19B. Alternatively, configuration data can be loaded through one or more user I/O lines 17. EPROM 12 can contain data or other information useable by the PLD once it is configured. EPROM 12 can also contain data for multiple configurations. These devices can be assembled as a single module, e.g. distributed processing unit (DPU) 10. Referring to FIGS. 1B, 1C and 1D, one embodiment of DPU 10 consists of carrier 15 with traces (not shown) connecting one or more EPROMS, e.g. EPROMS 12A and 12B, to PLD 11 and other traces connecting one or more DRAMs, e.g. DRAMs 13A through 13D, to PLD 11. Additional traces connect user I/O lines 17 between PLD 11 and pins 16 on the edge of carrier 15. Pins 16 can be connected to external circuitry with I/O lines, power, clock and other system signals, if needed. PLD 11, EPROM 12 and DRAM 13 can be connected to carrier 15 by surface mounting, using a chip carrier, or using other techniques well known in the art. It is also possible to implement the entire DPU 10 on a single semiconductor substrate with programmable interconnect linking PLD, EPROM and DRAM blocks.

A basic configuration routine can be stored in EPROM 12 so that when the device is first powered up, EPROM 12 will load an initial logic configuration into PLD 11. I/O pins on PLD 11 for lines 17 and 18 are allocated and protocols for using those lines are pre-defined and stored in EPROM 12 then loaded from EPROM 12 into PLD 11 when DPU 10 is first powered up and configured. At least one line 19 between EPROM 12 (if present) or user I/O line 17 (if no EPROM present) is permanently configured in order to load initial configuration data. Data flows within DPU 10 via I/O lines 18 and 19 and may be buffered in DRAM 13. Data exchange with external devices flows over lines 17. DRAM 13 can be used to store information from EPROM 12, to store intermediate results needed for operation of the program on PLD 11, to store information from user I/O lines 17, or to store other data required for operation of DPU 10. Operators and variables, as needed for program function, are loaded as part of the configuration data in PLD 11. The sequencing of program steps does not necessarily follow the traditional von Neumann structure, as described below, but results from operation of DPU 10 according to the configuration of PLD 11 and the state of the system, including relevant inputs and outputs. Configuration data is reloadable according to the source program and current task and application requirements.

In a preferred embodiment, data for several configurations is precalculated and stored so as to be conveniently loadable into PLD 11. For example, EPROM 12 may contain data for one or more configurations or partial configurations. DRAM 13 can be used to store configuration data. If, during execution of a program on PLD 11, a jump or other instruction requires loading of a different configuration, the data for the new configuration or partial configuration can be rapidly loaded and execution can continue.

A simple device configuration might be used as a special purpose information processor. One or more of user I/O lines 17 can be connected to a simple input device such as a keyboard or perhaps a sensor of some sort (not shown). One or more other user I/O lines 17 can be connected to a simple output device such as an indicator light or an LED numeric display (not shown).

Alternatively, a DPU can be prepared in a preconfigured and consistent modular package with assigned pins for power, programming, program data, reset, system control signals such as clock, and buses for use with the system. In a preferred embodiment, a DPU is a module with 84 pins and 3 configurable buses, with 20 pins for each configurable bus and 34 pins for the remaining functions. Referring to FIGS. 2A through 2D, the DPU is built on a standard 84-pin SIMM board 20, 134 mm wide, 40 mm high, and 1 millimeter thick, with edge connectors 21 for connection to socket 22 in connector 22A (FIG. 2C). Locking pins 24 engage holes 23 to hold board 20 firmly in socket 22. Referring to FIG. 2C, board 20 can be connected to a corresponding socket such as AMP822021-5. Board 20 can hold up to four devices 25 on one side. Each device 25, preferably 33×33 mm, may be a DSP, a PLD, EPROM or other device. In one preferred embodiment, each device 25 is a DSP such as an Analog Devices AD 2105, AD 2101 or AD 2115. In another preferred embodiment, each device 25 is a PLD such as a Xilinx XC4003. Board 20 can hold PLD 11 and DRAM 27 on the other side. In a preferred embodiment, PLD 11 is a Xilinx XC4003, 33×33 mm, coupled to eight 4 Megabit DRAM 27 memory chips. In another preferred embodiment, PLD 11 is a Xilinx 3030. The devices can be surface mounted to minimize overall size. Referring to FIG. 2D, board 20 is about 1–2 mm thick, and DRAM 27 is about 1 mm thick and PLD 11 is about 5 mm thick, giving an overall thickness of about 7–8 mm. The overall space envelope for a fully loaded board 20 is less than 135 by 40 by 8 mm. Sockets are designed on 0.4" (10.1 mm) pitch.

Figure 3:
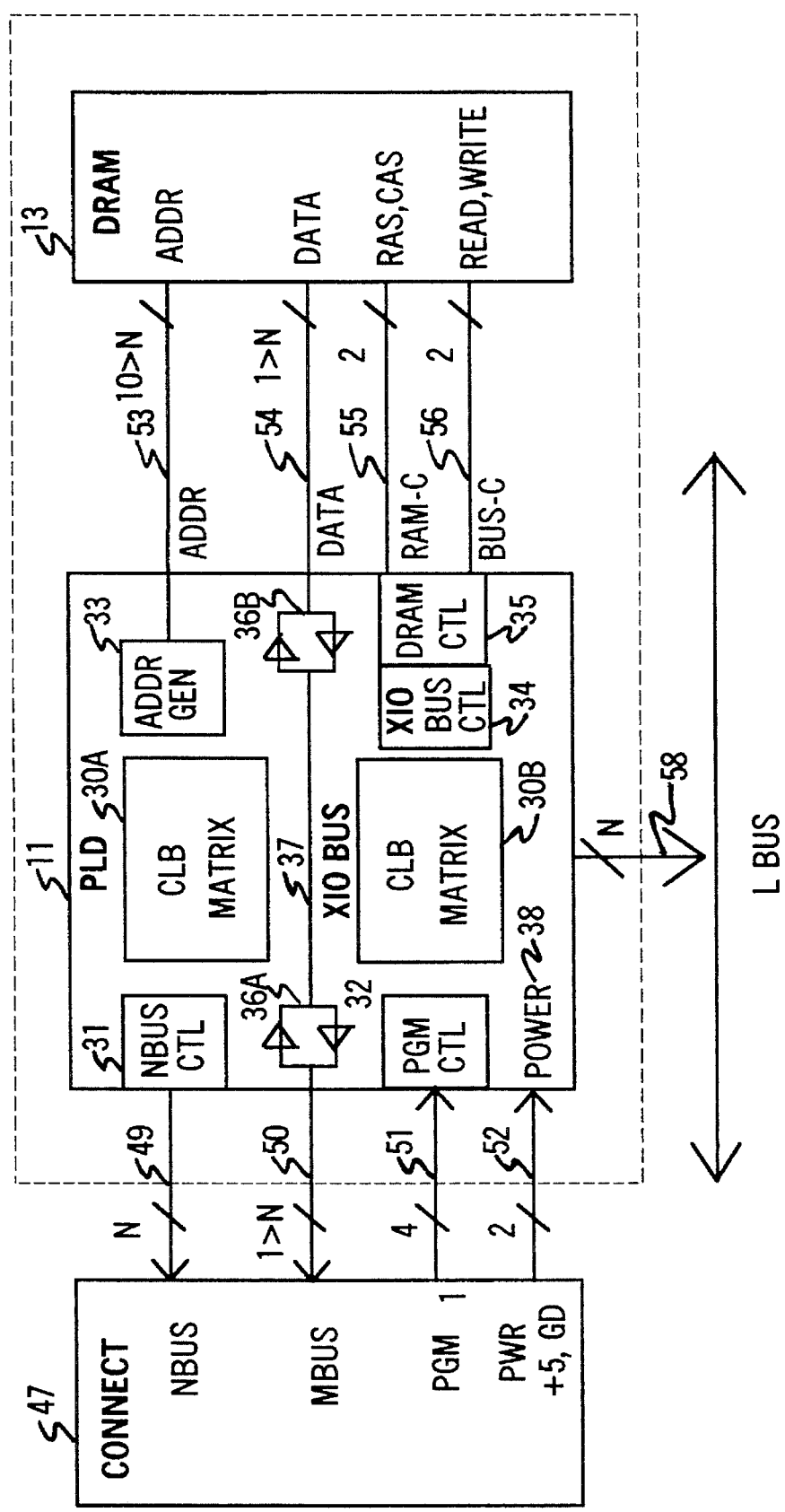
FIG. 3 illustrates a PLD connected to an N-bus, M-bus and L-bus.

Referring to FIG. 3, PLD 11 together with DRAM 13 and the connecting wiring are part of DPU 59. PLD 11 contains one or more configurable logic blocks 30, e.g. 30A, 30B, one or more configurable I/O ports including neighbor bus (N-bus) control port 31, program control port 32, address generator 33, and DRAM control 35, and other portions such as X-bus I/O control 34, X-bus 37 connected to tristate buffers 36A, 36B, and power circuits 38. The X-bus is an arbitrary bus that provides a path to pass signals through PLD 11 without modifying them. PLD 11 is connected to DRAM 13 through programmable interconnect which can be reconfigured as needed to complete the interface. The specific pins on PLD 11 that carry signals to DRAM 13 can be reconfigured as needed. Typically the wires that actually connect PLD 11 and DRAM 13 are fixed in place, but the function of each wire can be reconfigured as long as both PLD 11 and DRAM 13 have configurable inputs. PLD 11 has reconfigurable input and output pins. DRAM 13 can be manufactured with reconfigurable inputs and outputs, although at present there are no such devices on the market. PLD 11 still may be reconfigured to interact with a variety of DRAM devices which may have differing pin functions and pin assignments. Address generator 33 is connected through one or more (typically 10) address (ADDR) lines 53 to address circuits in DRAM 13. X-bus 37 is connected through tristate buffer 36B through one or more data lines 54 to data circuits in DRAM 13. DRAM control 35 is connected through one or more RAM control (RAM-C) lines 55 to RAS and CAS circuits in DRAM 13 and through one or more bus control (BUS-C) lines 56 to read and write circuits in DRAM 13.

PLD 11 is connected through several configurable lines to the rest of the system, represented here by connect block 47. N-bus control port 31 is connected to one or more lines which form neighbor bus (N-bus) 49. X-bus 37 is connected through tristate buffer 36A to one or more lines which form module bus (M-bus) 50. Program control port 32 is connected through one or more lines 51 to program circuits in connect block 47. In some applications, the program control lines will be fixed and not reconfigurable and provide a mechanism and method of loading initial configuration and program information into PLD 11. Power circuits are connected to power circuits through one or more lines 52. In most applications, power lines 52 would not be reconfigurable and would be hard wired to serve a single function.

N-bus 49 provides global connectivity to the closest neighboring DPU modules, as described below, allowing data to flow through a systolic array of processors. M-bus 50 provides connectivity within a group of DPUs, as described below, which typically extends beyond immediate neighbors.

One or more lines form L-bus 58 which connects PLD 11 through I/O circuits (not shown) to other PLDs or other devices, generally mounted in the same DPU. The L-bus allows multiple PLDs in a single DPU to implement Boolean logic that will not fit on a single PLD. N-bus 49, M-bus 50 and L-bus 58 are configurable into an arbitrary number of channels, with arbitrary protocols. The total number of channels in any bus is limited by the total number of lines allocated to that bus but one skilled in the art will recognize many ways to allocate total lines among several buses.

Figure 4:
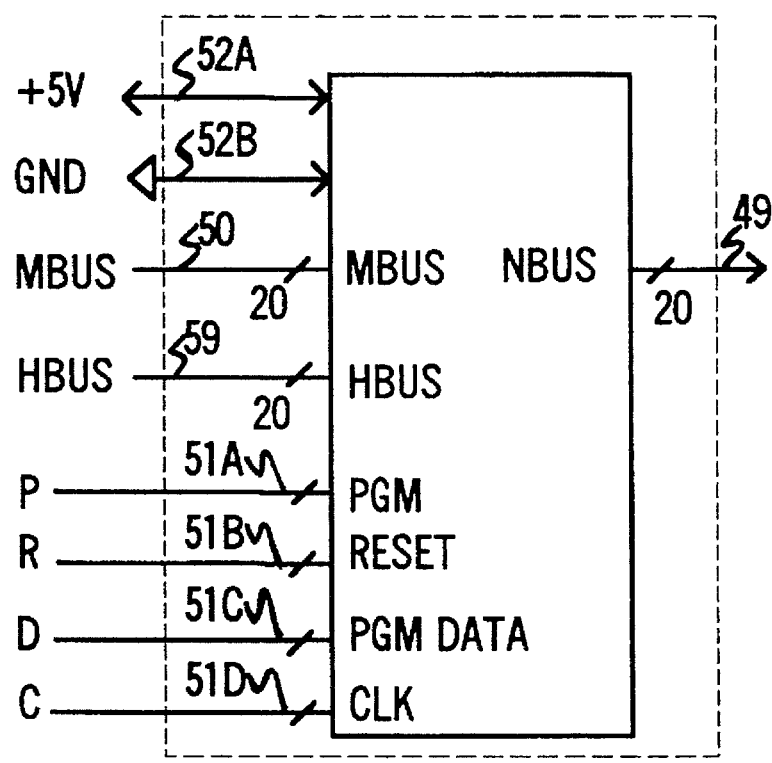
FIG. 4 illustrates the logic symbol and main connections to a distributed processing unit (DPU).

Referring to FIG. 4, a DPU can be represented by a logic symbol with connections to power 52A, 52B, bidirectional buses M-bus 50, N-bus 49, H-bus 59, and generally unidirectional lines program 51A, program data 51C, reset 51B, and clock 51D.

Figure 5:
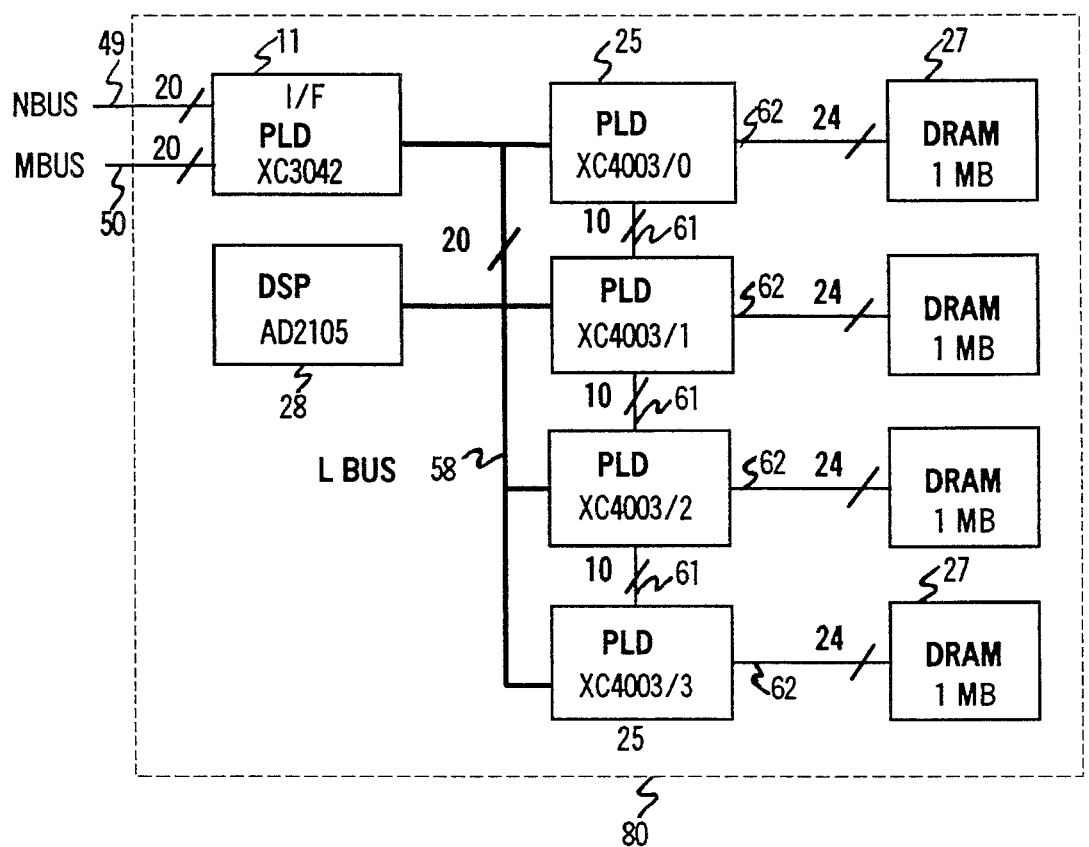
FIG. 5 illustrates a module with multiple PLDs, each connected to an independent DRAM.

With these basic design considerations in mind, one skilled in the art will recognize that many combinations of useful components can be assembled using the teachings of this invention. Referring to FIG. 5, a PGA-Mod distributed processing module 80 may consist of carrier 15 (FIG. 1B) or preferably board 20 (FIG. 2A) fitted with PLD 11 as an interface device connected together with DSP 28 and one or more PLDs 25 through local bus 58. Each PLD 25 is connected to each adjacent PLD 25 through local-neighbor bus 61 and to local DRAM 27 by bus 62. PLD 11 is also connected to, N-bus 49 and M-bus 50. Buses N-bus 49, M-bus 50 and L-bus 58 may each be one or more lines, preferably 20. In one preferred embodiment, interface PLD 11 is an XC3042-70, each of four PLDs 25 are an XC4003-6, each of four DRAMs 27 may be 256 KB, 12 KB, 1 MB or, preferably, 4 MB, and DSP 28 is an Analog Devices AD 2105, a 10 MIP part, or AD 2101 or AD 2115, operating at up to 25 MIPs. Faster parts or parts with more resources can be substituted as needed.

Figure 6:
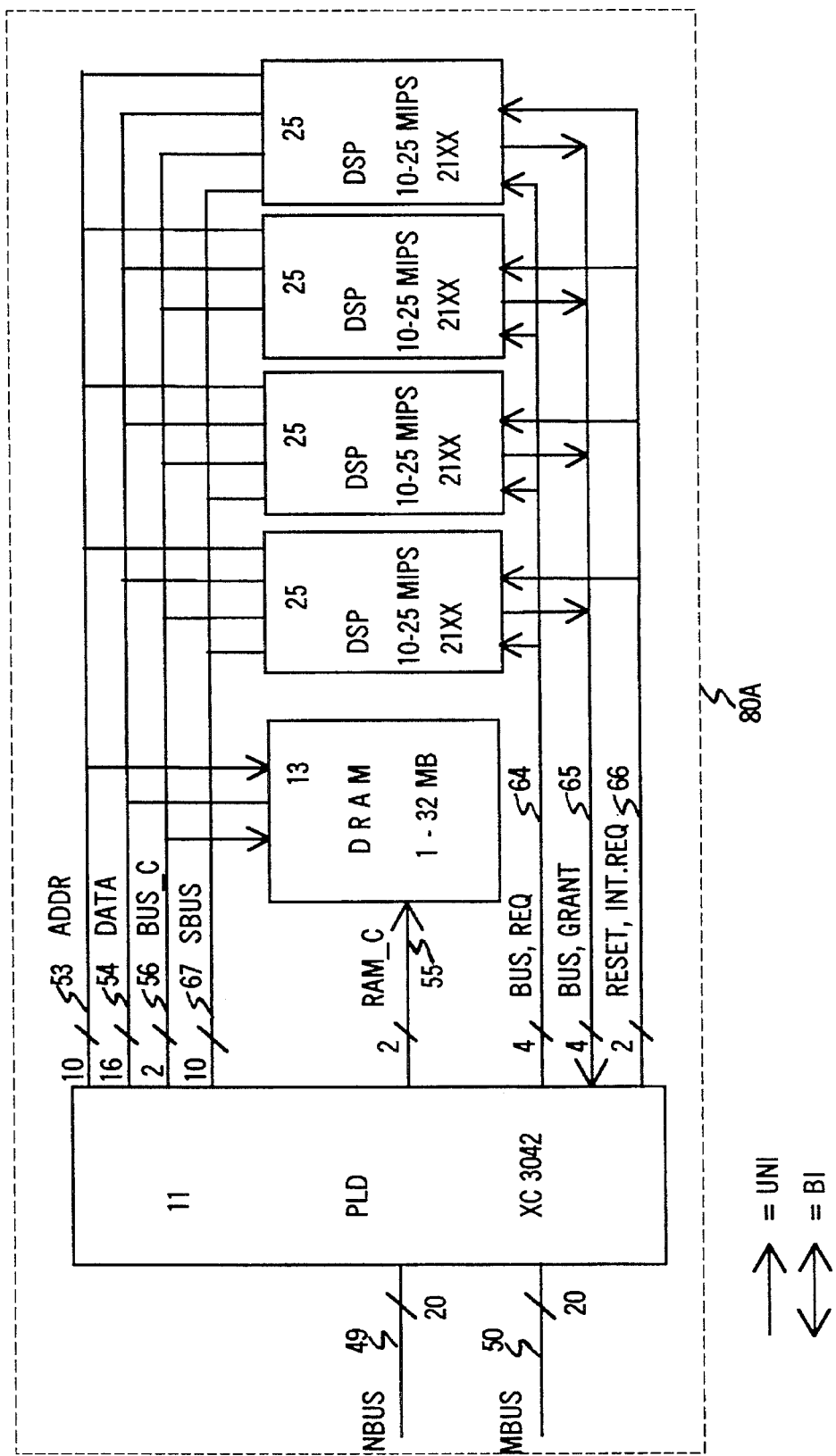
FIG. 6 illustrates a module with a PLD connected to a memory unit and multiple DSP units.

Another useful embodiment includes multiple DSP chips to provide a scalable intelligent image module (SIImod). Referring to FIG. 6, SIImod 80A is a DPU where PLD 11 is connected to N-bus 49 and M-bus 50, to DRAM 13 through one or more, preferably ten, address lines 53, one or more, preferably sixteen, data lines 54, one or more, preferably two, RAM-C lines 55 (connected to RAS, GAS circuits in DRAM 13), and one or more, preferably two, BUS-C bus control lines 56 (connected to read/write circuits in DRAM 13), plus one or more, preferably ten, lines forming serial bus (S-bus) 67. Each bus line of 53, 54, 55, and 67 is bidirectional in this implementation except DRAM 13 does not drive ADDR bus lines 53 or BUS-C lines 56. A unidirectional bus is indicated in FIG. 6 by an arrow head, a bidirectional bus has no arrows. PLD 11 is connected to one or more DSPs 25 through address lines 53, data lines 54, and BUS-C bus control lines 56, plus one or more, preferably four, bus request lines 64, one or more, preferably four, bus grant lines 65, one or more, preferably two, reset/interrupt request lines 66 and S-bus 67. DSPs 25 are allocated access to internal bus lines 53, 54, 56 using a token passing scheme, and give up bus access by passing a token to another DSP or simply by not using the bus. In one preferred embodiment, PLD 11 is an XC31M2, DRAM 13 includes 4–8 MB of memory, and each DSP 25 is an Analog Devices AD 2105. S-bus 67 is configured to access the serial ports of each device in SIImod 80A and is particularly useful for debugging. DSPs 25 can access DRAM 13 in page mode or in static column mode. PLD 11 handles refresh for DRAM 13. The dimensions of each of bus lines 53, 54, 56 are configurable and the protocols can be revised depending on the configuration and programming of each part and to meet the requirements of the dataflow, data type or types, and functions of any application program running on the module.

Figure 7:
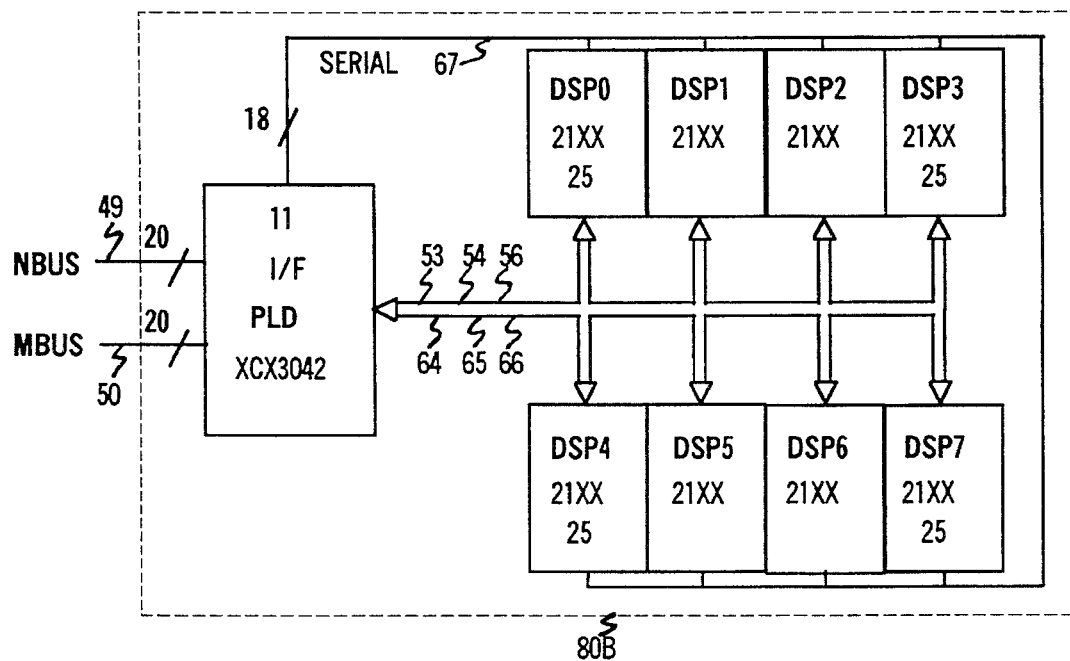
FIG. 7 illustrates a different module including a PLD connected to multiple DSP units.

Another useful embodiment includes an array of eight DSPs to provide a DSPmod. Referring to FIG. 7, DSPmod 80B is a DPU where PLD 11 is connected to N-bus 49 and M-bus 50, through buses equivalent to those in SIImod 80A, including address lines 53, data lines 54, and BUS-C bus control lines 56, plus S-bus 67, reset/interrupt request lines 66 and, preferably one line for each DSP 25, bus request lines 64 and bus grant lines 65. The DSPmod differs from a SIImod principally in that the DSPmod does not include DRAM 13. PLD 11 can include memory resources to boot DSPs 25, such as an EPROM 12 (not shown) or configuration data loaded into PLD 11 from an external location (not shown). S-bus 67 can be configured to transfer data to and from DSPs 25 at 1 megabyte per second per DSP. The S-bus is primarily included as another way to selectively access a specific DSP, particularly for debugging a new protocol or algorithm. In general operation, the S-bus can be used to monitor the status of or data in any connected DSP. In a preferred embodiment, the DSPmod includes eight Analog Devices 2105s. Other DSPs can readily be designed into the DSPmod.

Figure 8:
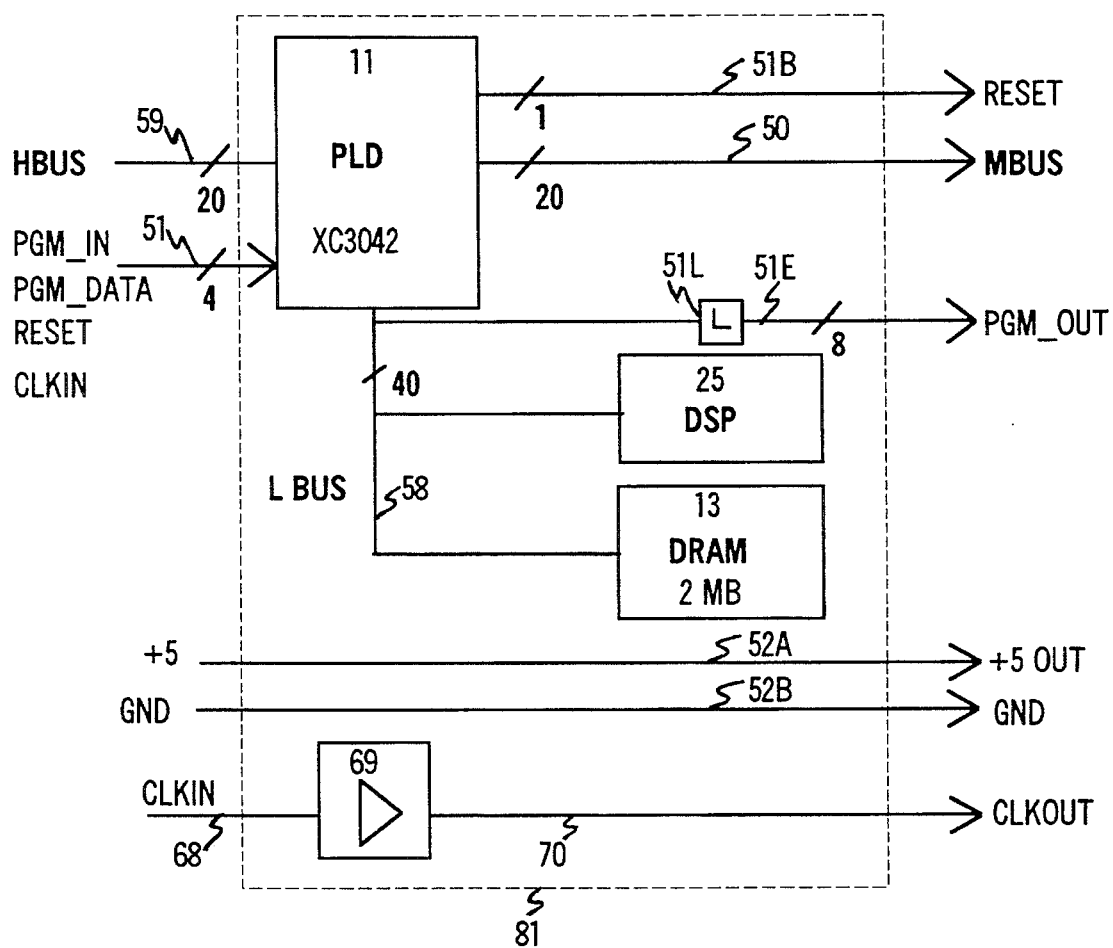
FIG. 8 illustrates a bridge module.

Certain special-purpose modules facilitate connecting DPUs into larger, integrated structures which can be extended to form very large processing arrays. Each DPU has an environment of incoming and outgoing signals and power. A bridge module (bridgemod) is provided to buffer data and to interface between H-bus signals and a local M-bus signals. This allows distribution of the host bus signals to a local M-bus and concentration of M-bus signals without undue propagation signal degradation or propagation time delay. A bridgemod is also provided to maintain the proper environment for each downstream DPU, including maintaining DPU configuration, power, and a synchronized clock. Referring to FIG. 8, bridgemod 81 connects PLD 11 to H-bus 59 and to M-bus 50, as well as to system lines 51 including program-in, program data, reset and clock-in. PLD 11 is also connected through L-bus 58 to DRAM 13. PLD 11 controls a group of program-out lines 51E, each controlled by a latch 51L. Each program-out line 51E is connectible to a downstream DPU to signal the sending of configuration data for that DPU on M-Bus 50. DSP 25 can be included but, is optional. If present, DSP 25 can be used for debugging and other functions. Clock buffer 69 cleans and relays clockin (CLKIN) 68 to clockout (CLKOUT) 70. Power lines 52A, 52B are connected to the parts in bridgemod 81 (not shown) and distributed to downstream DPUs. In a preferred embodiment, H-bus 59 and M-bus 50 each contain one or more lines, preferably 20, and L-bus 58 contains one or more lines, preferably 40. DRAM 13 can store configuration and protocol information for rapidly updating downstream DPUs. A typical DPU PLD will use no more than 2 KB of configuration data so 2 MB of DRAM 13 can store about 1,000 configurations for downstream PLDs. PLD 11 is preferably an XC3042. DRAM 13 is preferably 2 MB but more or less memory can be used for a particular application or configuration.

In a preferred embodiment, a bridgemod includes a PLD which can be configured as described above for DPUs. Within the bridgemod, each signal line of the H-bus and each signal line of the local M-bus is independently connectible to the PLD in that module, typically hardwired to an I/O pin of the PLD. This allows flexible and variable connection through the PLD between the H-bus and the local M-bus and at times may vary from connecting no common lines to connecting all lines between the buses. The PLD on the bridgemod can be configured using the same techniques described above for DPUs.

Figure 9:
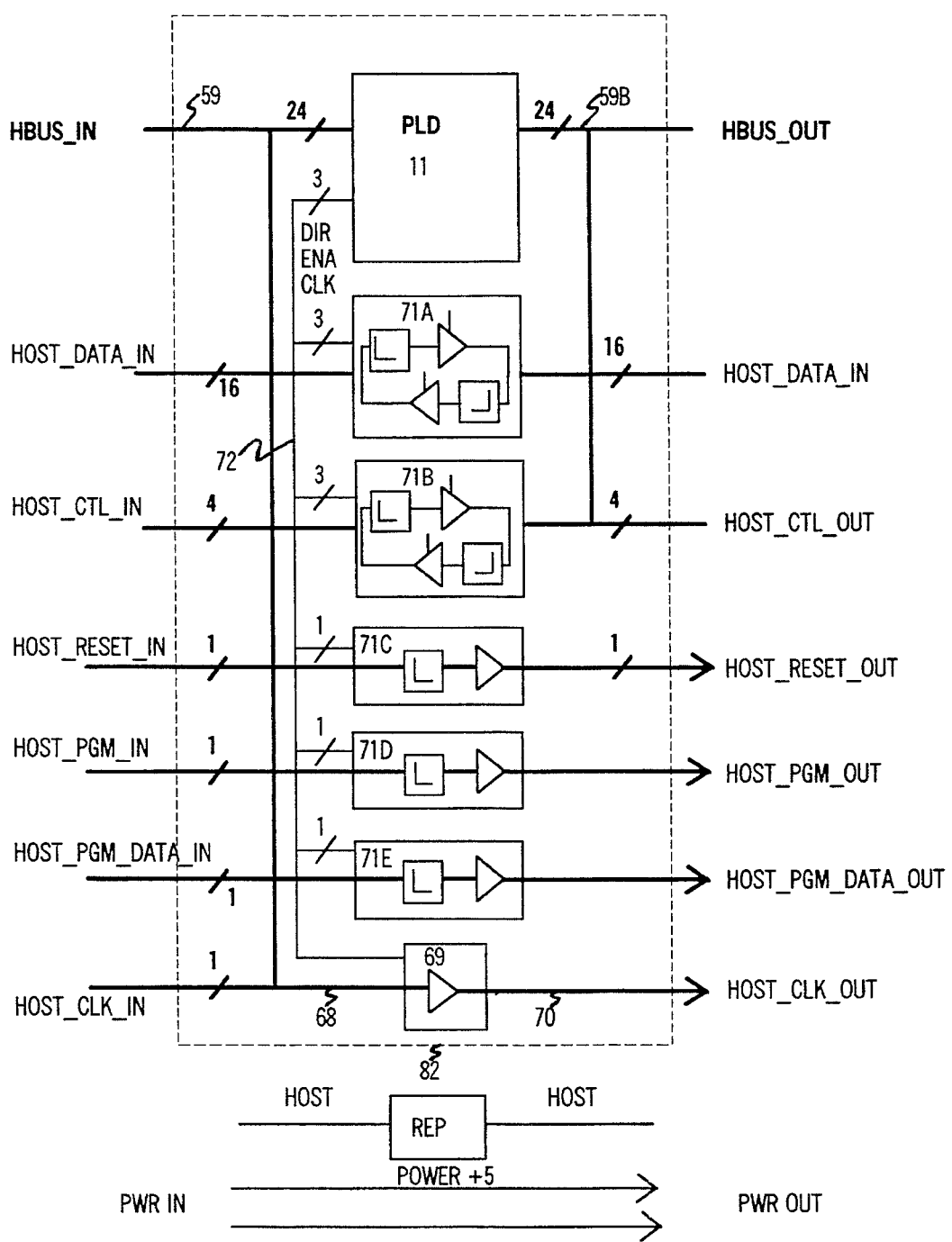
FIG. 9 illustrates a repeater module.

A repeater module (repmod) is provided to buffer and to drive bus lines over long distances. Such modules are used as needed to boost signals on the H-bus to modules which are distant from the host, allowing the bus to be arbitrarily long. Referring to FIG. 9, PLD 11 connects inbound H-bus 59 (connected to the host) and buffered H-bus 59B (connected to one or more downstream bridgemods). In a preferred embodiment, H-bus 59 is configurable only in 8-bit groups, e.g. 8-, 16-, 24- or 32-bit, to facilitate connection to existing buses. PLD 11 is also connected to bus buffers 71A–E and clock buffer 69, including enable, clock and direction control lines 72, preferably three lines, to designate whether the buffer is to act on inbound or outbound signals. These buffers preferably are synchronized to remove any skew in the clock or other signals on the H-bus. The buffers keep signals clean, full strength, and synchronized. Bus buffers 71A–E include host data buffer 71A and host control buffer 71B, tri-state buffers which can be enabled to buffer signals in a selected unidirectional direction. Host reset buffer 71C, host program buffer 71D and host program data buffer 71E, when enabled, buffer signals from H-bus 59 to H-bus 59B to buffer signals carrying reset, program and data instructions to downstream modules, allowing the host (not shown) to reset, configure, and otherwise control downstream modules. This control would typically be directed to downstream bridgemeds, and control of DPUs on each bridgemod typically would be handled by signals on the host bus control lines. Clock buffer 69 cleans and relays clockin (CLKIN) 68 to clockout (CLKOUT) 70. The connections between host I/O channel and the local extension of the H-bus typically are hardwired but may be programmably connectible.

H-buses 59, 59B are connected in parallel to PLD 11 and bus buffers 71A–E. The bus buffers clean and repeat signals from one host bus to the other under the control of PLD 11, which monitors the state of each host bus and sets appropriate enable lines to control which buffers can repeat signals and in which direction to operate. For example, H-bus 59 may carry a packet for distribution to H-bus 59B. If the packet arrives while H-bus 59B is otherwise busy, possibly with a competing write request to H-bus 59, then PLD 11 can return a busy signal to H-bus 59. Small packets might be stored in PLD 11 without returning a busy signal. When H-bus 59 is free to write, PLD 11 enables the bus buffers 71A–E. Conversely, when H-bus 59B requests access to H-bus 59, PLD 11 will wait until H-bus 59 is free, then enable bus buffers 71A-B in that direction.

Data is best transferred in the form of writes, not reads, so that packets can be stored and forwarded as necessary without the need to establish and hold an open channel for reading. A typical read then would be performed by send a "write request" and waiting for a return write.

Extensible Processing Unit (EPU)

Figure 10:
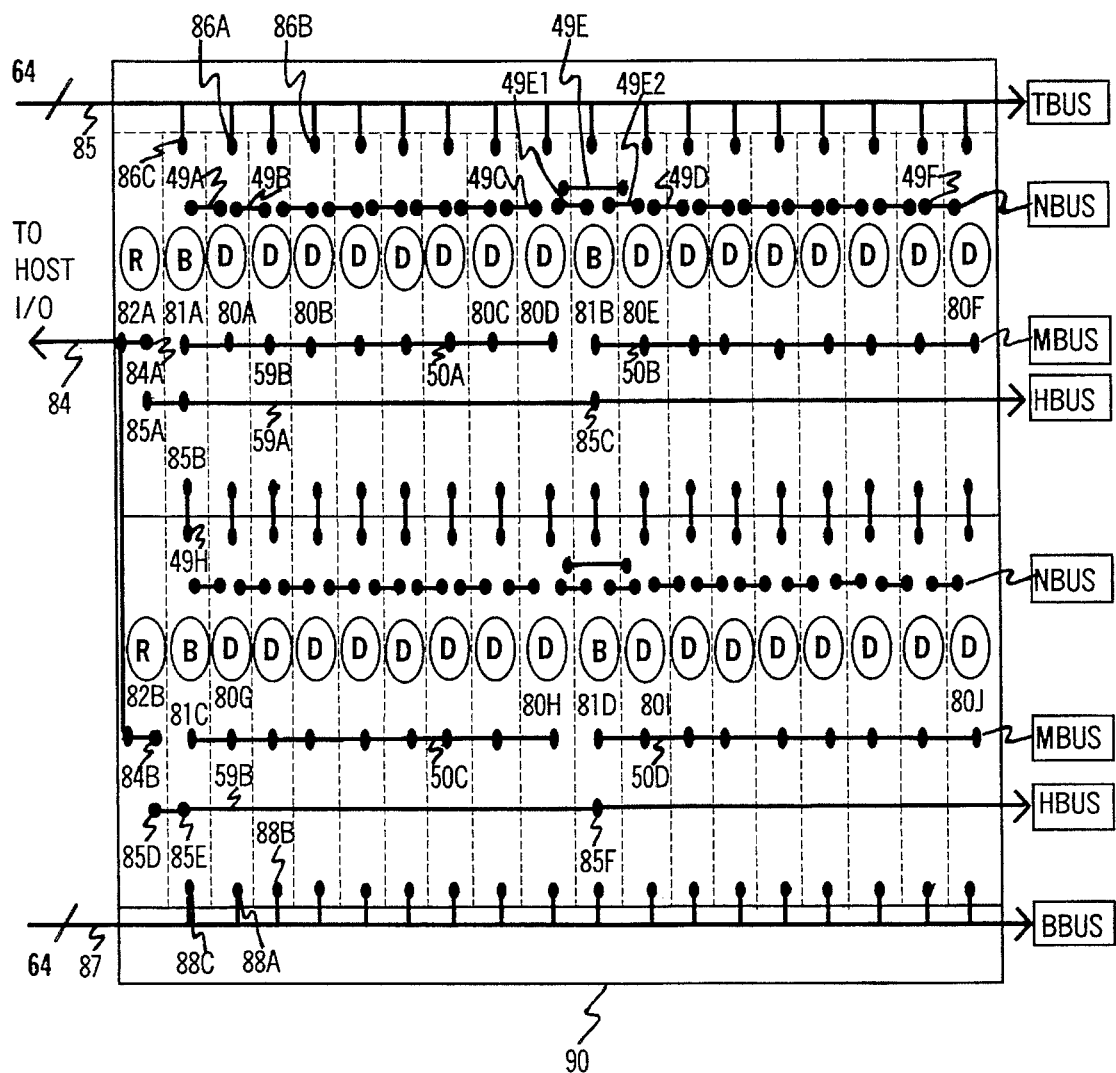
FIG. 10 illustrates an extensible processing unit (EPU) and the interconnections between distributed processing units.

Referring to FIG. 10, an array of DPUs 80 can be linked through neighbor buses (N-buses) 49, module buses (M-buses) 50, and a host bus (H-bus) 59 to form extensible processing unit (EPU) 90. In a preferred embodiment, an EPU is simply a regular, socketed array with limited wiring, each socket adapted to accommodate the DPU illustrated in FIG. 2A or related support modules. Modules in the EPU may include any of several types of DPU, including a PGA module (PGAmod), a SIIM module (SIImod) or DSP module (DSPmod) or support modules including a bridge module (bridgemod) or repeater module (repmod). This regular array allows using a flexible number of DPUs in a specific configuration or application.

The physical modules might be in a two dimensional array or in a geometric configuration which can be equated to a two dimensional array. The following discussion refers to "horizontal" and "vertical" relationships, referring specifically to the drawings, but one skilled in the art will understand this can be implemented in a number of ways.

In a preferred embodiment, essentially every pair of horizontally or vertically adjacent modules is connected through an N-bus. Each DPU is connected to each of its nearest "horizontal" neighbors by an independent N-bus, e.g. N-bus 49B between DPU 80A and its neighbor DPU to the fight 80B and N-bus 49C between DPUs 80C and 80D. N-bus 49D connects DPU 80D to the DPU to its fight and N-bus 49F connects DPU 80F to the DPU to its left. An N-bus may also connect other adjacent modules. Still other N-buses connect vertically adjacent modules, if present. N-bus signals and protocols are controlled by the PLD on each DPU and can be varied as needed to provided communication between selected specific modules or selected types of modules.

Bridgemods can be included in the N-bus connectivity or skipped. For example, N-bus 49E connects DPU 80D to its nearest DPU neighbor to the right, DPU 80E. This might be achieved by inserting a jumper, by hardwiring a mother board to route that N-bus, or, preferably, by connecting N-bus 49E to bridgemod 81B, which passes the bus directly through to the neighboring DPU. Alternatively, it is entirely feasible to include bridgemods in the N-bus network. In this case, N-bus 49E1 connects DPU 80D to bridgemod 81B and N-bus 49E2 connects bridgemod 81B to adjacent DPU 80E. In this embodiment, N-bus 49A connects bridgemod 81A to DPU 80A and N-bus 49H connects vertically adjacent bridgemods 81A and 81C.

In a preferred embodiment, an M-bus serves as a local bus to share signals among all of the modules, typically DPUs, on that M-bus. In each module, each signal line of the local M-bus is independently connectible to the PLD in that module, typically hardwired to an I/O pin of the PLD. In a large EPU, there may be multiple M-buses, connecting separate groups of DPUs. Each group includes a bridgemod to connect the local M-bus to the H-bus. A group of several DPUs, e.g. 80A through 80D, are each connected together and to bridgemod 81A through M-bus 50A. Similarly, DPUs 80E through 80F are connected together and to bridgemod 81B through M-bus 50B, DPUs 80G through 80H are connected together and to bridgemod 81C through M-bus 50C, and DPUs 80I through 80J are connected together and to bridgemod 81D through M-bus 50D.

Each bridgemod serves to connect the H-bus to the local M-bus, as described above. Bridgemod 81C connects M-bus 50C to H-bus 59B at 85E. Similarly, bridgemod 81A connects M-bus 50A to H-bus 59A at 8511, bridgemod 81B connects M-bus 50B to H-bus 59A at 85C, and bridgemod 81D connects M-bus 50D to H-bus 59B at 85F.

EPU 90 includes repmods 82A and 82B. As described above, a repmod connects the host I/O channel to a portion of the H-bus. Repmod 82A is connected to host I/O channel 84 at junction 84A and to host bus 59A at point 85A. Repmod 82B is connected to host I/O channel 84 at junction 84B and to host bus 59B at point 85D.

A two dimensional array of modules, as illustrated in FIG. 10, is filled only to certain limits in each dimension, creating a top, a bottom, a left side and a right side. Various bus connections are designed to connect to adjacent modules but at the edges there are no modules present. These bus connections can be terminated or can be coupled together, for example as another bus. In FIG. 10, EPU 90 has no N-bus connection from DPU 80F to any module on the right. The bus connections can be terminated with pull-up resistors, allowed to float, or simply not assigned to any connections by the PLD on DPU 80F. Similarly, there are no N-bus or M-bus connections to the right or left of EPU 90. N-bus connections 86A, 86B and others from the top of each DPU in the top row of modules are tied to top bus (T-bus) 85 which may be connected to selected bus or signal lines (not shown). T-bus lines may be connected in parallel to several DPUs but preferably will provide a collection of independent lines to DPUs, allowing an external device to individually exchange data with a DPU. This may be particularly useful in a large imaging application where each DPU has access to a separate portion of a frame buffer or to a distributed database. T-bus 85 can provide a high bandwidth connection to the modules at the top of the array. Similarly, N-bus connections 88A, 88B from the bottom of each DPU in the bottom row of modules are tied to bottom bus (B-bus) 87 which may be connected to selected bus or signal lines (not shown), in a manner similar to that described for the T-bus. B-bus 87 can provide a high bandwidth connection to the modules at the bottom of the array. In certain embodiments, bridgemods may also be connected to the T-bus and B-bus as illustrated by N-bus connections 86C and 88C.

A wide variety of DPU modules can be designed, but in general a limited number of DPU types will provide extraordinary functionality and can be used for a very wide variety of applications. Using the EPU format, multiple EPUs can be mounted in a suitable frame and connected through the host bus and other buses described above. Multiple EPUs can be placed edge to edge and connected to form large processing arrays. The principal limitation on size is the time required to propagate signals over long distances, even with repeaters, and limits on signal carrying capacity when using long lines. Persons skilled in the art are well acquainted with long signal lines and with methods to maximize signal transmission without loss of data.

Figure 11:
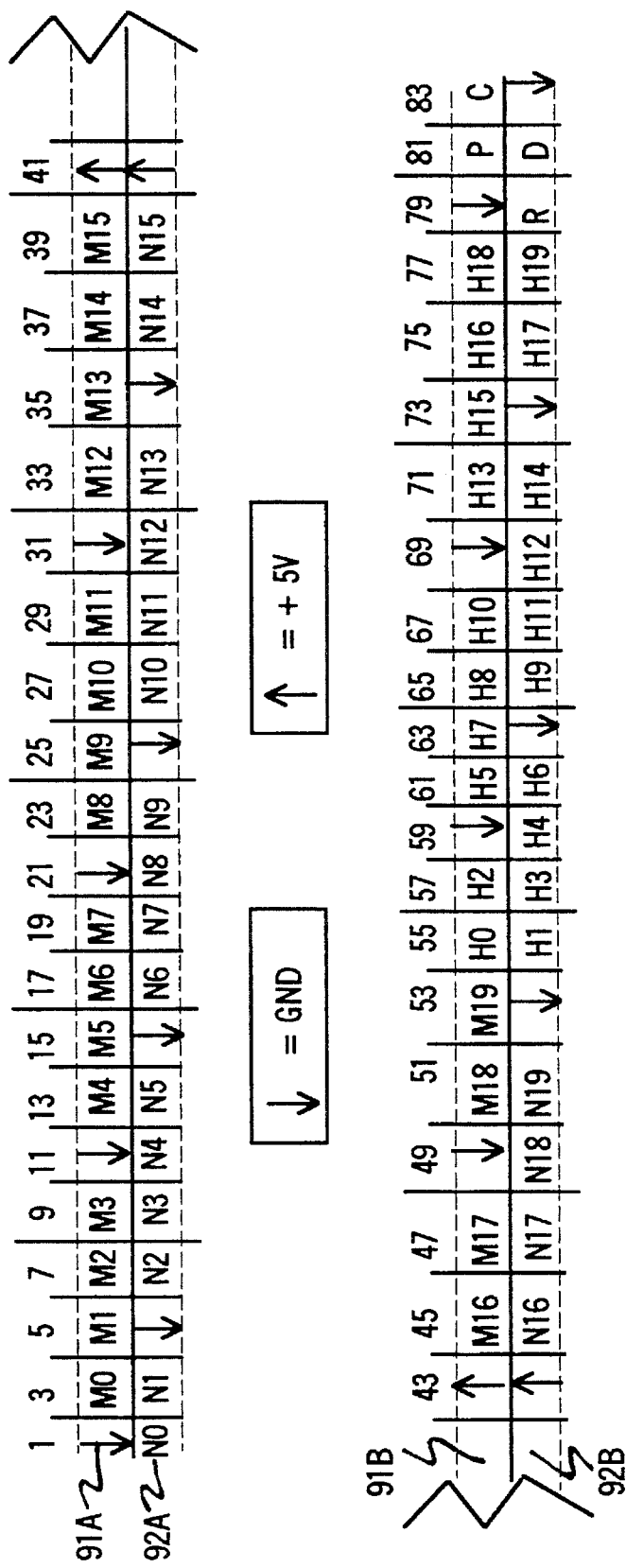
FIG. 11 illustrates one pinout configuration of a DPU.

An EPU can be connected to DPU buses in a variety of ways. In a preferred embodiment, a DPU is a single card with an 84 pin edge connector as described above in relation to FIG. 2. An EPU board can be fitted with a series of corresponding sockets such as AMP822021-5. Referring to FIG. 11, connections 91A, 91B on the "top" row of sockets on board 20 are assigned odd numbers (as shown) and connections 92A, 92B on the "bottom" row of sockets on board 20 are assigned even numbers (not shown). Connections 91A-3 through 91B-53 are assigned to M-bus 50 lines 0 through 19, with some intervening ground and power connections, as shown. Similarly, connections 92A-2 through 92B-52 are assigned to N-bus 49 lines 0 through 19, with some intervening ground and power connections. Connections 91B-55 through 92B-78 are assigned to H-bus 59. Connections 92B-80 through 91B-83 are assigned to system functions reset (R), program (P), program data (D), and clock (C).

A series of sockets on a board can be prewired for a selected configuration. For example, to construct the EPU of FIG. 10, a series of sockets can be wired to connect N-bus lines n0–n4 to the left adjacent module, n5–n9 to the upper adjacent module or T-bus, as appropriate, n10–n14 to the right adjacent module and n15–n19 to the lower adjacent module. All M-bus lines m0–m19 could be wired in parallel for a group of sockets, and H-bus connections only to sockets for bridgemods 81A, 81B, 81C and 81D. Since repmods 82A and 82B have no N-bus or M-bus, leads for any of those lines are available to wire host I/O bus 84 to the corresponding sockets. Many potential configurations can be designed easily by one skilled in the art.

Figure 12:
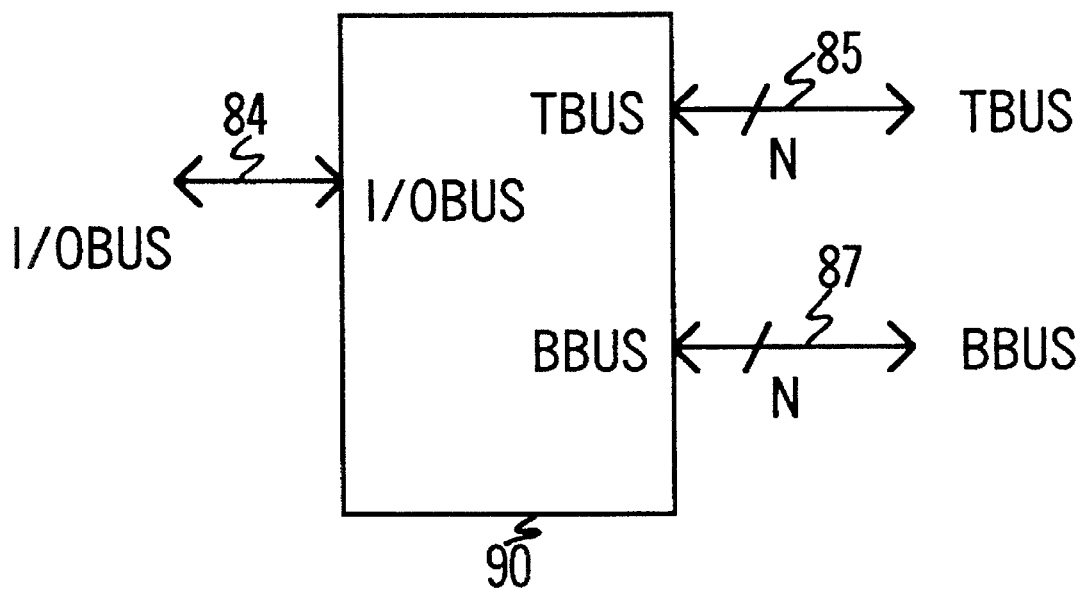
FIG. 12 illustrates a logic symbol for an EPU.

An EPU can be indicated by the simple logic symbol illustrated in FIG. 12, with connections to I/O bus 84, top bus (T-bus) 85 and bottom bus (B-bus) 87.

An EPU can be laid out in a wide variety of configurations, such as a standard ISA bus board or a Nu-Bus board. One such configuration is the Transformer-100X or TF-100X, shown in FIG. 13B. This particular configuration implements three DPUs not as discrete modules on individual boards but as an EPU of fixed configuration with capacity for components to form three specific DPUs. The board is socketed for discrete devices which, if present, can provide a bridgemod, two SIImods and one PGAmod. This configuration allows the user to provide devices for a DPU, if desired, and to select how much memory to include in any particular DPU.

Figure 13A:
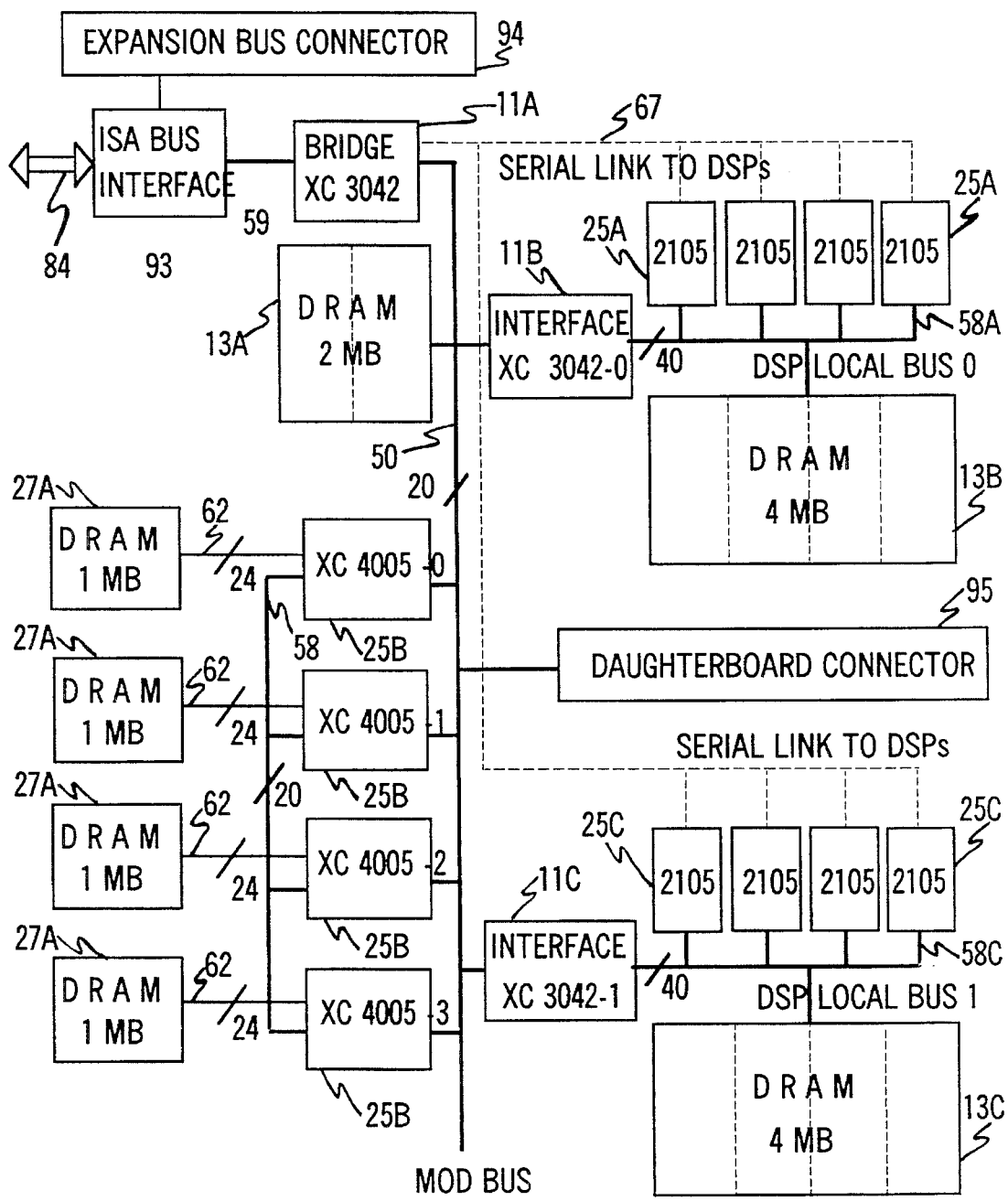
FIG. 13A illustrates a schematic view of one embodiment of an EPU assembled on a PC board and connected to an ISA bus interface.
Figure 13B:
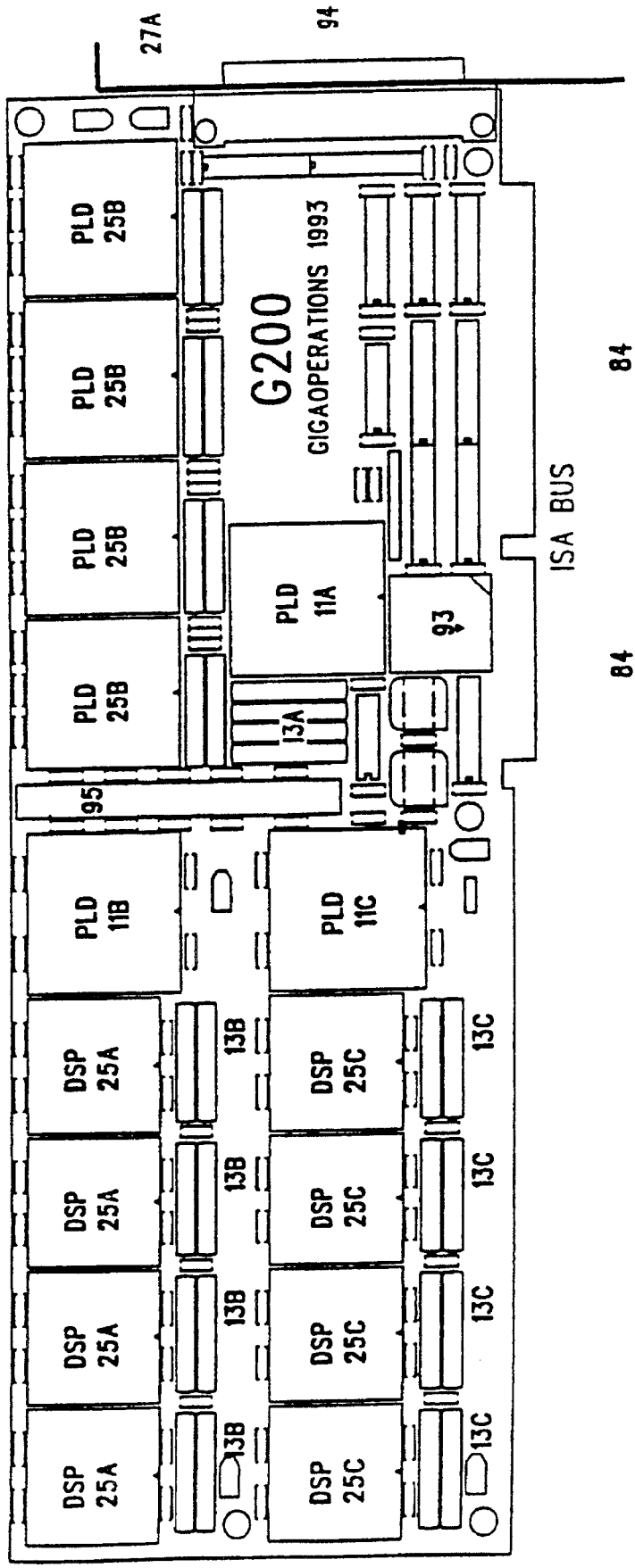
FIG. 13B illustrates that embodiment as laid out on a PC board.

Referring to the block diagram in FIG. 13A, I/O bus 84 connects to ISA bus interface device 93 which handles all communication with the external system (not shown) to and from the EPU. The external system can be one of any number of MS-DOS personal computers. ISA bus interface device. 93 is connected through H-bus 59 to a bridgemod section including PLD 11A connected to DRAM 13A. PLD 11A can be an XC3042 or an XC 3030. DRAM 13A can be sized as desired, preferably 2 MB.

PLD 11A connects H-bus 59 to M-bus 50. M-bus 50 is preferably 20 lines wide. Each line can transfer information at 2 MB/sec, resulting in a net transfer rate of 40 MB/sec within the TX-100X board. M-bus 50 is connected to several devices which provide the functionality of two SIImods and one PGAmod. M-bus 50 also is connected to a daughterboard connector 95 for one or more additional processing devices such as a frame buffer or coprocessor. ISA bus interface device 93 can be connected to expansion bus connector 94 for further connections to another device, such as another EPU located externally.

The TF-100X includes two SIImod units. Each SIImod is socketed for a PLD 11B, 11C, connected to M-bus 50. PLD 11B or 11C can be an XC 3030 but preferably is an XC 3042. The socket for each PLD 11B or 11C is hardwired through L-bus 58A or 58C, respectively, to sockets for four DSPs 25A and 25C and for DRAM 13B and 13C, respectively, to provide Address, Data, R/W, RAS/CAS, Bus request, bus grant, interrupt and reset functions, as described above in relation to FIG. 6. Each DSP 25A or 25C, if present, is preferably an Analog Devices AD 2105, a 10 MIP part, and DRAM 13B and 13C preferably is 4 MByte, 70 ns or faster, but may be 1 MB through 8 MB or other desired size. Bridgemod PLD 11A is also connected to each one of DSPs 25A and 25C through one or more, preferably one, lines in serial bus 67. The fully configured TF100X board includes eight DSPs for a total of 80 MIPs processing power, coupled to 8 Mbyte of DRAM pool memory.

Bridge PLD 11A is also connected through M-bus 50 to sockets for four PLDs 25B connected to form a PGAmod. Each of PLDs-25B is connected through a bus 62 to corresponding DRAM 27A, which may be 256K through 2 MB, preferably 1 MB. Bus 62 preferably is 24 lines, 8 for data. Each of PLDs 25B is connected to each other through one or more, preferably ten, lines of L-bus 58B. Each of PLDs 2511 may also be connected to its nearest neighbors by an additional L-bus (not shown). Each PLD 25B is preferably a Xilinx XC 4003 connected to 1 MB 70 ns DRAM. The ten lines of L-bus 58B transmit information at 20 MB/sec between PLDs 25B and each of PLDs 25B can access its associated DRAM 27A at 20 MB/sec over 8 data lines.

Figure 14:
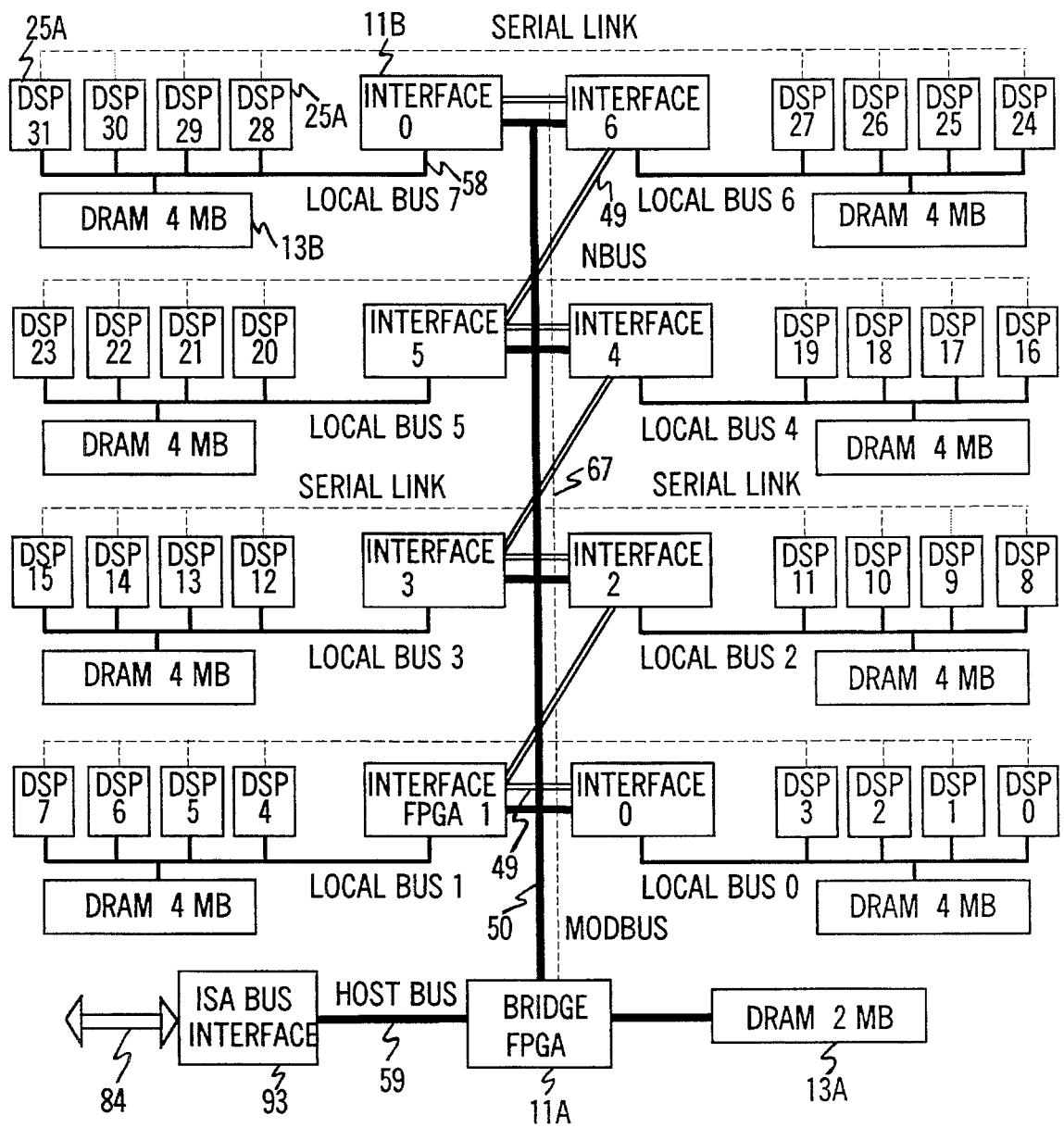
FIG. 14 illustrates another embodiment of an EPU assembled on a PC board and connected to an IS A bus interface.

Another EPU configuration is the Transformer 800, the TF-800X, generally similar to the TF-100X but with SIIM sockets to accept eight modular DPUs, as described above in relation to FIG. 2. This is equivalent to one quadrant of the EPU of FIG. 10. The configuration shown includes eight SIImods. Referring to FIG. 14, I/O bus 84 connects to ISA bus interface device 93 connected through H-bus 59 to a built-in bridgemod with PLD 11A and DRAM 13A. PLD 11A connects H-bus 59 to M-bus 50, which is connected to a series of eight 84 pin sockets. There are no daughterboard or external bus connectors but PLDs 11B can each be tied to a T-bus or B-bus (no shown) to provide additional resources. Each socket, as described above in relation to FIG. 2 and FIG. 11, has connections for various bus lines. A typical SIImod is described above in relation to FIG. 13A but the SIImod to be used here will be built on board 20 of FIG. 2. Each SIImod can be assembled and installed selectively so that an operational TF-800X may have a single SIImod with only 500K memory or 8 SIImods, each with 1 MB memory up to each SIImod with 4 MB of memory or even more with future generations of commercial DSP and memory devices. A single SIImod with 1 MB of memory can deliver 40 MIPS and eight SIImods, each with 4 MB of memory, can deliver 320 MIPS.

Figure 15A:
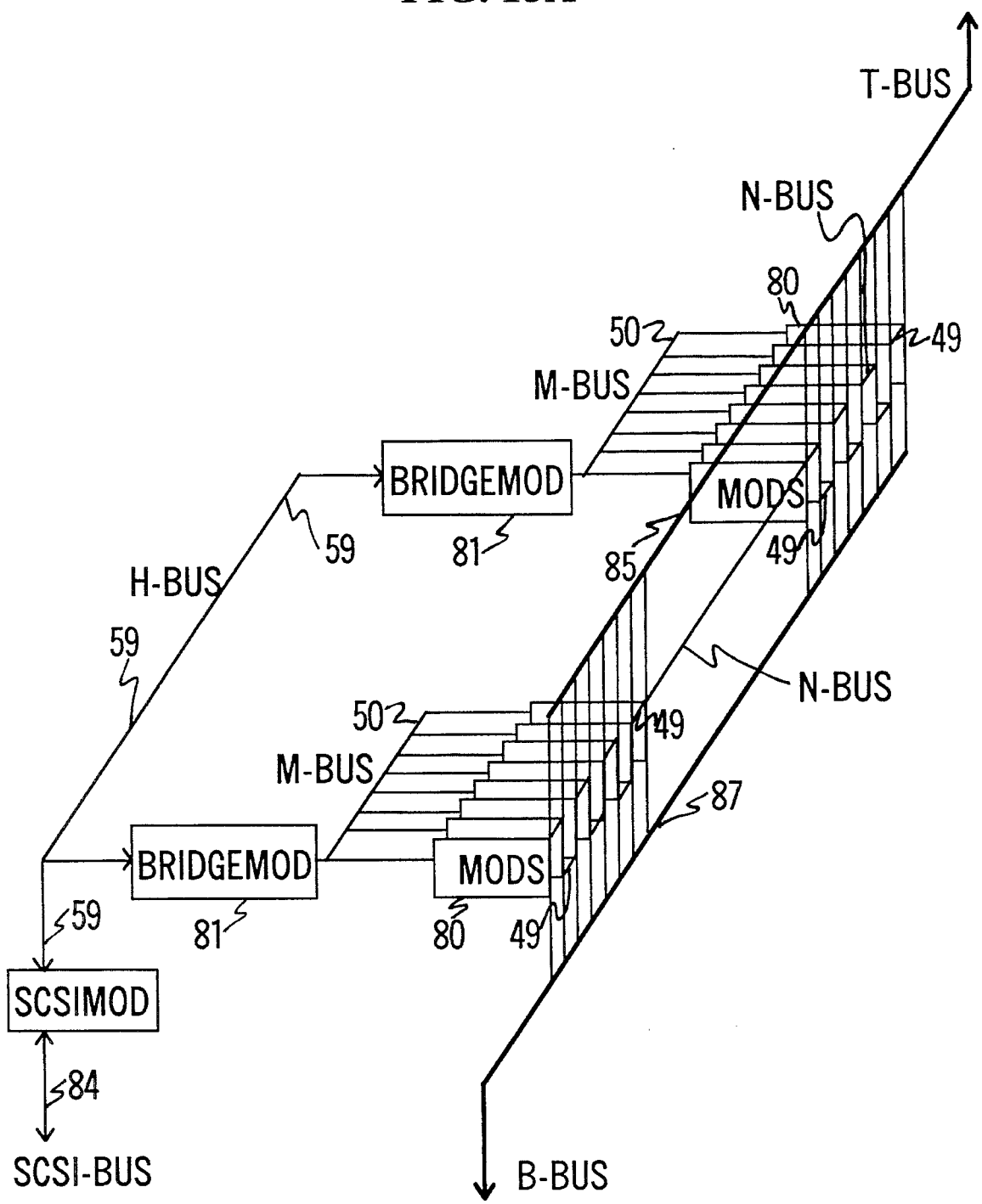
Figure 15B:
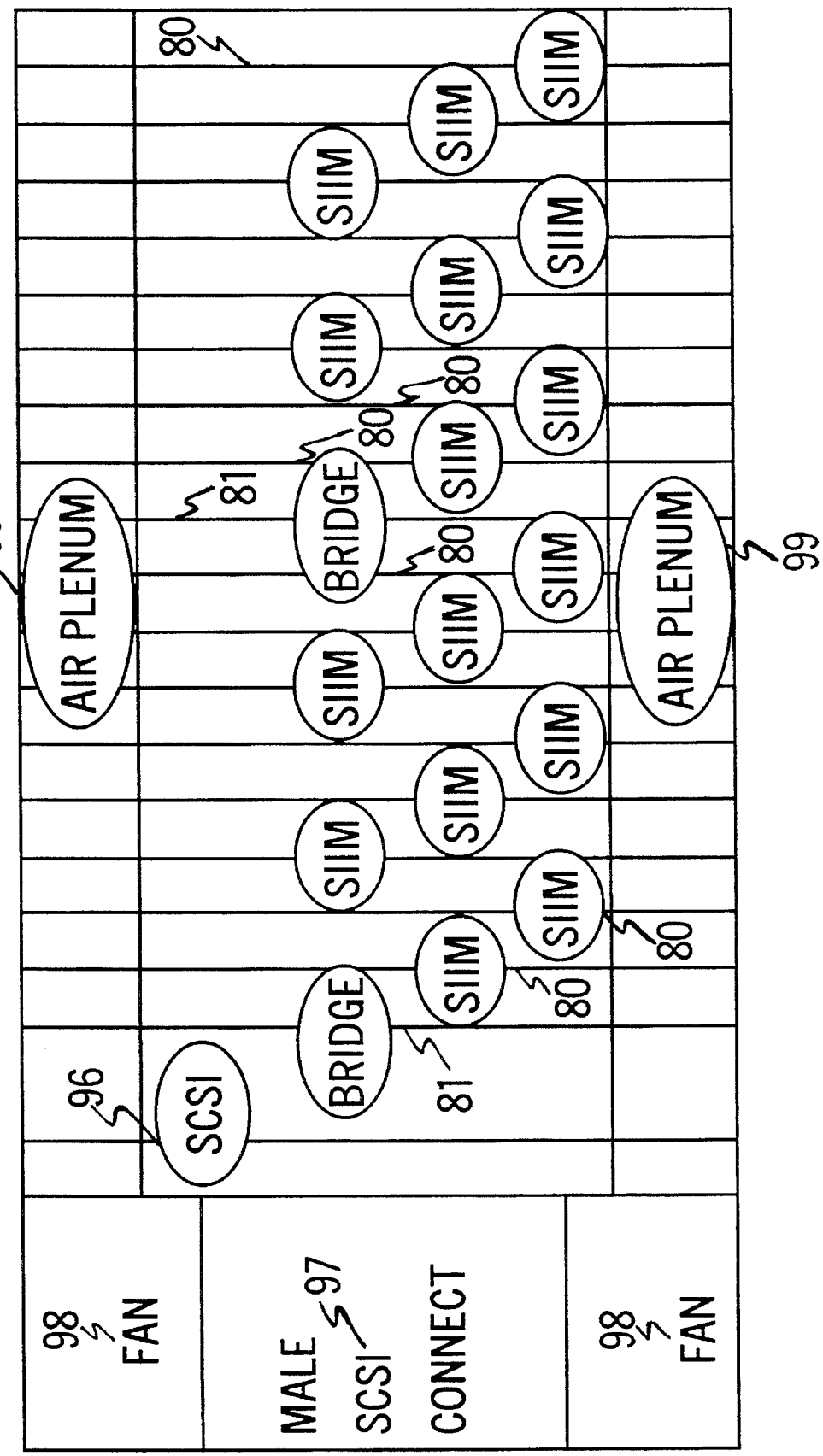

Yet another EPU configuration is the large intelligent operations node or LION. One implementation of the LION is illustrated in FIGS. 15A and 15B. This is equivalent to either the top half or bottom half of the EPU illustrated in FIG. 10, but with a modified repeater module. Referring to FIG. 15A, the EPU interfaces to an external system (not shown) through SCSI interface 96, connected to I/O bus 84. SCSI interface 96 can be a dual SCSI-II I/O controller for high speed communication over I/O bus 84. SCSI interface 96 is preferably implemented as a SCSImod, a module similar to the repmod and with the same form factor as other modules in this system. This architecture can be readily adapted by replacing the SCSImod with module with an interface for another protocol, including ISA, NuBus, VME, and others. Each group or block of DPUs 80 is linked through an M-bus 50 to bridgemod 81, which is linked through H-bus 59 to SCSI interface 96. Each DPU 80 is linked to its nearest neighbor through N-bus 49 and all DPUs 80 are linked together through T-bus 85 and B-bus 87 as described above in detail in relation to FIG. 10. Each DPU may be a SIImod, DSPmod or PGAmod of this invention.

The EPU is preferably configured as a motherboard with 20 slots and 20 corresponding connectors. The connectors can be SIIM module connectors, as described above. This configuration allows an overall form factor of 5.75" wide× 7.75" deep and 1.65" high, (146×197×42 mm) the same as a conventional 5.25" (13.3 cm) half-height disk drive. The motherboard includes a male SCSI connector 97, dual fans 98, and dual air plenums 99 to control the temperature in the LION.

Figure 15D:
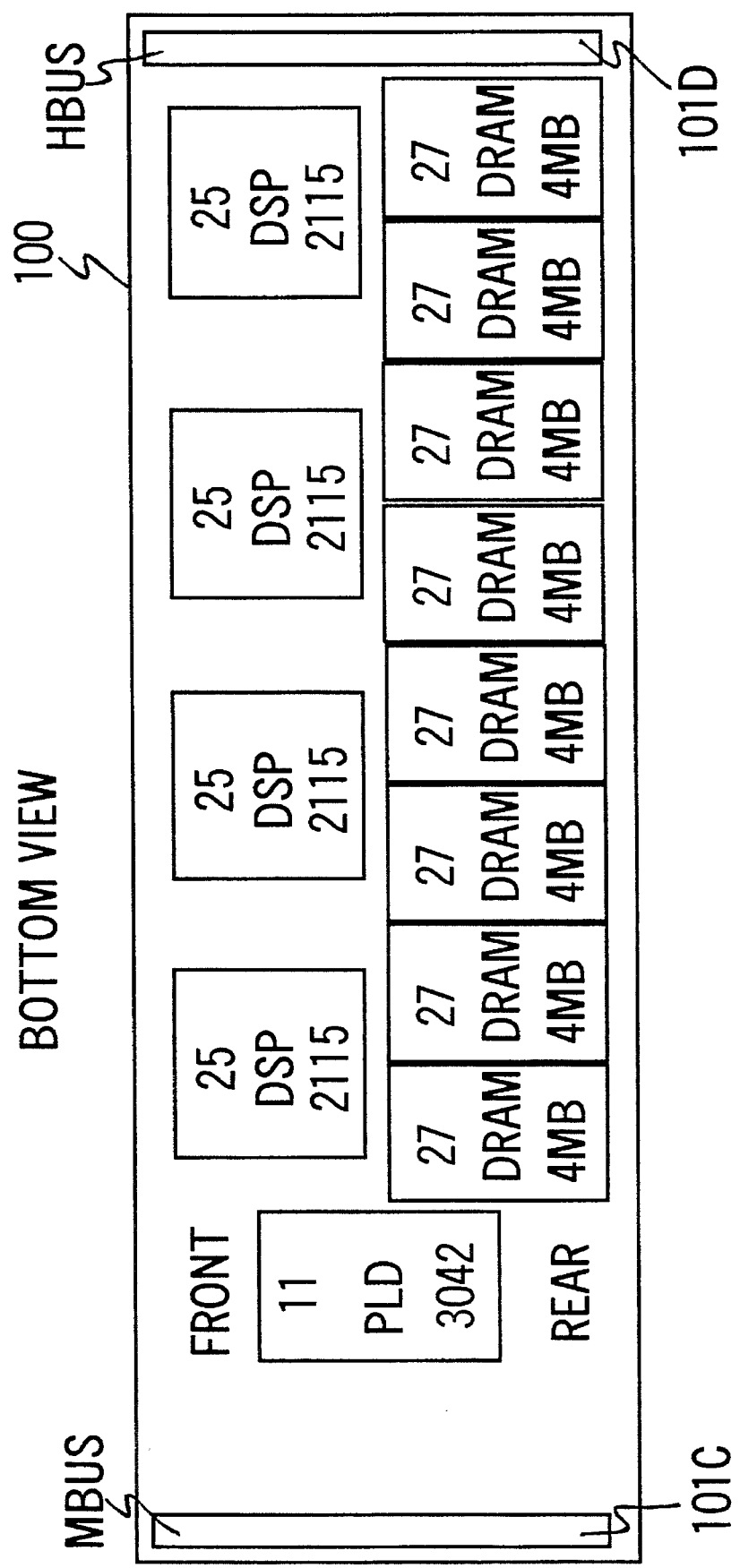
Figure 15E:
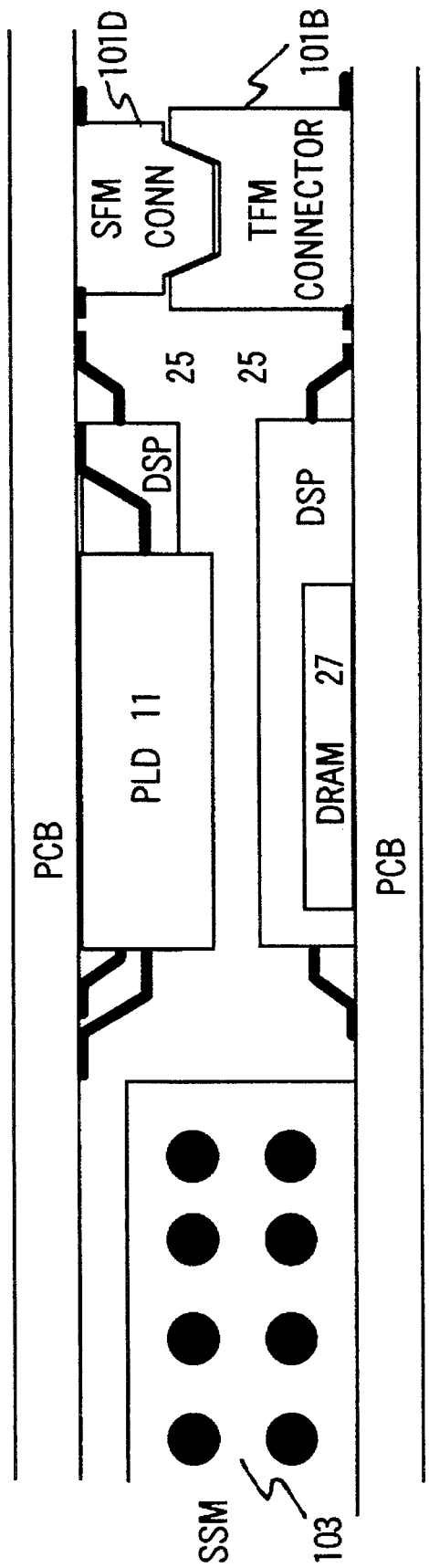
Figure 15F:
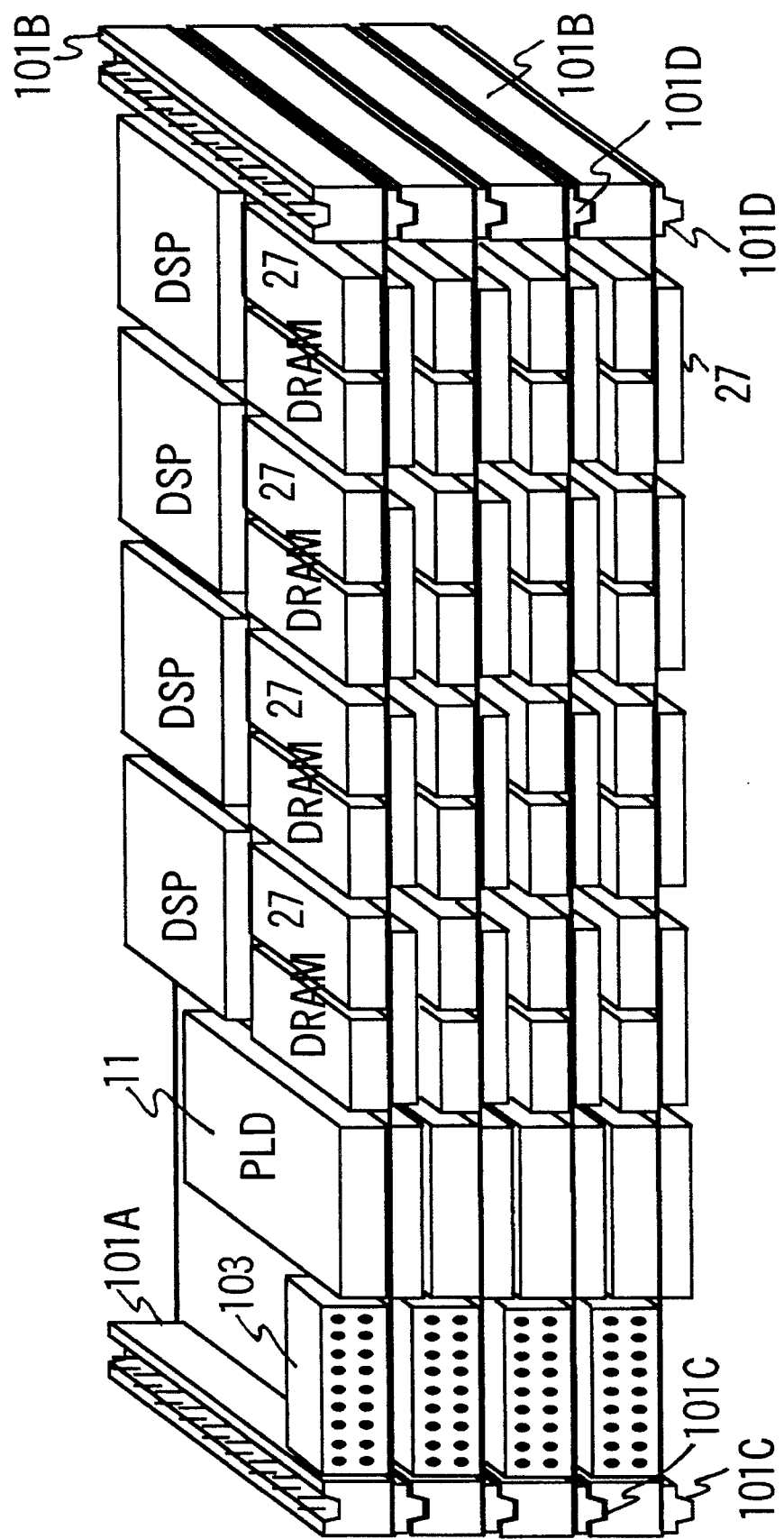
Figure 15H:
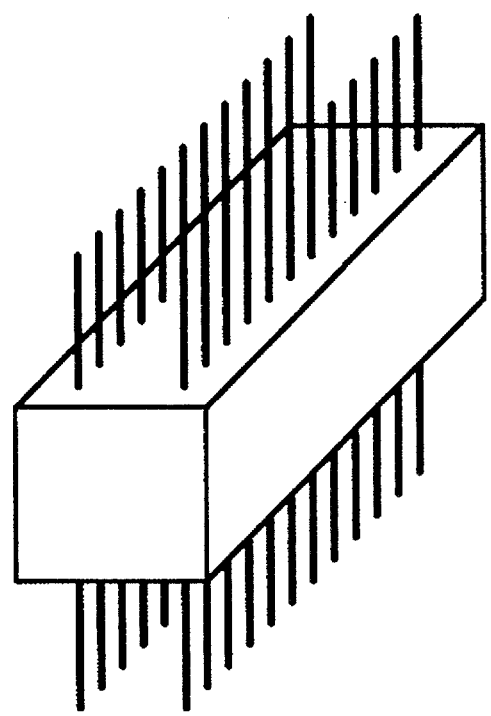
FIG. 15H illustrates a connector.
Figure 15I:
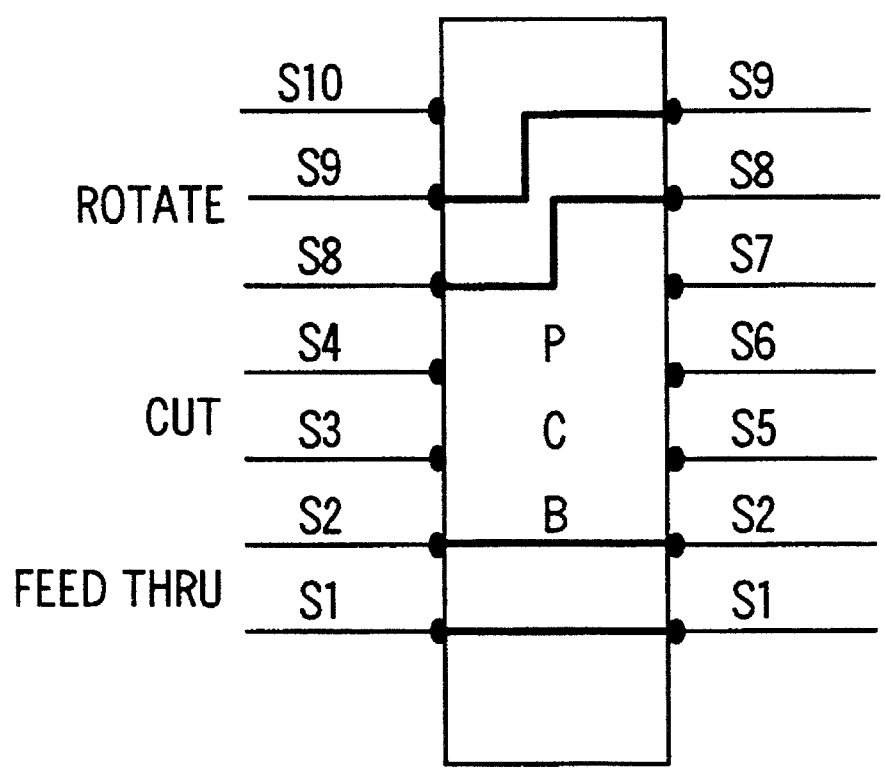
FIG. 15I illustrates possible routing of lines between connectors on the top and bottom, respectively, of a PC board for auto bus programming.

An alternative implementation of an EPU is shown at approximately full scale in FIG. 15C. Module board 100 is fitted on each of the right and left top sides with a connector 101A, preferably a 50 pin connector on 0.05"×0.05" centers. One useful connector is SAMTEC TFM-1-25-02-D-LC. It is convenient to carry M-bus lines 50 on one connector and H-bus lines 59 on the other connector, with some N-bus lines 49 in each connector. Referring to FIG. 15D, the bottom side of board 100 is fitted with a corresponding, mating connector 101B which is also a 50 pin connector but which can mate with the connectors on top of a second such module. One useful connector is SAMTEC SFM-1-25-02-DLC. Signals for H-bus, M-bus and N-bus between modules can be directed through these connectors. Thus many modules can be stacked top-to-bottom to form an array or EPU. In addition, board 10 is fitted with a right angle, 20 pin female connector 102 on 0.10"×0.10" centers for connection to a T-bus. One useful connector is SAMTEC SSM-1-10-L-DH-LC. A similar connector 103 is provided at the bottom of the board for connection with the B-bus. Either of connectors 102, 103 can be connected to a standard ribbon cable for connection to a remote device. In addition, by using a suitable connector, connector 102 on one module can be fitted to connector 103 on a second module. A three dimensional array of modules can thus be assembled and highly interconnected. The connections allow significant space between modules which is sufficient in many applications to allow heat dissipation by convection without need for a fan or other forced cooling. See FIGS. 15E and 15F.

Adjacent modules may be connected in a variety of ways. A motherboard can be fitted with sockets for each module, such as the AMP822021-5 described above in relation to FIG. 2C, and each socket can be hardwired to other sockets. Alternatively, a number of connection methods allow a compressible, locally conductive material to be squeezed between PC boards to establish conductive communication between local regions of the boards. One such device is described in U.S. Pat. No. 4,201,435. The connectivity of each PC board can be important. A typical PC board has a series of pads on an edge, designed to be fit into a socket or connected through a compressible conductor. In many PC boards, a set of pre-manufactured pads on one side of the board connect directly to corresponding pads on the opposite side of the board. This facilitates passing signals through a uniform bus but can be a problem for the configurable bus of this invention. A better design provides pads on each side of a PC board which can be individually connected, preferably to the PLD of a module. A PLD can then pass a selected signal straight through between back-to-back pads, e.g. left-3 to right-3, it can individually address each pad, effecting a break in the bus, and it can redirect a signal which comes in, say at pad left-3, to continue through a nearby pad, e.g. right-4. A sequential shift of signals can be used to rotate a control line as signals pass along a series of modules. For example, an eight-bit bus may be allocated with one line per module among eight modules. Therefore a signal which is on line 0 for the first module will be on line 7 of the second module and line 6 of the third module. At the same time, the signal which was originally on line 1 for the first module is on line 0 for the second module, and the signal which began on line 2 of the first module is on line 0 of the third module, so each module need only rotate signals passing through this bus but monitor the condition only of a selected position, e.g. line 0.

Configurable Buses

The configurable bus of this invention is a powerful tool, providing flexible communication within an adaptive architecture device. Each line of a bus connecting at least two PLDs can be assigned a different function at different time points, changing infrequently or frequently, even several to several hundred times per second. This allows highly flexible communication between devices. Hardwired lines between a socket and a PLD be configured to accommodate different signals for the same pin position on different parts. In addition, future devices will include programmable pin assignments for memory and other devices.

In one configuration, a bus can be configured to consist mostly of data lines, to transfer large amounts of data. In another configuration, each of several devices may be assigned a unique bus line, providing asynchronous communication between devices to, for example, signal interrupts or bus requests. In general, it is preferable to include a clock line and a reset line between each device. This may be part of a configurable bus or, preferably, it may be a designated separate line to each device.

A bus protocol can be similarly modified according to the programming of each PLD device. These protocols may need to interface with existing bus protocols for communication with external devices or may be optimized for internal communication. An initial bus protocol and bus configuration are generally loaded along with an application and may be reloaded or modified under control of an application.

A few representative bus architectures and protocols are discussed here but the possible varieties are almost limitless. Referring to FIG. 16, each DPU 80 has one or more buses of many lines each. A typical DPU of this invention is connected to three such buses, an M-bus, an N-bus and an internal L-bus (see FIGS. 5–7 and related discussion). Each bus preferably has 20 lines, each connected to a pin on DPU 80. These lines for each bus can be allocated independently in a variety of configurations.

Figure 16E:
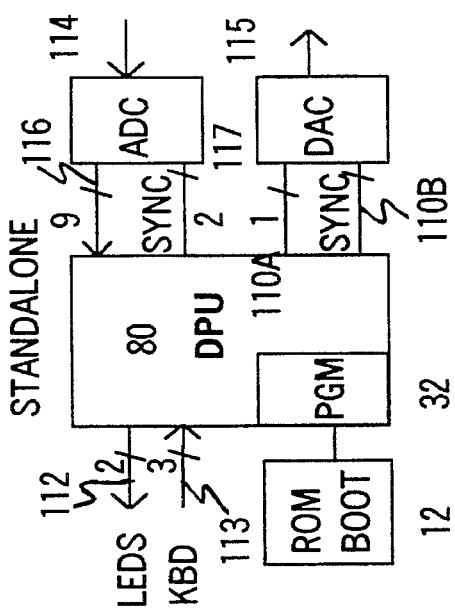
FIGS. 16A, 16C and 16E illustrate several different configurations of buses
Figure 16C:
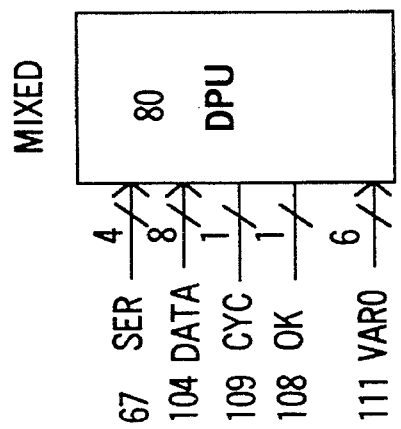
Figure 16A:
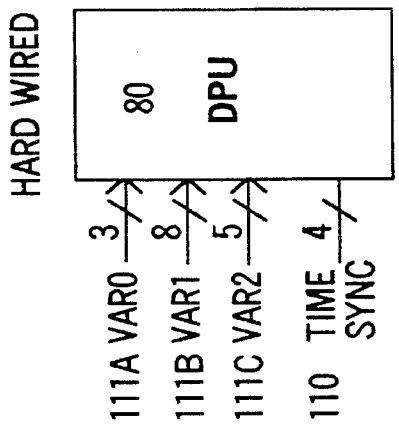

FIG. 16A illustrates one implementation of a standard 16-bit bus. Sixteen (16) lines 104 are allocated as data lines. Additional lines are assigned as single-function lines for address signal AS 105, read signal RS 106, write signal WS 107 and an OK or acknowledge signal 108. A PLD within DSP 80 configures these lines to connect within DSP 80 to corresponding functions address, read enable, and write enable, and acknowledge, respectively. The corresponding timing diagram of FIG. 16B shows that at to when AS 105 and RS 106 and OK 108 are each high, the remaining bus contents are ignored. After DPU 80 arbitrates for bus control, AS 105 goes low at $t_1$ signalling that an address will follow on data lines 104. As high address (ahi) bits are clocked in at $t_2$, AS 105 stays low, signalling that low address (alo) bits will follow. RS 106 goes low at $t_3$, signalling that a data block follows on data lines 104. One clock later, RS 106 goes high and OK 108 goes low, signalling that data lines 104 now carry one block or a specified number of sequential blocks of valid data. One or more clock ticks later (shown at 15 but possibly many ricks later) OK 108 goes high to acknowledge successful reading and subsequent signals on data lines 104 are ignored. A data block can be chosen to be a specific or a variable size. The read cycle may continue for several clocks but a single clock read is illustrated. At the completion of the read cycle(s), RS goes high. If the data was successfully read, DPU 80 sends an OK signal at time $t_{x+1}$.

An alternative bus architecture is a dual 8-bit bus. Referring to FIG. 16C, 8 lines 104A are allocated to data for bus 0 and 8 lines 104B are allocated to data for bus 1. Single lines are provided for $cycle_0$ line 109A and $OK_0$ 108A for bus 0 and $cycle_1$ line 109B and $OK_1$ 108B for bus 1. The data lines are cycled between address/control signals and data and the cycle line specifies the current state. This could be modified to have several packets of address information, control information or data carded on the data lines. The corresponding timing diagram of FIG. 16D for bus 0 shows that after cycle0 109A goes low at time $t_0$, $data_0$ lines 104A carry address signal AS, write signal WS, read signal RS, and may carry other signals as well. After $cycle_0$ 109A goes high at $t_1$, $data_0$ lines 104A carry data signals, which is confirmed by $OK_0$ 108A-going low. This process is repeated in one clock unit at time $t_2$ and time $t_3$ and so on.

Yet another alternative bus configuration is a set of single line buses. Referring to FIG. 16E, sixteen buses, each comprising a single signal-line 104, can carry 16 signals to 16 sets of locations or other buses. Sync lines 110 are used to assure proper timing. Providing separate sync lines 110 allows signals to travel varying distances and to arrive at DPU 80 at slightly different times. The timing diagram in FIG. 16F shows how a representative signal line, SIGN0 104 carries a packet of signal address bits beginning with high order bit $a_n$ through low order bit $a_0$ between time $t_0$ and $t_2$ (or longer, depending on the protocol followed by a data packet starting with high order bit $d_n$ through low order bit $d_0$ beginning at time $t_2$. This may be followed by more data packets or another address packet immediately or after some delay. Serial transmission of information is well understood in the art and one can readily design a protocol to work with the buses illustrated in this figure.

Figure 16I:
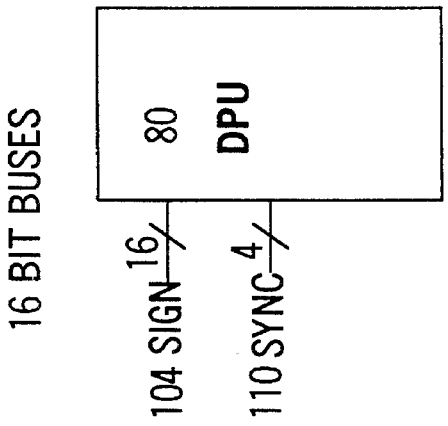
FIGS. 16G, 16H and 16I illustrate several additional configurations of buses.
Figure 16H:
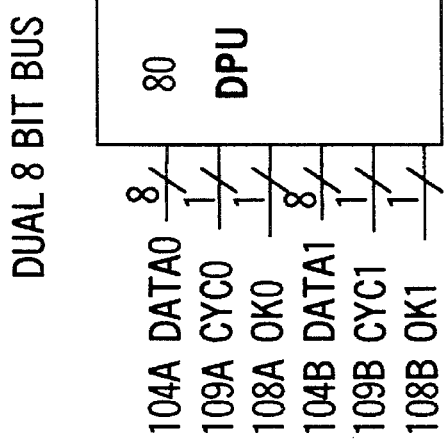
Figure 16G:
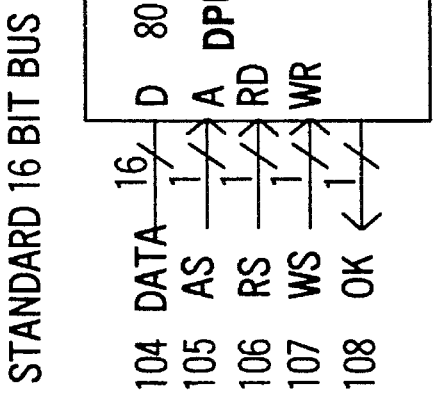

A bus may be partially hardwired, thus not configurable. This is particularly applicable for connections to outside, non-configurable devices such as an ISA bus or SCSI bus or a modem or printer. Referring to FIG. 16G, DPU 80 is connected to a first bus $VAR_0$ 111A of three lines, to a second bus $VAR_1$ 111B of eight lines, and to a third bus $VAR_2$ 111C of five lines. As in the implementation shown in FIG. 16E, four SYNC lines 110 are provided to coordinate data transfer. A bus may be partially hard wired and partially configurable. Referring to FIG. 16H, serial line 67 and $VAR_0$ 111 are hard wired to provide four lines and six lines of communication, respectively, while eight data lines 104, clock 109, and OK 108 are reconfigurable.

Finally, a simple stand-alone device built around the PLD of the invention can make use of reconfigurable buses. Referring to FIG. 16I, program control portion 32 of DPU 80 is connected through a fixed bus to EPROM 12, containing a boot-up configuration and data. An LED readout 112 and keyboard 113 (not shown) are each connected through a fixed bus to DPU 80. Analog to digital converter (ADC) 114 is connected to DPU 80 through 9-line, configurable bus 116 and sync 110A and digital to analog converter (ADC) 115 is connected to DPU 80 through single-line, configurable bus 117 and sync 110B.

Another protocol, not illustrated, allows for absolute time to be known by essentially all devices in a system. The individual clock counters are reset, for example when the system is powered up, and some or all commands are expected to occur at a specified time. Devices then simply read or write a bus at the designated time. This obviously has the potential for great complexity but also may offer significant speed benefits, eliminating the need for bus arbitration, address packets, control packets and so forth.

The bus protocol can be allocated according to need under the control of a compiled host program, possibly with modification by specific application C code instructions. In general, all buses share a Clock-Line and a Reset-Line. Bus configuration and protocol data is preferably downloaded when the application is first loaded and may be reloaded under control of the application. Reconfiguration data can be loaded in less than about 10 milliseconds. In order to address each DPU directly, each DPU can be assigned an address based on a physical slot or relationship within the system. DPUs can be provided with registers and internal memory holding an offset address. DPUs may store and forward packets of data as needed.

The configurable bus offers significant benefits in terms of flexibility but it comes at a cost. The configurability allows implementation of large combinatorial logic functions, useful for rapidly solving complex branch or case tests, such as can currently be done only by designing a specific circuit, typically as an ASIC. Execution of complex logic can be performed considerably faster than on a general purpose computer, but not as fast as on a true ASIC. However, the configurability means that the new device can function as one ASIC for a period of time, then be quickly reconfigured to function as a different ASIC. New generations of PLDs will have faster circuits and will reduce this speed difference considerably, although it is unlikely that a fully reconfigurable circuit will be 100% as fast as a custom designed circuit fixed in silicon.

Using the Modules

The modules and EPU described above can be configured to run one or more programs. A complex program may require many such signals, and can consume a large portion of valuable, available circuit area and resources. A reconfigurable device could allocate resources for signals only as needed or when there is a high probability that the signal will be needed, dramatically reducing the resources that must be committed to a device.

Certain operations run better in specific hardware. For a conventional CPU with cache memory, registers and ALUs, these operations include data manipulation such as arithmetic functions and compares, branch and jump instructions, loops, and other data intensive functions. Other operations are more easily handled in special hardware, such as ADC, DAC, DSP, video frame buffers, image scanning and printing devices, device interfaces such as automobile engine sensors and controllers, and other special purpose devices.

Stream Splitter - Compiling Algorithmic Source Code

Conventional programming for a general purpose computer begins with a program written in any one of several suitable computer languages, which is then compiled for operation on a certain machine or class of machines. Programming in assembly language gives the programmer detailed control over how a machine functions but such programming can be very tedious. Most programmers prefer to write in a relatively high level language.

The present device provides a greatly enhanced library of functions available to a computer program. Essentially, a conventional source code program can be converted in whole or in part into a series of specialized circuit configurations which will use the same inputs or input information to produce the same result as the conventional program running on a conventional computer but the result can be provided much faster in many cases. A wide variety of functions can be implemented in hardware but can be accessed by a subroutine call from a main program.

Where a conventional programmer might code to initialize two variables, then add them, a general purpose CPU must allocate memory space for the variables, at least in a register, then load an adder with the numbers and add the values, then send the result to memory or perhaps to an output device. Using a DPU, a PLD can be configured to add whatever is on two inputs, then direct the result to an output. For this simple operation, a DPU may not provide a significant improvement in ease of calculation in comparison to a conventional computer.

The benefit of a DPU can be considerably greater when the desired operation is more complex. For example, pixel information may be provided in one or more bit plane formats and may need to be converted to another format. For example, the input may be a raster image in a single plane, 8 bits deep. For certain applications, this may need to be converted to 8 raster image planes, each 1 bit deep. The first bit of each pixel word needs to be mapped to a first single-bit plane pixel map, the second bit to the second single-bit plane pixel map, and so on, to give eight single-bit plane pixel maps which correspond to the original 8-bit plane. It is relatively simple to configure hardware to split and redirect a bitstream according to a certain rule structure. This same method can be modified to combine eight single-bit planes into a single 8-bit plane, to create four two-bit planes, to create two four-bit planes, to mask one bit plane against a second bit plane, and so on.

A particular application may frequently call one of several specific conversions (expected to be called frequently by the program or the user) and call other specific conversions less frequently. A compiler can calculate logic configurations to execute each of the common conversions and load the configurations simultaneously so that any is available simply by selecting the appropriate inputs. If there is limited PLD space available,. configurations can be calculated and stored, ready to be loaded on an as-needed basis. If there is sufficient PLD space available, even the less-frequently called conversions can be resident in a PLD for immediate access when the need arises. By configuring a DPU with equivalent information, each of most or all likely inputs can be processed within a few clock cycles by providing a configuration for each likely input value and then simply activating the appropriate portion of the circuit.

The implementation begins by analyzing an algorithmic language program and convening as much of that program as possible to run on available hardware resources. Many hardware languages are available and known, to varying degrees, by persons skilled in the art. These languages include ABCL/1, ACL, Act I, Actor, ADA, ALGOL, Amber, Andorra-I, APL, AWK, BASIC, BCPL, BHSS, C, C++, C*, COBOL, ConcurrentSmallTalk, EULER, Extended FP, FORTH, FORTRAN, GHC, Id, IF1, JADE, LEX, Linda, LISP, LSN, Miranda, MODULA-2, OCCAM, Omega, Ofient84/K, PARLOG, PASCAL, pC, PL/C, PL/I, POOL-T, Postscript, PROLOG, RATFOR, RPG, SAIL, Scheme, SETL, SIMPL, SIMULA, SISAL, Smalltalk, Smalltalk-80, SNOBOL, SQL, TEX, WATFIV and YACC.

In a preferred embodiment, the C language is used for source. This provides several advantages. First, many programmers use C now and are familiar with the language. Second, there are already a large number of programs already available which are written in C. The C language allows simple implementation of high level functions such as structures yet also allows detailed manipulation of bits or strings, down to machine code level. The C language, especially with some simple extensions, is also well suited to object-oriented programming, which also works well with the present invention. Third, the C language is now so widely used that many translators are available to translate one language to C. Such translators are available for FORTRAN and COBOL, both popular languages, and translators exist for other languages as well. For convenience, the C program will be used as an example, but one skilled in the art will recognize how to apply the teachings of this invention to use other algorithmic languages.

The method includes four sequential phases of translation, a tokenizing phase, a logical mapping phase, a logic optimization phase, and a device specific mapping phase. Current compilers tokenize source code instructions and map the tokenized instructions to an assembly language file. For instructions written in hardware description languages, there are logic optimization routines, but there are no current methods to convert algorithmic source code into a hardware equivalent. Source code instructions suitable for implementation in a PLD include a C operator such as mathematical operators (+, −, *, /), logical operators (&, &&, ||), and others, a C expression, a thread control instruction, an I/O control instruction, and a hardware implementation instruction.

A programmer begins by preparing a program for a problem of interest. The program is typically prepared from C language instructions. The basic program functionality can be analyzed and debugged by traditional methods, for example using a Microsoft C compiler to run the program on an MS-DOS based platform. This same C code, possibly with some minor modifications, can be recompiled to run on a configurable architecture system.

Figure 17:
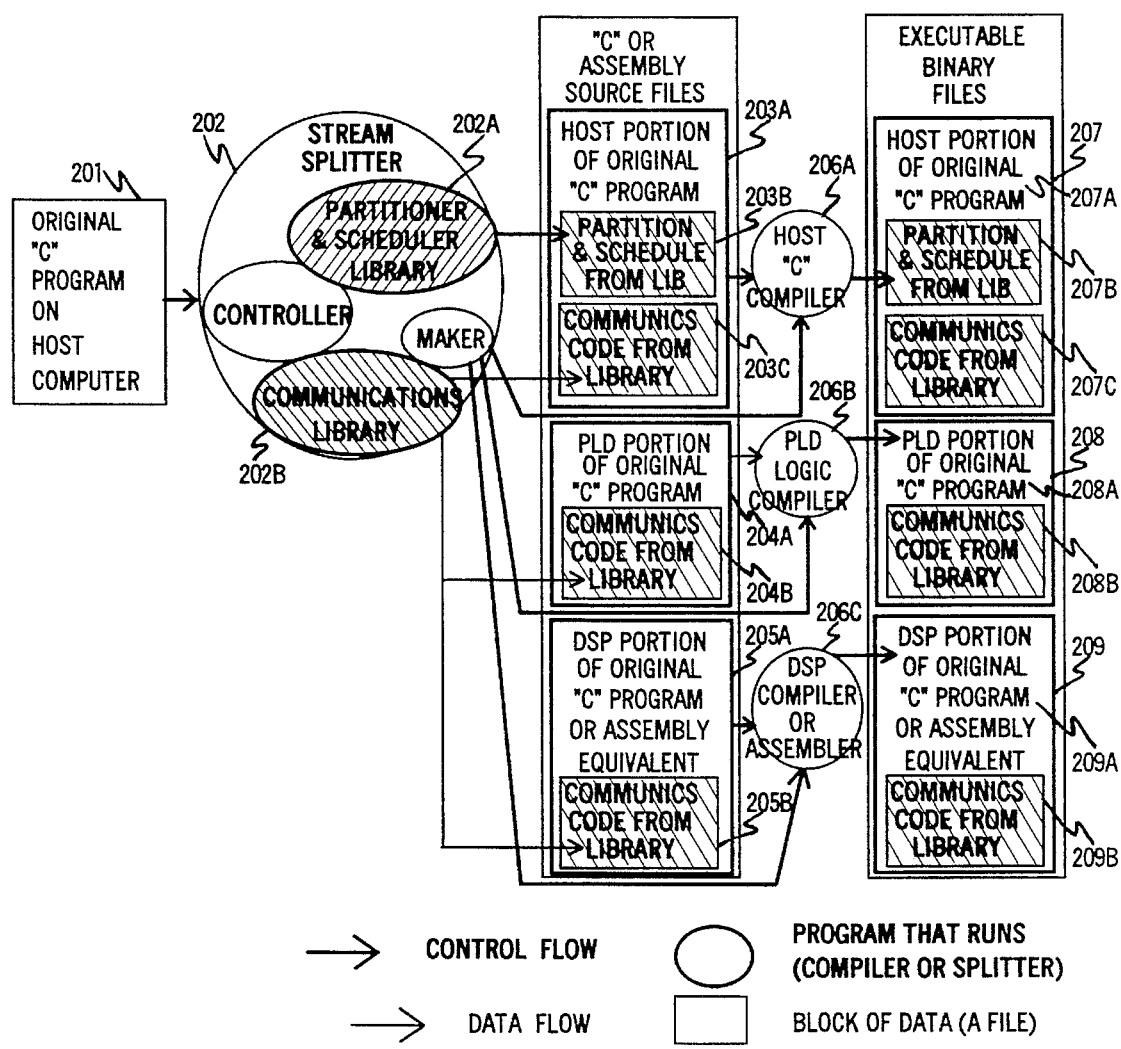
FIG. 17 illustrates the components and process of stream splitting.

The stream splitter separates C instructions in program source code in order to best implement each instruction, allocating each instruction to specific, available hardware resources, e.g. in a DPU, or perhaps allocating some instructions to run on a host or general purpose computer. Referring to FIG. 17, stream splitter 202 splits C program source code 201 into portions: host C source code 203 that is best suited to run on a host CPU; PLD C source code 204 that is best suited to run on a PLD of this invention; and DSP C source code 205 that is best suited to run on a DSP. Compilation requires library routines are available to provide needed resources, especially pre-calculated implementations for certain C instructions and partitioners and schedulers to manage intermodule control flow. Partitioner and scheduling resources 203B are added, as needed, from partitioner and scheduler LIBrary 202A to host C source code 203A to coordinate calls to other portions 204, 205 of the C code which will be implemented in hardware. Communications resources 203C, 204B and 20511 are added to C source code portions 203, 204, and 205, respectively, from communications LIBrary 202B, as needed, to provide needed library resources to allow the system resources to interact once compiled and implemented in the system. Host C compiler 206A combines and compiles host C source code 203A, partitioner and scheduler resources 203B and communications resources 203C into executable binary file 207 and corresponding portions 207A, 207B and 207C. PLD C compiler 206B combines and compiles PLD C source code 204A and communications resources 204B into executable binary PLD configuration file 208 and corresponding portions 208A and 208B, respectively and DSP C compiler 206C combines and compiles DSP C source code 205A and communications resources 205B into executable DSP code 209 and corresponding portions 209A and 209B, respectively.

PLD code must ultimately operate on PLDs within the system and preferably includes configuration data for each PLD and for each configuration required to operate the system. PLD C source code must be translated or compiled to configuration data 208 useable on a PLD. One or more configurations must be prepared for essentially each PLD needed to operate a selected program, although not all programs will require all of the PLDs available in a given system. In general, configuration data must be provided for repmod, bridgemod and DPU PLDs, including PGAmod PLDs. For Xilinx parts, the C source code must be translated to a .BIT file, possibly through an intermediate compilation to .XNF format. DSP code must ultimately operate on DSPs within the system and preferably includes configuration data for each DSP and for each configuration required to operate the system. DSP C source code must be translated or compiled to executable machine code 209 for a DSP. Manufacturers of DSPs typically provide a language and compiler useful in generating DSP machine code. DSP C source code 205A may be translated into an intermediate form before compilation into final machine code 209.

Figure 19:
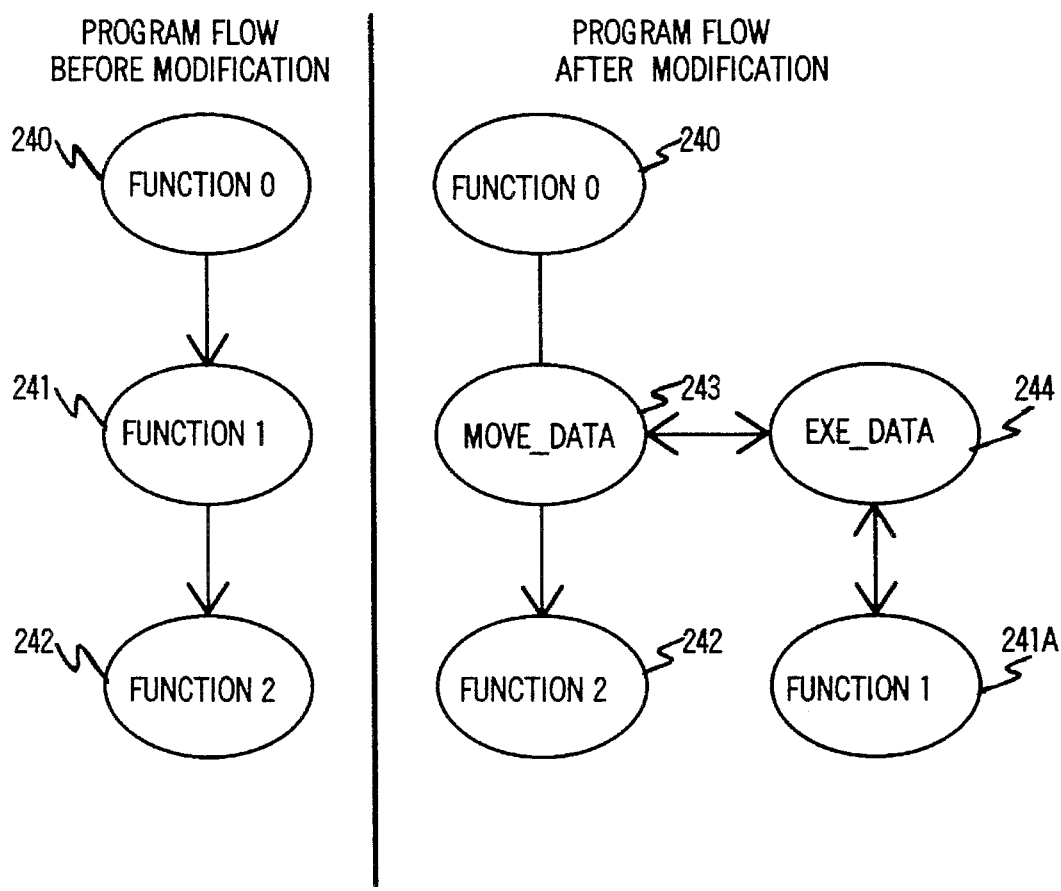
FIGS. 19A and 19B illustrate program flow of an algorithmic source code program before (19A) and after (19B) applying the stream splitter.

The result of stream splitting is illustrated in FIG. 19. An original C source code program 201 may contain a series of three sequential function calls, function 0 240 followed by function 1 241 and function 2 242. When executed on a general purpose computer, each function is executed one at a time in order. Each function may be quite simple, such as add two numbers, or may be quite complicated, such as convert a single 8-bit plane raster image to four two-bit plane raster images and mask (XOR) the first two-bit plane image against the sum of the second and fourth two-bit plane images. If function 1 241 can be implemented more efficiently on hardware, the stream splitter can analyze, convert and compile that function to run as function 241A on a hardware resource such as: a DPU and simply insert a MOVE DATA command 243 into the execution stream of the host program, coupled with an EXECUTE DATA command 244 on the DPU. If function 1 does not return any value and function 2 does not depend on the result of function 1, or if function 2 does not need the result of function 1 and function 2 will take longer to execute than will function 1, then program control can pass immediately to function 2 242. Alternatively, if function 1 does return a value needed by function 2 then function 2 can wait for execution to complete. During execution, parameters needed by function 1 are passed to the DPU(s) holding function 1 via DPU bus connections. Functions, whether on the host or on a DPU, may call one or more other functions, each of which may be on the host or the same or another DPU.

The stream splitter is especially useful for automating data flow for: parameters passed and returned; global variables; and global arrays. Useful libraries in partitioner and scheduler LIBrary 202A and communications LIBrary 202B include: scheduling heuristics, libraries and templates; data conversion utilities; DMA; and FIFOs.

A particular function is preferably implemented within a single PLD but larger algorithms can be partitioned between multiple PLDs and even between multiple DPUs. An arbitrarily large algorithm can be implemented by providing enough DPU modules.

Figure 20:
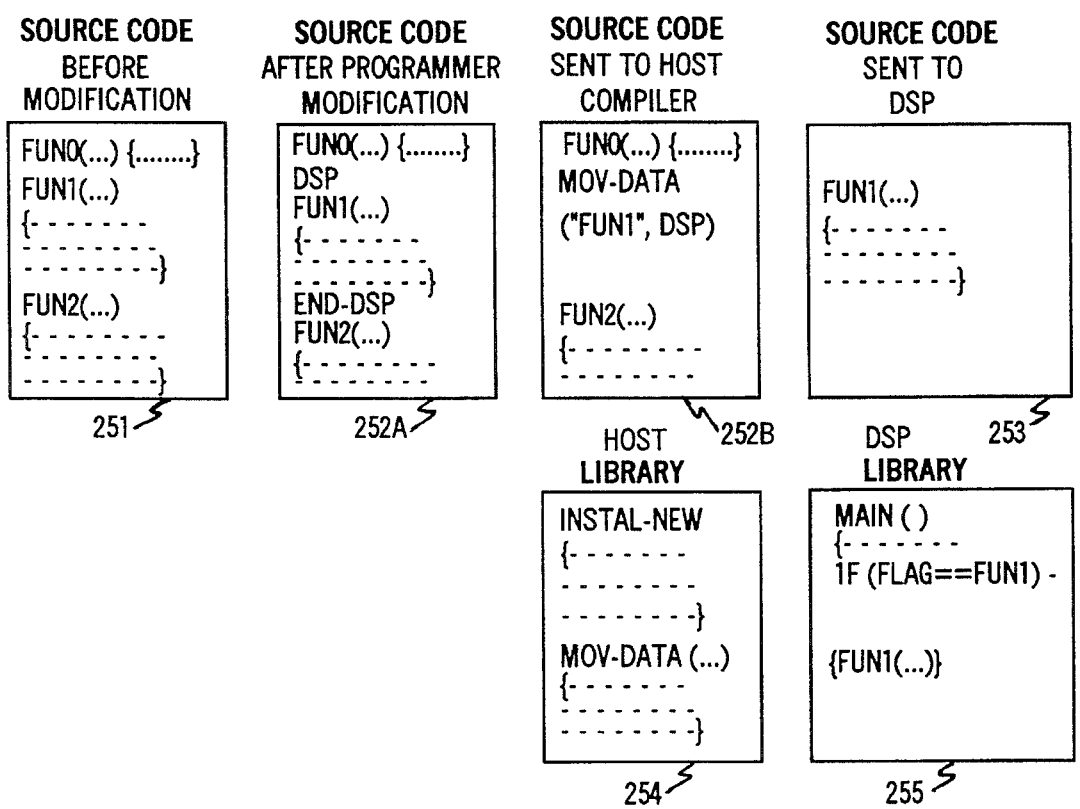
FIG. 20 illustrates the program code resident on the host before and after applying the stream splitter.

Referring to FIG. 20, the conversion of original source code to partitioned functions can be better understood. Standard C source code 251 can be modified by a programmer to include compiler instructions to partition certain functions into select hardware resources. Modified source code 252 includes "DSP" and "END-DSP" commands around "fun1 {. . . }" to instruct the compiler to implement this function as a DSP operation. A precompiler partitions code 252A into host code 252B (equivalent to 203A in FIG. 17) with a "MOV-DATA; ("fun1",DSP)" call inserted in place of the original function code. That function code is partitioned into DSP code 253 (equivalent to 205A in FIG. 17). The source code is supplemented by host source library routines 254 and DSP library routines 255. Additional code (not shown) is required to establish communication between the host and the DSP.

Figure 21:
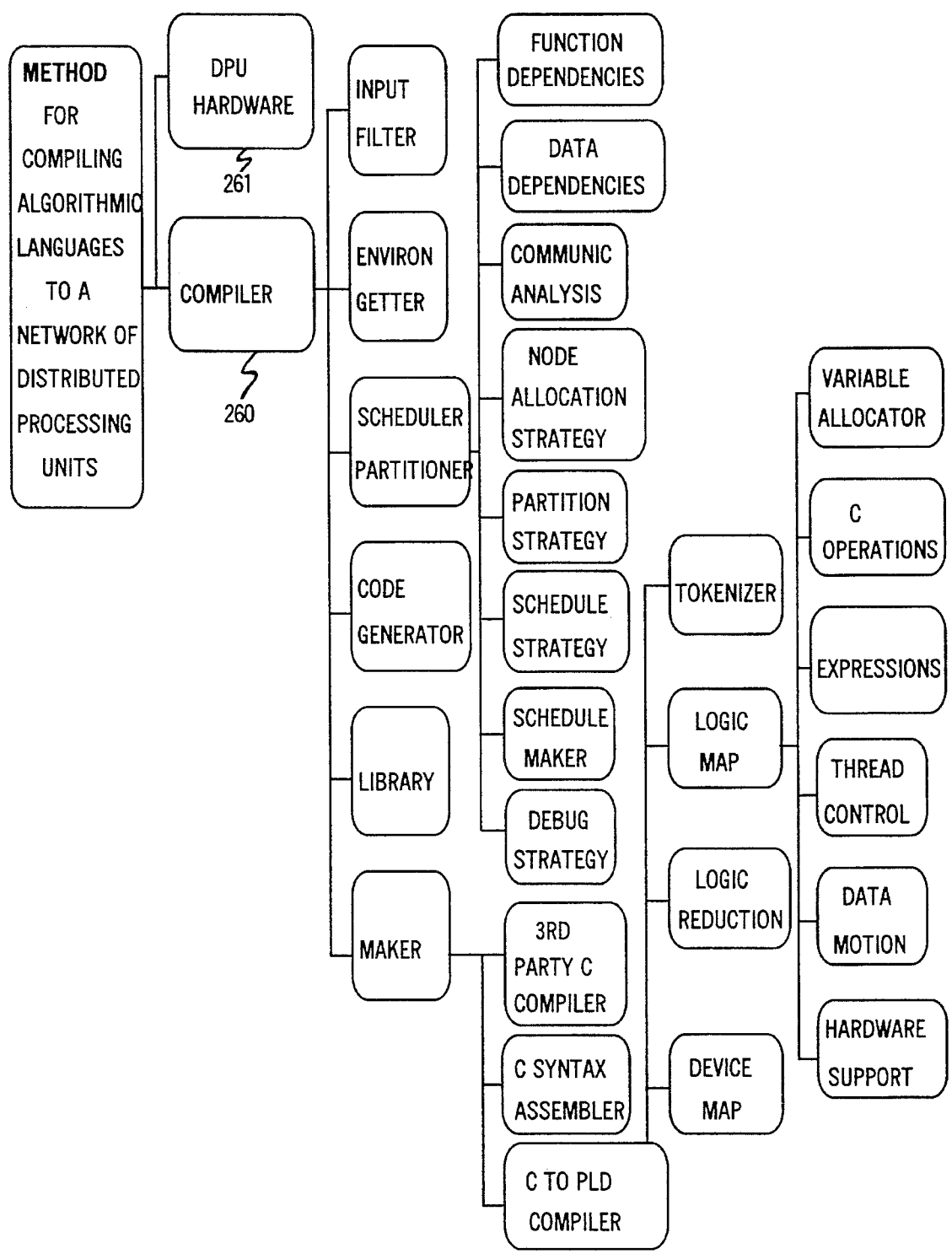
FIG. 21 illustrates major elements of the steam splitter libraries and applications.

The method of compiling is illustrated in FIG. 21. Referring to FIG. 21, given a specific configuration of DPU hardware 261, compiler 260 applies an input filter, then collects data on the environment, including the DPU hardware configuration and available resources, capacities and connectivity. The scheduler-partitioner contains information on function and data dependencies, communication analysis, plus node allocation, partition, schedule and debug strategies and schedule maker constraints. The code generator and library provide additional resources for the maker to convert C source code using a third party C compiler plus an enhanced C syntax analyzer and C to PLD compiler to first tokenize the input source code, then prepare a logic map including variable allocation, C operators, expressions, thread control, data motion (between components and functions) and hardware support. The logic map is then evaluated for possible logic reduction and finally mapped to the available devices, as needed.

Figure 22:
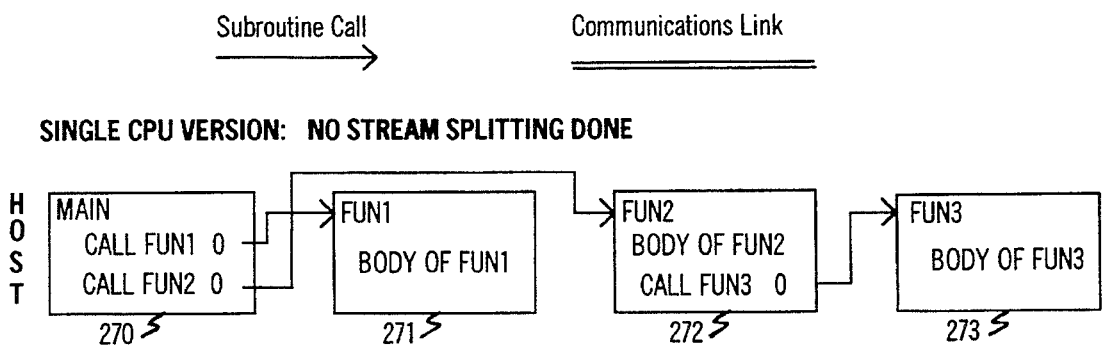
FIG. 22 illustrates the location and program/time flow for a program running on several modules without stream splitting.
Figure 23:
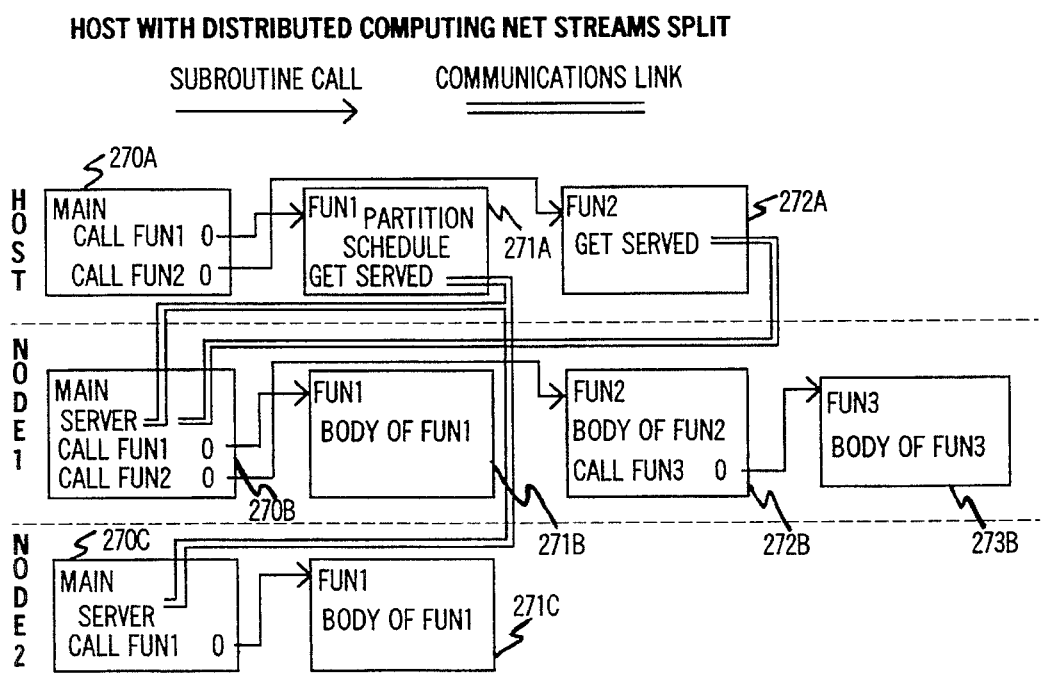
FIG. 23 illustrates the location and program/time flow for the program of FIG. 22 split to run on three modules and the host.

The present system allows a linear program to be pipelined in some cases. FIG. 22 illustrates a traditional single CPU, general purpose computer with a main program 270 which calls function 1 271, waits for execution, then calls function 2 272, which in turn calls function 3 273, which completes execution, function 2 completes and passes control back to main program 270. By way of comparison, FIG. 23 illustrates the same program implemented in a distributed system. Assuming function 1 is amenable to partitioning (e.g. remapping a bit plane—half of the plane can be assigned to each of two processors), the program can work that much faster. Main program 270A on the host system again calls function 1 271A but 271A calls servers 270B and 270C, each of which call corresponding function 1 portions 271B and 271C. When execution is complete, the servers notify host function 1 271A, which notifies main program 270A and 270A calls function 2 272A. Depending on the interrelation of function 1 and function 2, function 2 may be callable before function 1 is completed. Function 2 272A calls server 270A which calls function 2 272B, which in turn calls function 3 273B. When 273B and 272B have both completed, control is passed back all the way to host main program 270A.

Figure 24A:
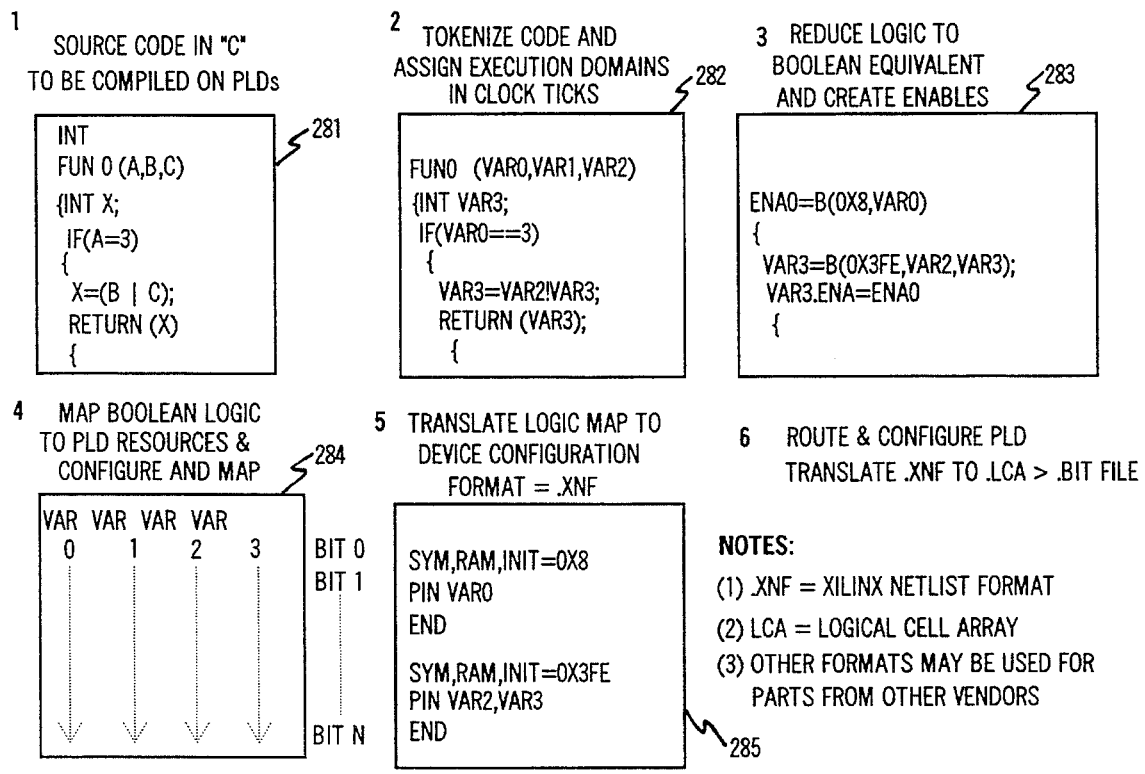

The process of convening C source code to a device configuration is illustrated in FIG. 24. Briefly, source code 281 is tokenized, converting variable names into generic variables, and analyzed for time dependencies where one operation must follow another but still another operation can occur simultaneously with the first. The tokenized code 282 can be assigned in execution domains segregated by sequential clock ticks. The logical components of tokenized code 282 are reduced to Boolean equivalents and enables are created in intermediate code 283. These Boolean equivalents are then mapped to PLD and DSP resources 284 for specific devices in the system. The logic map is converted to a device configuration format 285 appropriate to the device being mapped, then the PLDs necessary for communication and other support functions are configured and all intermediate logic descriptions such as .XNF files are converted into binary, executable files, e.g. .BIT files for Xilinx parts. Some mapping strategies are listed in FIG. 24.

Several different descriptions and implementations of simple Boolean flow through operations are illustrated in FIG. 25. The name of each of four functions, e.g. Inverter, are accompanied by a text description of the function, a logic equivalent, C source code, and the CLB equation which will implement the function. For example, an Inverter yields "For each bit of A if AN is 1, then $B_N=0$, else 1." The C source code equivalent is "b=~a" and the CLB function (for .XNF coding) is $a_N=b(1,a_N)$. These operations do not depend on the clock state and large numbers of the operations can be evaluated asynchronously or even simultaneously. One limit is when a function is self referencing (e.g. "a=a+1") there should be an intervening clock tick.

Figure 28A:
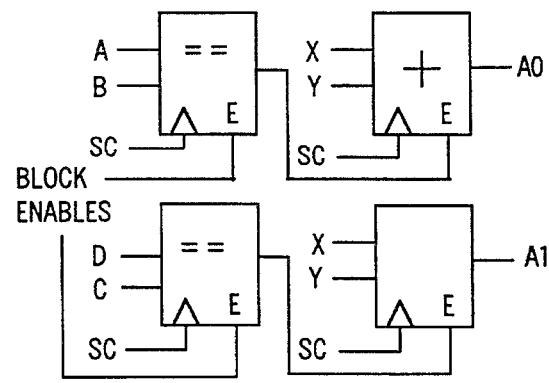
FIGS. 28A, 28B and 28C illustrate implementation in a DPU of conditional statements.
Figure 28B:
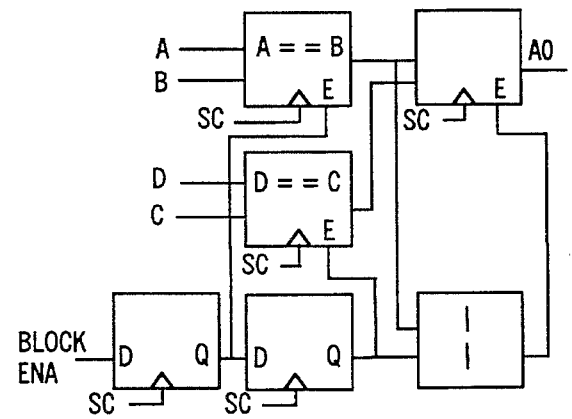
Figure 28C:
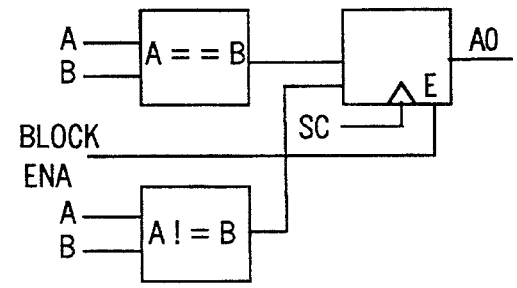
Figure 29:
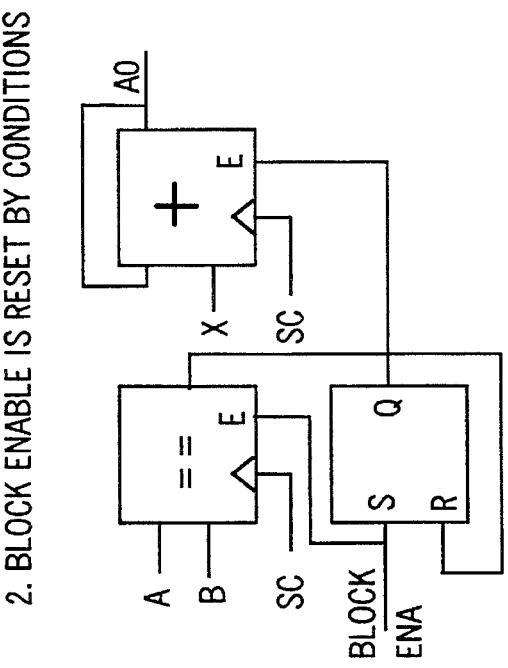
FIG. 29 illustrates implementation in a DPU of a conditional (while) loop and a for loop.
Figure 30:
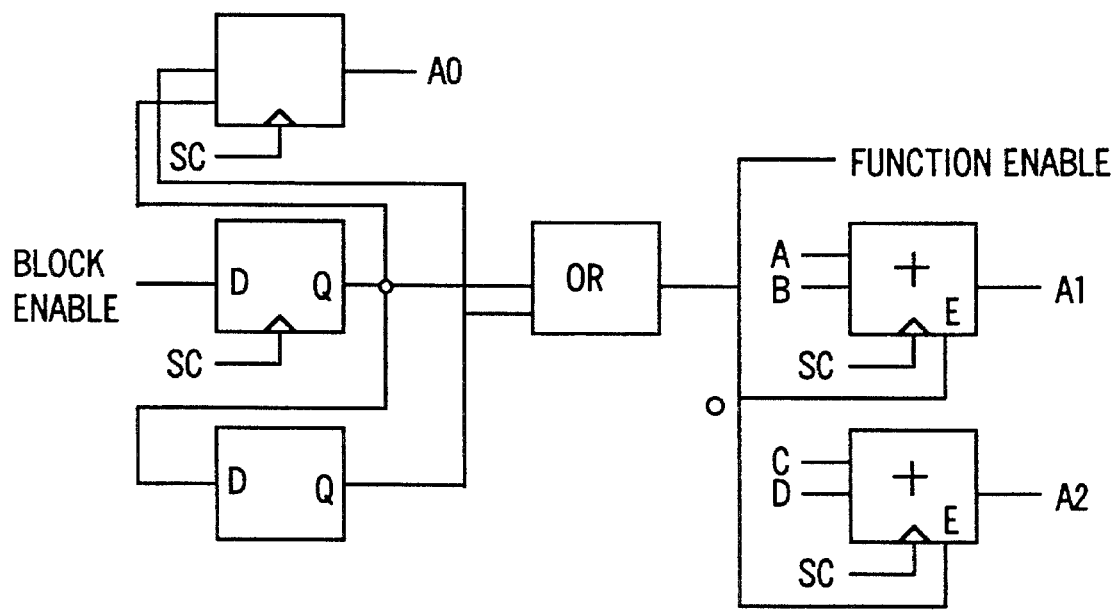
FIG. 30 illustrates implementation in a DPU of a function call and function definition.

State operations can also be implemented easily. Referring to FIG. 26, a latch, counter and shift register are described, diagrammed and shown in equivalent C code, CPU opcode and CLB equations. These concepts can be combined to evaluate logic. Referring to FIG. 27A, many logical instructions be implemented in a single step, when possible. Referring to FIG. 27B, logic reduction can simplify the logic that must be mapped and can also take out unnecessary time dependencies. However, if a variable must take on different values at different times, each logical device can drive a single multiplexer so that variable can always be found at the output of the MUX. FIGS. 28, 29 and 30 illustrate additional examples of logic that can be implemented, reduced and operated using the teachings of the present invention.

System Improvements

Program execution in a traditional C program on a general purpose computer involves incrementing a program instruction counter for each subsequent operation. Each C instruction is converted to a step of an variable but determinate number of machine instructions. There is only one counter in a typical machine, so only one operation can be conducted at a time. The result is that a very powerful machine must wait for each incremental step to be completed but each operation uses only a small portion of the resources available in the machine.

After C instructions are converted to hardware functions, many functions can operate without waiting for a previous operation to complete. Since many hardware functions can operate simultaneously, it is desirable to operate the maximum number of functions possible at any time. Each function or C operation can be considered as a chain of events or commands. After conversion, each chain is initiated by passing a token to the first step in the chain. As each step in the chain is executed, the token is passed to the next step in the chain until the chain terminates. Where other functions depend on the result of the chain, a lock or hold command can be issued but for many functions there is no need to interact with any other functions. For example, a buffer driver as for a printer buffer, might be filled using a chain of commands comparable to the C "printf" command. A token is passed for printing each character, along with the character or a pointer to it. Once the chain of printing is initiated, the hardware can continue with other operations and does not need to wait for the printing chain to complete. The next call to the print buffer may come as soon as the next system clock tick and, if the printing chain is not busy, a subsequent print chain can be initiated for the next character.

The main program consists of a chain, with a token passing through it, which is connected to other chains and may spawn other processes for function calls and other operations. This proliferation of tokens results in a super-pipelined operation without true parallelization. The system can be used very successfully for parallel processing as well but normal C code can be accelerated without additional compiler development due to the creation and execution of multiple chains.

Another significant benefit of the present system is the availability of large combinatorials. Special circuits, such as ASICs, often combine many decision inputs into complex combinatorial circuits so the output may be affected by a large number of inputs yet evaluated essentially continuously. By comparison, if a general purpose program output depends on a number of inputs, typically only one or two inputs can be tested on any instruction cycle so each test of a complex combinatorial equation can take many instruction steps. The present system converts the general purpose program combinatorial into a hardware circuit, providing an essentially continuous correct output. The actual speed of operation of the present system is limited by hardware constraints so that it is slower than a custom ASIC by a factor of more than 2 but this is considerably faster than essentially any general purpose computer.

Yet another significant benefit of the present system is the availability of post functions. When a post function is called, the result of the previous output of the function is available immediately, without waiting for the function to execute again. This is useful in many loops, for example where there is an up or down counter. This is also useful when an intermediate result will be used as the input for a function which normally would not be called right away. By providing an input to a post function before the output is required, if the function can complete its operation before the result is needed, then a post function call at a later time can pick up that output without waiting. This functionality is provided already in general purpose computers in the form of post increment and post decrement counters such as "i++" or "n—".

Loading and Running Executable Code

Figure 18:
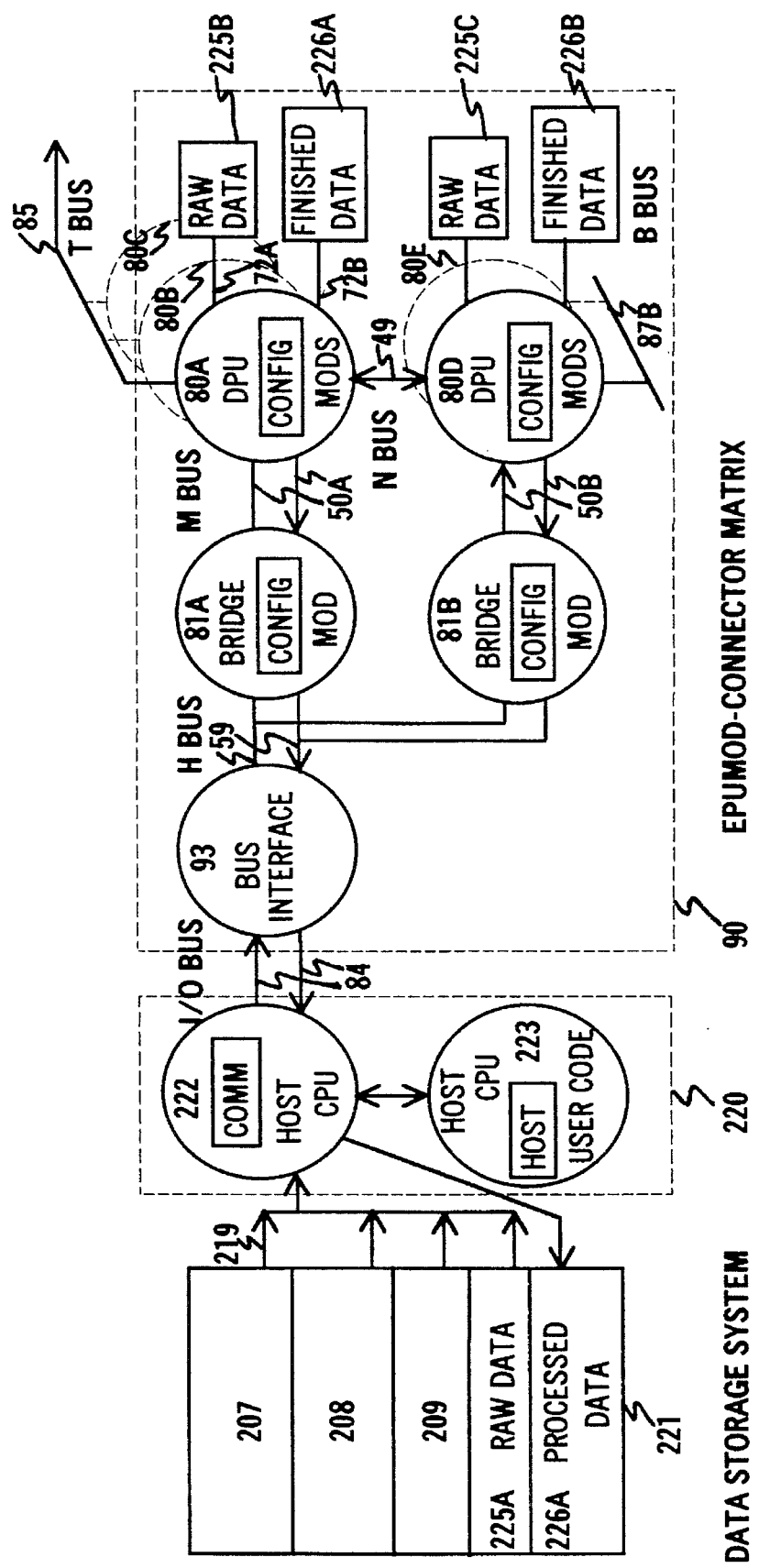
FIG. 18 illustrates the location of many code elements after using the stream splitter.

Once the program source code has been split and compiled, it can be moved onto the modules. Referring to FIG. 18, host computer 220 can access data storage system 221 over bus 219 and can access EPU 90 over I/O bus 84. Data storage system 221 holds compiled, executable binary host code 207, PLD code 208 and DSP code 209, including corresponding LIBrary files, plus raw data 225A and processed data 226A for the program. Data storage system 221 may be cache memory, system DRAM or SRAM, hard disk or other storage media.

Host 220 is connected through I/O bus 84 to bus interface 93 then through H-bus 59 to one or more bridgemods 81A and 81B. Bus interface 93 might be a SCSImod such as 96 in FIG. 15. Each bridgemod is connected to one or more DPUmods, bridgemod 81E is connected through M-bus 50A to DPUmods 80A, 80B and 80C and bridgemod 81B is connected through M-bus 50B to DPUmods 80D and 80E. As described above in relation to FIG. 10, a top array of DPUmods is connected to top bus 85 and a bottom array of DPUmods is connected to bottom bus 87. A DPUmod includes memory some of which can be allocated to hold raw data 225B, 225C and finished data 226A, 226B.

When the program is called, host code 207 is loaded from data storage system 221 is loaded into main memory 223 in host system 220. Host code 207 controls and directs loading of configuration DPU and DSP configuration code 208 and 209 to the appropriate destinations: PLD code 208 to PLDs in bus interface 93, if any, and PLDs in bridgemods 81A, 81B and DPUs 80A–80E including any needed PLDs in any PGAmods in the system; and DSP code 209 to any needed DSPs in the system.

Configuration code is typically loaded in order of the devices accessible by host 220, first establishing configuration in the bus interface 93 sufficient to operate the interface, then configuring downstream devices starting with each bridgemod 81A, 81B at least sufficient to load any additional configuration information, the configuring devices further downstream including DPUs 80A–80E, as needed. Additional configuration information may be loaded as needed at a subsequent time, such as during operation of the system.

Configuration data for Bus and RAm control logic blocks is installed in each PLD, as needed, to support RAM and the busses—H-bus, N-bus, M-bus and serial bus. This configuration data is preferably sent as a preamble to other configuration data so the receiving PLD can be easily configured. The configured device can then operate as a block, stream, or memory mapped processor. Debugging is accomplished by uploading configuration data to the host. The stat of each PLD is embedded in the configuration data and this can be examined using traditional methods.

There are many possible schemes well known to one skilled in the art for loading configuration data through the buses as shown. For example, a single line might be hardwired to every configurable device on any connected bus. A signal could be sent over this line which would be interpreted as a command to wait for a set amount of time, then to allocate certain pins to bus functions which would then be used to read incoming configuration data. As only one example, the reset line is set high for two clocks the low to force a system reset, then followed one clock later with a one-clock high "initiate configuration" signal. Bus interface 93 interprets this as a command to set 16 of the pins connected to I/O bus 84 and connect those pins to receive configuration commands for a PLD in bus interface 93. Each of bridgemods 81A, 81B interprets the reset/configure command and sets 16 of the pins connected to H-bus 59 and connects those pins to receive configuration commands for a PLD in the bridgemod. Each DPUmod, e.g. DPUmod 80A, interprets the reset/configure command and sets 16 of the pins connected to the M-bus, e.g. 50, and connects those pins to receive configuration commands for a PLD in the DPUmod.

The host begins the configuration process by selecting a first bus interface, for example through a device address known to the host and specific to the first bus interface. A first configuration signal might be an "attention" signal to all connected devices with a request for an acknowledge with identifier. Using well known bus arbitration, the host detects a signal from each connected device, then transmits a command, possibly coupled with a device address, for a selected bus interface, e.g. 93, to adopt a desired configuration. The host can also transmit configuration for all bus interfaces simultaneously to adopt a desired configuration. One configuration connects the I/O bus and the H-bus, e.g. "connect each of pins 1–16 of the I/O bus to corresponding one of pins 1–16 of the H-bus." The host then sends an attention signal to all devices connected to bus interface 93 and monitors the response and identity of each such device. Each such connected device, e.g. bridgemods 81A and 81B is configured to configure connections with any attached M-bus and the process is repeated down the line until each DPUmod or other attached module is configured. Another mode of default configuration is to have all devices on any bus adopt a default configuration providing essentially maximum bandwidth for incoming configuration data plus providing connections to "downstream" buses and parts, then begin a paging or arbitration scheme by which the host can identify and configure each connected configurable part.

An EPROM can be included on each module to store one or more default configurations. A locally stored configuration can be loaded on command, e.g. by a sequence of signals on the reset line or on one or more separate configuration lines.

Once a configuration is established allowing communication between the host and any selected part, the host can easily copy specific DPU configuration code to a specific DPUmod. In a preferred embodiment, the stream splitter is aware of the resources available on a specific computer and allocates DPU and other code to maximize utilization of the available resources. If the resources exceed the requirements of the program in C source code 201, then the entire program can be loaded onto the available resources at one time. If there are insufficient resources to load the entire program at once, then the host stores the necessary configuration data and loads into the available resources when needed. This is analogous to swapping instructions of a larger program into RAM of a general purpose computer from a connected storage device, typically a hard disk. The instructions that are needed at any moment are called up. Numerous sophisticated caching schemes are known in the art for designing code for this swapping and for anticipating what section of instructions will be needed next. These concepts and methods are useful in practicing the present invention as well.

The following example of operation of the system of this invention illustrates control flow and other features of the invention.

EXAMPLE

Figure 31:
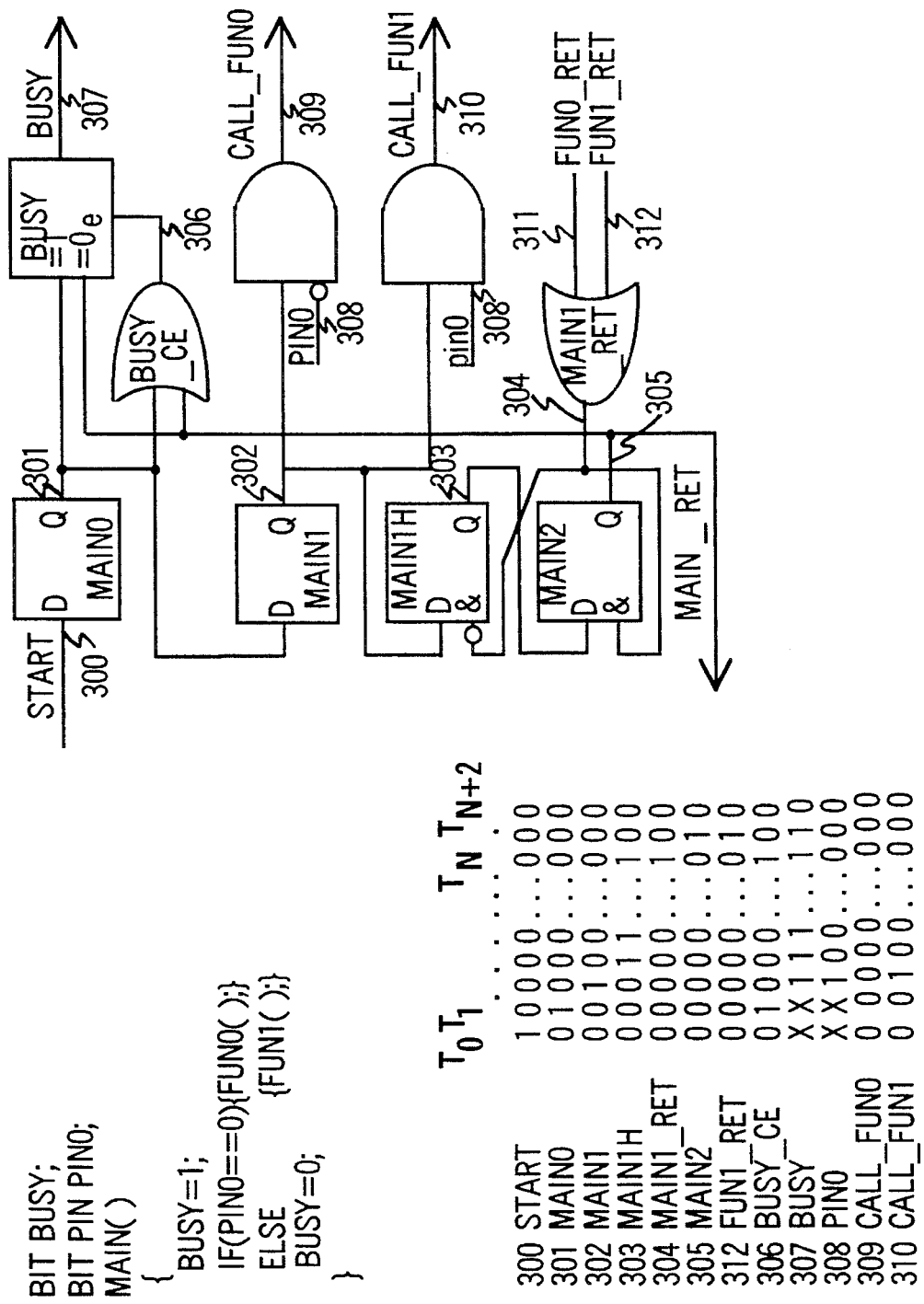

Referring to FIG. 31, a PLD is configured to implement a source cede program. This implementation illustrates specific resources available in many Xilinx parts such as the XC 3030. The source code shown when tokenized, logic mapped, logic-reduced, and device mapped gives the illustrated block logic diagram. The logic table shows the state of each line at times $t_0$–$t_4$ and $t_n$–$t_{n+2}$.

The program is initiated by passing an execution token to the main program, setting start 300 to 1 for one clock. START 300 drives the input of MAIN0 high and one clock later the MAIN0 output 301 goes high, passing the execution token to MAIN1. This also sets one input of latch BUSY to one, simultaneously clocking NOR gate BUSY_CE so the output is true, which enables BUSY, latching the BUSY output 307 as 1 after the next tick. The execution token at MAIN1 sets MAIN1 output 302 high at $t_2$, passing the execution token to MAIN1H and enabling both CALL_FUN0 309 and CALL_FUN1 310. Depending on the state of pin0, a new execution token is propagated and passed to either FUN0 or FUN1 (not shown). The logic table shows pin0 308 set to 1 during $t_2$ which propagates an execution token through CALL_FUN1 310. Until FUN1 returns the execution token on FUN1_RET 312, FUN0_RET 311 and FUN1_RET 312 remain 0 so the output of NOR MAIN1_RET 304 remains 0, latching MAIN1H output 303 at 1. This state continues until FUN1_RET 312 returns its token at $t_n$, setting MAIN1_RET output 304 to 1 at $t_n$. On the next tick, this releases MAIN1H output 303 and enables MAIN2, passing the main execution token to MAIN2 and MAIN2 output 305 goes to 1 on the next tick, $t_{n+1}$. This returns the main execution token over MAIN_RET to the system (not shown), drives BUSY_CE output 306 to 1 and sets input "=0" to BUSY, latching a 0 at BUSY output 307. MAIN is then ready to execute again whenever a new execution token is passed to START 300.

A general description of the system and method of using the present invention as well as a preferred embodiment of the present invention has been set forth above. One skilled in the art will recognize and be able to practice additional variations in the methods described and variations on the device described which fall within the teachings of this invention.

What is claimed is:

1. A configurable hardware module comprising:
   a first and a second programmable logic device (PLD), each said PLD comprising a plurality of programmable pins for connection to one or more devices and also comprising internal programmable interconnect and configurable logic, at least one of said programmable pins connectible through said programmable interconnect to said configurable logic;
   a configurable bus directly connecting said first PLD and said second PLD, said configurable bus comprising a plurality of configurable bus lines, each of said configurable bus lines comprising a connection between a programmable pin on said first PLD and a corresponding programmable pin on said second PLD;

a private hardware resource directly connectible to said second PLD but not to said first PLD; and a means for configuring said first PLD and said second PLD, whereby at least one of said configurable bus lines can be connected at a first time for communication between first configurable logic in said first PLD and first configurable logic in said second PLD to communicate a first signal and connected at a second time for communication between second configurable logic in said first PLD and second configurable logic in said second PLD to communicate a second signal, where at least one of said first signal and said second signal or said first and second configurable logic in said first PLD or said first and second configurable logic in said second PLD are not the same.

2. The configurable hardware module of claim 1 wherein said PLD is a field programmable gate array.

3. The configurable hardware module of claim 1 wherein said PLD is selected from the group consisting of a non-programmable gate array (GA), a programmable gate array (PGA), a field programmable gate array (FPGA) a logical cell array (LCA) device, a programmable array logic (PAL) device, and a gate array logic (GAL) device.

4. The configurable hardware module of claim 1 wherein said private hardware resource is selected from the group consisting of an SRAM, a DRAM, a ROM, a register, a latch, non-volatile RAM and ferroelectric memory ROM.

5. The configurable hardware module of claim 1 wherein said configurable bus is a programmable I/O bus and further comprises a plurality of lines and means to seta said line to be selectively one of an input, output or bidirectional line, for transmitting signals at a specified voltage with specified timing characteristics.

6. An extensible processing unit comprising:

a plurality of interconnected modules, a first and a second of said modules each comprising:

a first and a second programmable logic device (PLD), each said PLD comprising a plurality of programmable pins for connection to one or more external devices and also comprising internal programmable interconnect and configurable logic, each of said programmable pins connectable through said programmable interconnect to said configurable logic;

a configurable bus connecting said first PLD and said second PLD, said configurable bus comprising a plurality of configurable bus lines, each of said configurable bus lines comprising a connection between a programmable pin on said first PLD and a corresponding programmable pin on said second PLD;

a private hardware resource directly connectible to said second PLD but not to said first PLD; and a means for configuring said first PLD and said second PLD;

a second configurable bus comprising at least one configurable bus line connecting a programmable pin of a selected one of said first and said second PLDs of said first module to a programmable pin of a selected one of said first and said second PLDs of said second module, to allow communication between said PLDs;

whereby a said configurable bus line can be connected at a first time for communication between first configurable logic in a first connected PLD and first configurable logic in a second connected PLD to communicate a first signal and connected at a second time for communication between second configurable logic in said first connected PLD and second configurable logic in said second connected PLD to communicate a second signal, where at least one of said first signal and said second signal or said first and second configurable logic in said first connected PLD or said first and second configurable logic in said second connected PLD are not the same.

7. The extensible processing unit of claim 6 wherein said second configurable bus is a first programmable I/O bus, described as a module bus, also referred to as an M-bus.

8. The extensible processing unit of claim 6 further comprising a third module comprising a first and a second PLD, a configurable bus, a private hardware resource directly connectible to said second PLD but not to said first PLD and a means for configuring said first PLD and said second PLD, said second configurable bus further connecting together each of said first, second and third modules through a selected PLD on each module as a first programmable I/O bus, described as a module bus, also referred to as an M-bus, a third configurable bus similar to said second configurable bus but connecting only said first module and said second module through at least one programmable pin of a PLD on each module as a second programmable I/O bus, described as a first neighborhood bus, also referred to as an N-bus and a fourth configurable bus similar to said second configurable bus but connecting only said second module and said third module through at least one programmable pin of a PLD on each module as a third programmable I/O bus, a second neighborhood or N-bus.

9. The extensible processing unit of claim 7 further comprising a plurality of modules, each module being a distributed processing unit (DPU) comprising a first and a second programmable logic device (PLD), each said PLD comprising a plurality of programmable pins for connection to one or more devices and also comprising internal programmable interconnect and configurable logic, at least one of said programmable pins connectable through said programmable interconnect to said configurable logic;

a configurable bus directly connecting said first PLD and said second PLD, said configurable bus comprising a plurality of configurable bus lines, each of said configurable bus lines comprising a connection between a programmable pin on said first PLD and a corresponding programmable pin on said second PLD;

a private hardware resource directly connectable to said second PLD but not to said first PLD; and means for configuring said first PLD and said second PLD, a plurality of programmable I/O buses connectable to said PLD second configurable bus is connected to a selected one of said first and second PLPs on each of a plurality of DPUs wherein each said DPU is connected to said plurality of other DPU units and to said bridge module through said M-bus.

10. The extensible processing unit of claim 7 further comprising a host or external processing unit which is not part of said extensible processing unit, wherein said first module further comprises a bridge module, and a third configurable bus similar to said second configurable bus connecting said first module and said second module through at least one programmable pin of a PLD on each module as a third programmable I/O bus, described as an H-bus, which is further connectable to said host or external processing unit.

11. A method of translating source code comprising the steps of:

providing source code in an algorithmic language; and compiling said source code into a configuration file for implemenation on a processing device which supports in place;

wherein said processing device is a programmable logic device (PLD) and is one of a plurality of PLDs connectable through a programmable I/O connection, said PLD having connected private storage means for operators and connected private storage means for data storage, plus a programmable I/O connection to another PLD; and wherein said private storage means for operators is a device, connectable to said PLD but to no other PLD, selected from the group consisting of a CPU, a serial computing device and a memory device; and wherein said private storage means for data storage is a device, connectable to said PLD but to no other PLD, selected from the group consisting of a CPU, a serial computing device and a memory device.

12. The method of claim 11 wherein the step of compiling said source code further comprises sequential phases of:

a tokenizing phase;

a token mapping phase;

a logical mapping phase;

a logic optimization phase; and a device specific mapping phase.

13. The method of claim 11 wherein said algorithmic language is selected from the group consisting of ABCL/1, ACL, Act I, Actor, ADA, ALGOL, Amber, Andorca-I, APL, AWK, BASIC, BCPL, BLISS, C, C++, C*, COBOL, ConcurrentSmallTalk, EULER, Extended FP, FORTH, FORTRAN, GHC, Id, IF1, JADE, LEX, Linda, LISP, LSN, Miranda, MODULA-2, OCCAM, Omega, Orient84/K, PARLOG, PASCAL, pC, PL/C, PL/I, POOL-T, Postscript, PROLOG, RATFOR, RPG, SAIL, Scheme, SETL, SIMPL, SIMULA, SISAL, Smalltalk, Smalltalk-80, SNOBOL, SQL, TEX, WATFIV and YACC.

14. The method of claim 13 wherein said algorithmic language is C or a derivative of C.

15. The method of claim 11 further comprising providing a support configuration module including an function not available in said algorithmic language, said configuration module connectable to said processing device such that said executable function can be accessed by said processing device, and compiling said source code for implementation in part using said executable function.

16. The method of claim 12 further comprising providing a host computer connected to said processing device, providing and using a first function to direct some program steps to execute on said processing device and some program steps to execute on said host computer, providing a DSP connected to said PLD, providing and using a a second function to direct some program steps to execute on said DSP, compiling said source code to provide a plurality of program threads, two of said program threads capable of simultaneous execution, providing and using a third function to allow said two program threads capable of simultaneous execution to execute simultaneously, and providing and using a fourth function to allow control of the timing of one or more of said threads.

17. The method of claim 11 further comprising a stream splitter which selects source code which can be implemented on an available processing device and source code which should be implemented on a host computer connected to said processing device.

18. The method of claim 12 further comprising translating source code instructions selected from the group consisting of a C operator, a C expression, a thread control instruction, an I/O control instruction, and a hardware implementation instruction.

19. The method of claim 18 wherein said hardware implementation instruction is selected from the group consisting of pin assignments, handling configurable I/O buses, communication protocols between devices, clock generation, and host/module I/O.

* * * * *